(12) United States Patent
Nishiwaki et al.

(10) Patent No.: US 8,491,160 B2
(45) Date of Patent: Jul. 23, 2013

(54) SHEET, LIGHT EMITTING DEVICE, AND METHOD FOR PRODUCING THE SHEET

(75) Inventors: Seiji Nishiwaki, Hyogo (JP); Masa-aki Suzuki, Osaka (JP); Shin-ichi Wakabayashi, Osaka (JP); Jyunpei Matsuzaki, Osaka (JP); Tatsuya Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 415 days.

(21) Appl. No.: 12/995,224

(22) PCT Filed: Apr. 30, 2010

(86) PCT No.: PCT/JP2010/003098
§ 371 (c)(1),
(2), (4) Date: Nov. 30, 2010

(87) PCT Pub. No.: WO2010/131434
PCT Pub. Date: Nov. 18, 2010

(65) Prior Publication Data
US 2011/0080737 A1    Apr. 7, 2011

(30) Foreign Application Priority Data
May 12, 2009   (JP) ................................ 2009-115906

(51) Int. Cl.
*F21V 14/00*   (2006.01)
*F21V 11/00*   (2006.01)
(52) U.S. Cl.
USPC ...... 362/293; 362/311.01; 362/326; 428/156; 359/599
(58) Field of Classification Search
USPC ............... 362/293, 311.01, 311.03, 317, 326, 362/339, 19, 84; 359/599; 428/46, 156; 264/259, 293; 313/498, 501, 504
See application file for complete search history.

(56) References Cited

U.S. PATENT DOCUMENTS 5,189,454 A * 2/1993 Yamazaki et al. ............ 396/150
7,144,146 B2 * 12/2006 Takeuchi et al. ............. 362/617
(Continued)

FOREIGN PATENT DOCUMENTS
JP   11-283751       10/1999
JP   2000-321405 A   11/2000
(Continued)

OTHER PUBLICATIONS

International Search Report for corresponding International Application No. PCT/JP2010/003098 mailed Jun. 8, 2010.
(Continued)

*Primary Examiner* — Bao Q Truong
(74) *Attorney, Agent, or Firm* — Renner, Otto, Boisselle & Sklar, LLP

(57) ABSTRACT

A transparent sheet usable in the state where one of surfaces thereof is adjacent to a light emitting body, wherein the other surface of the sheet is divided into a plurality of tiny areas δ having such a size that a maximum circle among circles inscribed thereto has a diameter of 0.5 μm or greater and 3 μm or less with no gap; the tiny areas δ include a plurality of tiny areas $\delta_1$ randomly selected from the plurality of tiny areas δ, and the remaining plurality of tiny areas $\delta_2$; the tiny areas $\delta_1$ each include an area $\delta_{1a}$ along a border with the corresponding tiny area $\delta_2$, and the remaining area $\delta_{1b}$; the tiny areas $\delta_2$ each include an area $\delta_{2a}$ along a border with the corresponding tiny area $\delta_1$, and the remaining area $\delta_{2b}$; the height of the tiny areas $\delta_{1b}$ is d/2; the height of the tiny areas $\delta_{1a}$ is between zero to d/2; the depth of the tiny areas $\delta_{2a}$ is d/2; the depth of the tiny areas $\delta_{2b}$ is between zero to d/2; and d is in the range of 0.2 μm or greater and 3.0 μm or less.

13 Claims, 37 Drawing Sheets

U.S. PATENT DOCUMENTS

| | | | |
|---|---|---|---|
| 7,245,074 B2* | 7/2007 | Shiang | 313/504 |
| 2001/0035713 A1 | 11/2001 | Kimura | |
| 2002/0180348 A1 | 12/2002 | Oda et al. | |
| 2005/0151226 A1* | 7/2005 | Takeuchi et al. | 257/612 |
| 2005/0207011 A1 | 9/2005 | Ito et al. | |
| 2006/0192483 A1* | 8/2006 | Nakanishi et al. | 313/504 |
| 2008/0037126 A1 | 2/2008 | Kitamura et al. | |

FOREIGN PATENT DOCUMENTS

| | | |
|---|---|---|
| JP | 2002-008850 A | 1/2002 |
| JP | 2002-122702 A | 4/2002 |
| JP | 2003-059641 A | 2/2003 |
| JP | 2005-077966 A | 3/2005 |
| JP | 2005-266188 A | 9/2005 |
| JP | 2005-276581 A | 10/2005 |
| WO | 2005/124403 A1 | 12/2005 |
| WO | 2008/069324 A1 | 6/2008 |

OTHER PUBLICATIONS

Form PCT-ISA-237 for corresponding International Application No. PCT/JP2010/003098 dated Jun. 8, 2010 and partial English translation.

* cited by examiner (a)

(b)

(c)

(a)

(b)

(c)

(d)

(e)

(f)

(a)

(b)

(a)

(b)

(c)

(d)

(e)

(f)

(a)

(b)

(a)

(b)

(c)

(a)

(b)

(a)

(b)

(a)

(b)

SHEET, LIGHT EMITTING DEVICE, AND METHOD FOR PRODUCING THE SHEET

TECHNICAL FIELD

The present invention relates to a transparent sheet usable in the state where one surface thereof is adjacent to a light emitting body, and a light emitting device including the same. The present invention also relates to a method for producing the sheet.

BACKGROUND ART

Novel light emitting elements including white LEDs and organic electroluminescence elements are now actively developed. In accordance with this, technologies for improving an efficiency of extracting light from a light emitting body are now studied.

FIG. 26 shows a cross-sectional structure of a light emitting device using a general organic electroluminescence element (organic EL element) and how light propagates. On a substrate 101, an electrode 102, a light emitting layer 103, and a transparent electrode 104 are stacked in this order. On the transparent electrode 104, a transparent substrate 105 is provided. By an application of a voltage between the electrode 102 and the transparent electrode 104, light is emitted at a point S in the light emitting layer 103. This light is transmitted through the transparent electrode 104 directly or after being reflected by the electrode 102, and is incident on a point P on a surface of the transparent substrate 105 at angle $\theta$ with respect to the surface normal to the surface of the transparent substrate 105. The light is refracted at this point and output to an air layer 106.

Where the refractive index of the transparent substrate 105 is n'1, when the incidence angle $\theta$ becomes larger than critical angle $\theta c = \sin^{-1}(1/n'1)$, total reflection occurs. For example, light which is incident on a point Q on the surface of the transparent substrate 105 at an angle of $\theta c$ or greater is totally reflected and is not output to the air layer 106.

FIGS. 27(a) and (b) show the light extraction efficiency in an assumption that in the above-described light emitting device, the transparent substrate 105 has a multi-layer structure. In FIG. 27(a), where the refractive index of the light emitting layer 103 is n'k, the refractive index of the air layer 106 is n0, the refractive indices of a plurality of transparent layers provided between the light emitting layer 103 and the air layer 106 are n'k−1, n'k−2, ..., n'1 from the refractive index of the layer closest to the light emitting layer 103, the propagation orientation of the light emitted from the point S in the light emitting layer 103 (angle made with the surface normal to the reflection surfaces) is $\theta'k$, and the refractive indices at the reflection surfaces are $\theta'k-1, \theta'k-2, ..., \theta'1, \theta0$, the following expression holds based on the Snell's Law.

$$n'k \times \sin\theta'k = n'k-1 \times \sin\theta'k-1 = ...$$
$$= n'1 \times \sin\theta'1$$
$$= n0 \times \sin\theta0$$
(expression 1)

Therefore, the following expression holds.

$$\sin\theta'k = \sin\theta0 \times n0/n'k \qquad \text{(expression 2)}$$

Expression 2 is nothing but the Snell's Law in the case where the light emitting layer 103 is in direct contact with the air layer 106, and indicates that total reflection occurs at $\theta'k \geq \theta c = \sin^{-1}(n0/n'k)$ regardless of the refractive indices of the transparent layers provided between the light emitting layer 103 and the air layer 106.

FIG. 27(b) schematically shows a range of light which can be extracted from the light emitting layer 103. The light which can be extracted is contained in a pair of cones 109 and 109' having the light emitting point S as the apex, twice of the critical angle $\theta c$ as the vertex angle and z axis along the surface normal to the refractive surface as the central axis. Assuming that the light emitted from the point S radiates in all the orientations at an equal intensity and the transmittance at the reflection surface is 100% when the incidence angle is within the critical angle, the light extraction efficiency $\eta$ from the light emitting layer 103 is equal to the ratio of the area size obtained by cutting a spherical surface 110 by the cones 109 and 109' with respect to the surface area size of the spherical surface 110 and is given by the following expression.

$$\eta = 1 - \cos\theta c \qquad \text{(expression 3)}$$

In actuality, the transmittance obtained when the incidence angle is within the critical angle is not 100%, and so the light extraction efficiency $\eta$ is smaller than $1-\cos\theta c$. The total efficiency of the light emitting element is a value obtained by multiplying the light emitting efficiency of the light emitting layer by the light extraction efficiency $\eta$.

Meanwhile, there are, for example, conventional technologies disclosed by Patent Document Nos. 1 and 2 for improving the light extraction efficiency from a light emitting body. The subject matter disclosed by Patent Document No. 1 is proposed for the purpose of, in an organic EL element, suppressing light which is output from a transparent substrate toward the atmosphere from being totally reflected at a surface of the transparent substrate. The technology is described as being based on the principle that the light extraction efficiency is improved by forming a diffraction grating on an interface, an inner surface or a reflection surface of the substrate and changing the incidence angle of light with respect to the surface from which the light is extracted.

Patent Document No. 2 describes that in order to provide a planar light emitting device providing a high light extraction efficiency in an organic EL element, a plurality of transparent protrusions are formed on a surface of the transparent substrate so that the light can be prevented from being reflected at an interface between the transparent substrate and air.

CITATION LIST

Patent Literature
   Patent Document No. 1: Japanese Laid-Open Patent Publication No. 11-283751
   Patent Document No. 2: Japanese Laid-Open Patent Publication No. 2005-276581

SUMMARY OF INVENTION

Technical Problem

However, the above-described light emitting devices have the following problems.

In the light emitting device using a conventional EL element shown in FIG. 26, the light extraction efficiency $\eta$ from the light emitting layer 103 does not exceed $1-\cos\theta s$ at the maximum. Once the refractive index of the light emitting layer 103 is determined, the maximum value of the light extraction efficiency is uniquely restricted. For example, where, in expression 2, n0=1.0 and n'k=1.457, the critical angle $\theta c = \sin-1(n0/n'k) = 43.34$ degrees. The maximum value of the light extraction efficiency is as small as $1-\cos \theta c$=about 0.237. When n'k=1.70, the maximum value of the light extraction efficiency is decreased to about 0.191.

The technology disclosed by Patent Document No. 1 can certainly extract light, which would otherwise be totally reflected, but the opposite is also possible. Namely, assuming that there is no diffraction grating layer, there is a case where light which is output from the point in the light emitting layer is incident on a refraction surface (output surface) of the transparent substrate at an angle smaller than the critical angle, and is transmitted or refracted. By contrast, when there is a diffraction grating layer and the light is diffracted, there is a case where the incidence angle on the refraction surface exceeds the critical angle and the light is totally reflected. Accordingly, the technology disclosed by Patent Document No. 1 does not guarantee the improvement of the light extraction efficiency. In addition, with the technology disclosed by Patent Document No. 1, diffracted light shifted in the orientation by a prescribed uniform amount is generated in all the light beams. Light including such diffracted light has a light intensity distribution in accordance with the orientation, and a prescribed shift width depends on the wavelength of the output light. Therefore, there is a color unbalance in accordance with the orientation.

With the light emitting device disclosed by Patent Document No. 1, light incident from the outside (from the side of the air layer) is regularly reflected by the surface of the transparent substrate and acts as external disturbance (so-called glare) for the light extracted from the light emitting layer. This requires optical processing such as providing a reflection preventing film on the surface of the transparent substrate, which increases the product cost.

The light emitting device disclosed by Patent Document No. 2 is made for the purpose of preventing light from being reflected by the refraction surface. The improvement of the light extraction efficiency realized by this structure is as low as 10 to 20%.

The present invention made in light of the above-described situation has an object of providing a sheet, a light emitting device and a method for producing the sheet for realizing a significant improvement of the light extraction efficiency by allowing light incident on the transparent substrate at an angle equal to or greater than the critical angle to be output and also for preventing glare and thus suppressing occurrence of a light intensity distribution and a color unbalance occurring in accordance with the orientation.

Solution to Problem

A sheet according to the present invention is a transparent sheet usable in the state where one of surfaces thereof is adjacent to a light emitting body. The other surface of the sheet is divided into a plurality of tiny areas $\delta$ having such a size that a maximum circle among circles inscribed thereto has a diameter of 0.5 µm or greater and 3 µm or less, and one of the tiny areas $\delta$ is adjacent to, and surrounded by, others of the plurality of tiny areas $\delta$; the plurality of tiny areas $\delta$ include a plurality of tiny areas $\delta_1$ randomly selected from the plurality of tiny areas $\delta$, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1b}$ each protrude upward from a prescribed reference plane parallel to the other surface of the sheet by a height of d/2 toward the other surface; the tiny areas $\delta_{1a}$ each protrude upward from the reference plane by a height of zero to d/2 toward the other surface; the tiny areas $\delta_{2a}$ are each recessed downward from the reference plane by a depth of d/2 away from the other surface; the tiny areas $\delta_{2b}$ are each recessed downward from the reference plane by a depth of zero to d/2 away from the other surface; the reference plane is located at an intermediate position, in a direction perpendicular to the other surface of the sheet, between the tiny areas $\delta_{1b}$ and the tiny areas $\delta_{2a}$; and d is 0.2 µm or greater and 3.0 µm or less.

Owing to such a structure, even when the light propagating inside the sheet from the light emitting body is incident on the other surface of the sheet at an angle equal to or greater than the critical angle with respect to the surface normal to the other surface, the surface configuration formed of tiny areas provided at the other surface prevents total reflection and allows a part of the light to be output to the outside. The light reflected by the other surface and directed to the light emitting body is reflected in the light emitting body and again is incident on the other surface of the sheet. In this case also, total reflection does not occur and a part of the light is output to the outside.

Another sheet according to the present invention is a transparent sheet usable in the state where one of surfaces thereof is adjacent to a light emitting body. The other surface of the sheet is divided into a plurality of tiny areas $\delta$ having such a size that a maximum circle among circles inscribed thereto has a diameter of 0.5 µm or greater and 3 µm or less, and one of the tiny areas $\delta$ is adjacent to, and surrounded by, others of the plurality of tiny areas $\delta$; the plurality of tiny areas $\delta$ include a plurality of tiny areas $\delta_1$ randomly selected from the plurality of tiny areas $\delta$, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1a}$ each protrude upward from a prescribed reference plane parallel to the other surface of the sheet by a height of d/2 toward the other surface; the tiny areas $\delta_{1b}$ each protrude upward from the reference plane by a height of zero to d/2 toward the other surface; the tiny areas $\delta_{2b}$ are each recessed downward from the reference plane by a depth of d/2 away from the other surface; the tiny areas $\delta_{2a}$ are each recessed downward from the reference plane by a depth of zero to d/2 away from the other surface; the reference plane is located at an intermediate position, in a direction perpendicular to the other surface of the sheet, between the tiny areas $\delta_{1a}$ and the tiny areas $\delta_{2b}$; and d is 0.2 µm or greater and 3.0 µm or less.

Still another sheet according to the present invention is a transparent sheet usable in the state where one of surfaces thereof is adjacent to a light emitting body. The other surface of the sheet is divided into a plurality of tiny areas $\delta$ having such a size that a maximum circle among circles inscribed thereto has a diameter of 0.2 µm or greater and 3 µm or less, and one of the tiny areas $\delta$ is adjacent to, and surrounded by, others of the plurality of tiny areas $\delta$; the plurality of tiny areas $\delta$ include a plurality of tiny areas $\delta_1$ randomly selected from the plurality of tiny areas $\delta$, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1b}$ each protrude upward from a prescribed reference plane parallel to the other surface of the sheet by a height of d/2 toward the other surface; the tiny areas $\delta_{1a}$ each protrude upward from the reference plane by a height of zero to d/2 toward the other surface; the tiny areas $\delta_{2b}$ are each recessed downward from the reference plane by a depth of d/2 away from the other surface; the tiny areas $\delta_{2a}$ are each recessed downward from the reference plane by a depth of zero to d/2 away from the other surface; the reference plane is located at an intermediate position, in a direction perpendicular to the other surface of the sheet, between the tiny areas $\delta_{1b}$ and the tiny areas $\delta_{2a}$; and d is 0.2 μm or greater and 3.0 μm or less.

Still another sheet according to the present invention is a transparent sheet usable in the state where one of surfaces thereof is adjacent to a light emitting body. The other surface of the sheet is divided into a plurality of tiny areas δ having such a size that a maximum circle among circles inscribed thereto has a diameter of 0.2 μm or greater and 3 μm or less, and one of the tiny areas δ is adjacent to, and surrounded by, others of the plurality of tiny areas δ; the plurality of tiny areas δ include a plurality of tiny areas $\delta_1$ randomly selected from the plurality of tiny areas δ, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1a}$ each protrude upward from a prescribed reference plane parallel to the other surface of the sheet by a height of d/2 toward the other surface; the tiny areas $\delta_{1b}$ each protrude upward from the reference plane by a height of zero to d/2 toward the other surface; the tiny areas $\delta_{2a}$ are each recessed downward from the reference plane by a depth of d/2 away from the other surface; the tiny areas $\delta_{2b}$ are each recessed downward from the reference plane by a depth of zero to d/2 away from the other surface; the reference plane is located at an intermediate position, in a direction perpendicular to the other surface of the sheet, between the tiny areas $\delta_{1a}$ and the tiny areas $\delta_{2a}$; and d is 0.2 μm or greater and 3.0 μm or less.

Still another sheet according to the present invention is a transparent sheet usable in the state where one of surfaces thereof is adjacent to a light emitting body. The other surface of the sheet is divided into a plurality of tiny areas δ having such a size that a maximum circle among circles inscribed thereto has a diameter of 0.2 μm or greater and 3 μm or less, and one of the tiny areas δ is adjacent to, and surrounded by, others of the plurality of tiny areas δ; the plurality of tiny areas δ include a plurality of tiny areas $\delta_1$ randomly selected from the plurality of tiny areas δ, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1b}$ each protrude upward from a prescribed reference plane parallel to the other surface of the sheet by a height of d/2 toward the other surface; the tiny areas $\delta_{2b}$ are each recessed downward from the reference plane by a depth of d/2 away from the other surface; each of the tiny areas $\delta_{1a}$ and the tiny area $\delta_{2a}$ corresponding thereto form a continuous surface inclined with respect to the reference plane between the corresponding tiny areas $\delta_{1b}$ and $\delta_{2b}$; the reference plane is located at an intermediate position, in a direction perpendicular to the other surface of the sheet, between the tiny areas $\delta_{1b}$ and the tiny areas $\delta_{2b}$; and d is 0.2 μm or greater and 3.0 μm or less.

Still another sheet according to the present invention is a transparent sheet usable in the state where one of surfaces thereof is adjacent to a light emitting body. The other surface of the sheet is divided into a plurality of tiny areas δ and a plurality of tiny areas δ' having such a size that a maximum circle among circles inscribed thereto has a diameter of 0.4 μm or greater and 3 μm or less, the tiny areas δ and the tiny areas δ' being independent from, and overlapping, each other; and one of the tiny areas δ and one of the tiny areas δ' are adjacent to, and surrounded by, others of the plurality of tiny areas δ and others of the plurality of tiny areas δ', respectively; a border between the plurality of tiny areas δ possibly crosses but does not overlap a border between the plurality of tiny areas δ'; the plurality of tiny areas δ include a plurality of tiny areas $\delta_1$ randomly selected from the plurality of tiny areas δ, and the remaining plurality of tiny areas $\delta_2$; the plurality of tiny areas δ' include a plurality of tiny areas $\delta'_1$ randomly selected from the plurality of tiny areas δ', and the remaining plurality of tiny areas $\delta'_2$ of the plurality of tiny areas δ'; an area in which each of the tiny areas $\delta_1$ and each of the tiny areas $\delta'_1$ overlap each other protrudes upward from a prescribed reference plane parallel to the other surface of the sheet by a height of d/2 toward the other surface; an area in which each of the tiny areas $\delta_2$ and each of the tiny areas $\delta'_2$ overlap each other is recessed downward from the reference plane by a depth of d/2 away from the other surface; an area in which each of the tiny areas $\delta_1$ and each of the tiny areas $\delta'_2$ overlap each other protrudes upward from the prescribed reference plane parallel to the other surface of the sheet by a height of d/2 toward the other surface; an area in which each of the tiny areas $\delta_2$ and each of the tiny areas $\delta'_1$ overlap each other is recessed downward from the reference plane by a depth of zero to d/2 away from the other surface; the reference plane is located at an intermediate position, in a direction perpendicular to the other surface of the sheet, between the area in which each of the tiny areas $\delta_1$ and each of the tiny areas $\delta'_1$ overlap each other and the area in which each of the tiny areas $\delta_2$ and each of the tiny areas $\delta'_2$ overlap each other; and d is 0.2 μm or greater and 3.0 μm or less.

In a preferable embodiment, the plurality of tiny areas δ' form a checkered pattern.

Still another sheet according to the present invention is a transparent sheet usable in the state where one of surfaces thereof is adjacent to a light emitting body. The other surface of the sheet is divided into a plurality of tiny areas δ having such a size that a maximum circle among circles inscribed thereto has a diameter of 0.2 μm or greater and w μm or less, and one of the tiny areas δ is adjacent to, and surrounded by, others of the plurality of tiny areas δ; the plurality of tiny areas δ include a plurality of tiny areas $\delta_1$ randomly selected at probability P from the plurality of tiny areas δ, and the remaining plurality of tiny areas $\delta_2$; diameter w and probability P fulfill the relationship of $w=6\times P^2$; the tiny areas $\delta_1$ each protrude upward from a prescribed reference plane parallel to the other surface of the sheet by a height of d/2 toward the other surface; the tiny areas $\delta_2$ are each recessed downward from the reference plane by a depth of d/2 away from the other surface; the reference plane is located at an intermediate position, in a direction perpendicular to the other surface of the sheet, between the tiny areas $\delta_1$ and the tiny areas $\delta_2$; and d is 0.2 μm or greater and 1.4 μm or less.

In a preferable embodiment, the tiny areas δ have polygonal shapes which are congruent.

A light emitting device according to the present invention includes a light emitting body having a light emitting surface; and a transparent sheet usable in the state where one of surfaces thereof is adjacent to a light emitting body. The other surface of the sheet is divided into a plurality of tiny areas δ having such a size that a maximum circle among circles inscribed thereto has a diameter of 0.2 μm or greater and 3 μm or less, and one of the tiny areas δ is adjacent to, and surrounded by, others of the plurality of tiny areas δ; the plurality of tiny areas δ include a plurality of tiny areas $\delta_1$ randomly selected from the plurality of tiny areas $\delta$, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1b}$ each protrude upward from a prescribed reference plane parallel to the other surface of the sheet by a height of d/2 toward the other surface; the tiny areas $\delta_{1a}$ each protrude upward from the reference plane by a height of zero to d/2 toward the other surface; the tiny areas $\delta_{2a}$ are each recessed downward from the reference plane by a depth of d/2 away from the other surface; the tiny areas $\delta_{2b}$ are each recessed downward from the reference plane by a depth of zero to d/2 away from the other surface; and the reference plane is located at an intermediate position, in a direction perpendicular to the other surface of the sheet, between the tiny areas $\delta_{1b}$ and the tiny areas $\delta_{2a}$. The light emitting body outputs light having a wavelength $\lambda$ at the center of an emission spectrum thereof from the light emitting surface; and where a refractive index of the sheet is n1, and a refractive index of a medium in contact with the other surface of the sheet is n0, which is lower than n1, the relationship of $\lambda/6(n1-n0) \leq d \leq 2\lambda/(n1-n0)$ is fulfilled.

Another light emitting device according to the present invention includes a light emitting body having a light emitting surface; and a transparent sheet usable in the state where one of surfaces thereof is adjacent to a light emitting body. The other surface of the sheet is divided into a plurality of tiny areas $\delta$ having such a size that a maximum circle among circles inscribed thereto has a diameter of 0.5 µm or greater and 3 µm or less, and one of the tiny areas $\delta$ is adjacent to, and surrounded by, others of the plurality of tiny areas $\delta$; the plurality of tiny areas $\delta$ include a plurality of tiny areas $\delta_1$ randomly selected from the plurality of tiny areas $\delta$, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1a}$ each protrude upward from a prescribed reference plane parallel to the other surface of the sheet by a height of d/2 toward the other surface; the tiny areas $\delta_{1b}$ each protrude upward from the reference plane by a height of zero to d/2 toward the other surface; the tiny areas $\delta_{2b}$ are each recessed downward from the reference plane by a depth of d/2 away from the other surface; the tiny areas $\delta_{2a}$ are each recessed downward from the reference plane by a depth of zero to d/2 away from the other surface; and the reference plane is located at an intermediate position, in a direction perpendicular to the other surface of the sheet, between the tiny areas $\delta_{1a}$ and the tiny areas $\delta_{2b}$. The light emitting body outputs light having a wavelength $\lambda$ at the center of an emission spectrum thereof from the light emitting surface; and where a refractive index of the sheet is n1, and a refractive index of a medium in contact with the other surface of the sheet is n0, which is lower than n1, the relationship of $\lambda/6(n1-n0) \leq d \leq 2\lambda/(n1-n0)$ is fulfilled.

Still another light emitting device according to the present invention includes a light emitting body having a light emitting surface; and a transparent sheet usable in the state where one of surfaces thereof is adjacent to a light emitting body. The other surface of the sheet is divided into a plurality of tiny areas $\delta$ having such a size that a maximum circle among circles inscribed thereto has a diameter of 0.2 µm or greater and 3 µm or less, and one of the tiny areas $\delta$ is adjacent to, and surrounded by, others of the plurality of tiny areas $\delta$; the plurality of tiny areas $\delta$ include a plurality of tiny areas $\delta_1$ randomly selected from the plurality of tiny areas $\delta$, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1b}$ each protrude upward from a prescribed reference plane parallel to the other surface of the sheet by a height of d/2 toward the other surface; the tiny areas $\delta_{1a}$ each protrude upward from the reference plane by a height of zero to d/2 toward the other surface; the tiny areas $\delta_{2a}$ are each recessed downward from the reference plane by a depth of d/2 away from the other surface; the tiny areas $\delta_{2b}$ are each recessed downward from the reference plane by a depth of zero to d/2 away from the other surface; and the reference plane is located at an intermediate position, in a direction perpendicular to the other surface of the sheet, between the tiny areas $\delta_{1b}$ and the tiny areas $\delta_{2a}$. The light emitting body outputs light having a wavelength $\lambda$ at the center of an emission spectrum thereof from the light emitting surface; and where a refractive index of the sheet is n1, and a refractive index of a medium in contact with the other surface of the sheet is n0, which is lower than n1, the relationship of $\lambda/6 (n1-n0) \leq d \leq 2\lambda/(n1-n0)$ is fulfilled.

Still another light emitting device according to the present invention includes a light emitting body having a light emitting surface; and a transparent sheet usable in the state where one of surfaces thereof is adjacent to a light emitting body. The other surface of the sheet is divided into a plurality of tiny areas $\delta$ having such a size that a maximum circle among circles inscribed thereto has a diameter of 0.2 µm or greater and 3 µm or less, and one of the tiny areas $\delta$ is adjacent to, and surrounded by, others of the plurality of tiny areas $\delta$; the plurality of tiny areas $\delta$ include a plurality of tiny areas $\delta_1$ randomly selected from the plurality of tiny areas $\delta$, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1a}$ each protrude upward from a prescribed reference plane parallel to the other surface of the sheet by a height of d/2 toward the other surface; the tiny areas $\delta_{1b}$ each protrude upward from the reference plane by a height of zero to d/2 toward the other surface; the tiny areas $\delta_{2a}$ are each recessed downward from the reference plane by a depth of d/2 away from the other surface; the tiny areas $\delta_{2b}$ are each recessed downward from the reference plane by a depth of zero to d/2 away from the other surface; and the reference plane is located at an intermediate position, in a direction perpendicular to the other surface of the sheet, between the tiny areas $\delta_{1a}$ and the tiny areas $\delta_{2a}$. The light emitting body outputs light having a wavelength $\lambda$ at the center of an emission spectrum thereof from the light emitting surface; and where a refractive index of the sheet is n1, and a refractive index of a medium in contact with the other surface of the sheet is n0, which is lower than n1, the relationship of $\lambda/6 (n1-n0) \leq d \leq 2\lambda/(n1-n0)$ is fulfilled.

Still another light emitting device according to the present invention includes a light emitting body having a light emitting surface; and a transparent sheet usable in the state where one of surfaces thereof is adjacent to a light emitting body. The other surface of the sheet is divided into a plurality of tiny areas $\delta$ having such a size that a maximum circle among circles inscribed thereto has a diameter of 0.2 µm or greater and 3 µm or less, and one of the tiny areas $\delta$ is adjacent to, and surrounded by, others of the plurality of tiny areas δ; the plurality of tiny areas δ include a plurality of tiny areas $\delta_1$ randomly selected from the plurality of tiny areas δ, and the remaining plurality of tiny areas $\delta_2$; the plurality of tiny areas $\delta_1$ each include an area $\delta_{1a}$ along a border with the corresponding tiny area $\delta_2$, and the remaining area $\delta_{1b}$; the plurality of tiny areas $\delta_2$ each include an area $\delta_{2a}$ along a border with the corresponding tiny area $\delta_1$, and the remaining area $\delta_{2b}$; the tiny areas $\delta_{1b}$ each protrude upward from a prescribed reference plane parallel to the other surface of the sheet by a height of d/2 toward the other surface; the tiny areas $\delta_{2b}$ are each recessed downward from the reference plane by a depth of d/2 away from the other surface; each of the tiny areas $\delta_{1a}$ and the tiny area $\delta_{2a}$ corresponding thereto form a continuous surface inclined with respect to the reference plane between the corresponding tiny areas $\delta_{1b}$ and $\delta_{2b}$; and the reference plane is located at an intermediate position, in a direction perpendicular to the other surface of the sheet, between the tiny areas $\delta_{1b}$ and the tiny areas $\delta_{2b}$. The light emitting body outputs light having a wavelength λ at the center of an emission spectrum thereof from the light emitting surface; and where a refractive index of the sheet is n1, and a refractive index of a medium in contact with the other surface of the sheet is n0, which is lower than n1, the relationship of $\lambda/6(n1-n0) \leq d \leq 2\lambda/(n1-n0)$ is fulfilled.

Still another light emitting device according to the present invention includes a light emitting body having a light emitting surface; and a transparent sheet usable in the state where one of surfaces thereof is adjacent to a light emitting body. The other surface of the sheet is divided into a plurality of tiny areas δ and a plurality of tiny areas δ' having such a size that a maximum circle among circles inscribed thereto has a diameter of 0.4 μm or greater and 3 μm or less, the tiny areas δ and the tiny areas δ' being independent from, and overlapping, each other; and one of the tiny areas δ and one of the tiny areas δ' are adjacent to, and surrounded by, others of the plurality of tiny areas δ and others of the plurality of tiny areas δ', respectively; a border between the plurality of tiny areas δ possibly crosses but does not overlap a border between the plurality of tiny areas δ'; the plurality of tiny areas δ include a plurality of tiny areas $\delta_1$ randomly selected from the plurality of tiny areas δ, and the remaining plurality of tiny areas $\delta_2$; the plurality of tiny areas δ' include a plurality of tiny areas $\delta'_1$ randomly selected from the plurality of tiny areas δ', and the remaining plurality of tiny areas $\delta'_2$; an area in which each of the tiny areas $\delta_1$ and each of the tiny areas $\delta'_1$ overlap each other protrudes upward from a prescribed reference plane parallel to the other surface of the sheet by a height of d/2 toward the other surface; an area in which each of the tiny areas $\delta_2$ and each of the tiny areas $\delta'_2$ overlap each other is recessed downward from the reference plane by a depth of d/2 away from the other surface; an area in which each of the tiny areas $\delta_1$ and each of the tiny areas $\delta'_2$ overlap each other protrudes upward from the prescribed reference plane parallel to the other surface of the sheet by a height of d/2 toward the other surface; an area in which each of the tiny areas $\delta_2$ and each of the tiny areas $\delta'_1$ overlap each other is recessed downward from the reference plane by a depth of zero to d/2 away from the other surface; and the reference plane is located at an intermediate position, in a direction perpendicular to the other surface of the sheet, between the area in which each of the tiny areas $\delta_1$ and each of the tiny areas $\delta'_1$ overlap each other and the area in which each of the tiny areas $\delta_2$ and each of the tiny areas $\delta'_2$ overlap each other. The light emitting body outputs light having a wavelength λ at the center of an emission spectrum thereof from the light emitting surface; and where a refractive index of the sheet is n1, and a refractive index of a medium in contact with the other surface of the sheet is n0, which is lower than n1, the relationship of $\lambda/6(n1-n0) \leq d \leq 2\lambda/(n1-n0)$ is fulfilled.

In a preferable embodiment, the plurality of tiny areas δ' form a checkered check.

Still another light emitting device according to the present invention includes a light emitting body having a light emitting surface; and a transparent sheet usable in the state where one of surfaces thereof is adjacent to a light emitting body. The other surface of the sheet is divided into a plurality of tiny areas δ having such a size that a maximum circle among circles inscribed thereto has a diameter of 0.2 μm or greater and w μm or less, and one of the tiny areas δ is adjacent to, and surrounded by, others of the plurality of tiny areas δ; the plurality of tiny areas δ include a plurality of tiny areas $\delta_1$ randomly selected at probability P from the plurality of tiny areas δ, and the remaining plurality of tiny areas $\delta_2$; diameter w and probability P fulfill the relationship of $w=6 \times P^2$; the tiny areas $\delta_1$ each protrude upward from a prescribed reference plane parallel to the other surface of the sheet by a height of d/2 toward the other surface; the tiny areas $\delta_2$ are each recessed downward from the reference plane by a depth of d/2 away from the other surface; and the reference plane is located at an intermediate position, in a direction perpendicular to the other surface of the sheet, between the tiny areas $\delta_1$ and the tiny areas $\delta_2$. The light emitting body outputs light having a wavelength λ at the center of an emission spectrum thereof from the light emitting surface; and where a refractive index of the sheet is n1, and a refractive index of a medium in contact with the other surface of the sheet is n0, which is lower than n1, the relationship of $\lambda/6(n1-n0) \leq d \leq 2\lambda/(n1-n0)$ is fulfilled.

In a preferable embodiment, the tiny areas δ have polygonal shapes which are congruent.

In a preferable embodiment, the light emitting surface of the light emitting body and the one surface of the sheet are in contact with each other to form an interface, there is a refractive index difference between both sides of the interface, and a surface configuration of the interface has a concaved and convexed configuration of a houndstooth check pattern or a checkered pattern.

In a preferable embodiment, the medium is air.

In a preferable embodiment, the medium is aerogel.

In a preferable embodiment, where a refractive index of a portion, of the light emitting body, which emits light is n2, n2−n1<0.1.

A method according to the present invention for producing the first sheet described above includes the steps of preparing a sheet material; forming a first pattern on one surface of the sheet material using a first mask defining the tiny areas $\delta_1$, and etching the sheet material using the first pattern; and after the first pattern is removed, forming a second pattern on the one surface of the sheet material using a second mask defining the tiny areas $\delta_{1b}$ and the tiny areas $\delta_{2b}$, and etching the sheet material using the second mask.

A method according to the present invention for producing the second sheet described above includes the steps of preparing a sheet material; forming a first pattern on one surface of the sheet material using a first mask defining the tiny areas $\delta_1$, and etching the sheet material using the first pattern; and after the first pattern is removed, forming a second pattern on the one surface of the sheet material using a second mask defining the tiny areas $\delta_{1a}$ and the tiny areas $\delta_{2a}$, and etching the sheet material using the second mask.

A method according to the present invention for producing the third sheet described above includes the steps of preparing a sheet material; forming a first pattern on one surface of the sheet material using a first mask defining the tiny areas $\delta_1$, and etching the sheet material using the first pattern; and after the first pattern is removed, forming a second pattern on the one surface of the sheet material using a second mask defining the tiny areas $\delta_{1b}$ and the tiny areas $\delta_{2a}$, and etching the sheet material using the second mask.

A method according to the present invention for producing the fourth sheet described above includes the steps of preparing a sheet material; forming a first pattern on one surface of the sheet material using a first mask defining the tiny areas $\delta_1$, and etching the sheet material using the first pattern; and after the first pattern is removed, forming a second pattern on the one surface of the sheet material using a second mask defining the tiny areas $\delta_{1a}$ and the tiny areas $\delta_{2b}$, and etching the sheet material using the second mask.

A method according to the present invention for producing the sixth sheet described above includes the steps of preparing a sheet material; forming a first pattern on one surface of the sheet material using a first mask defining the tiny areas $\delta_1$, and etching the sheet material using the first pattern; and after the first mask is removed, forming a second pattern on the one surface of the sheet material using a second mask defining the tiny areas $\delta'$, and etching the sheet material using the second mask. Positioning of the first mask with respect to the one surface of the sheet material and positioning of the second mask with respect to the one surface of the sheet material are shifted with respect to each other in two directions perpendicular to each other on a plane parallel to the sheet material.

In a preferable embodiment, an amount of etching performed using the first pattern is d/3, and an amount of etching performed using the second pattern is 2d/3.

ADVANTAGEOUS EFFECTS OF INVENTION

According to the present invention, extraction of light which is incident at an angle exceeding the critical angle can be performed in repetition. Therefore, the light extraction efficiency can be significantly improved. In addition, the light is diffracted by a random configuration, and so the diffraction orientation loses regularity. Therefore, occurrence of the light intensity distribution and the color unbalance in accordance with the orientation, and also glare, can be suppressed.

DESCRIPTION OF EMBODIMENTS

Before describing embodiments of the present invention, the history of studies until the present invention was made in light of the conventional art described in Patent Document Nos. 1 and 2 and the like will be described.

Figure 28:
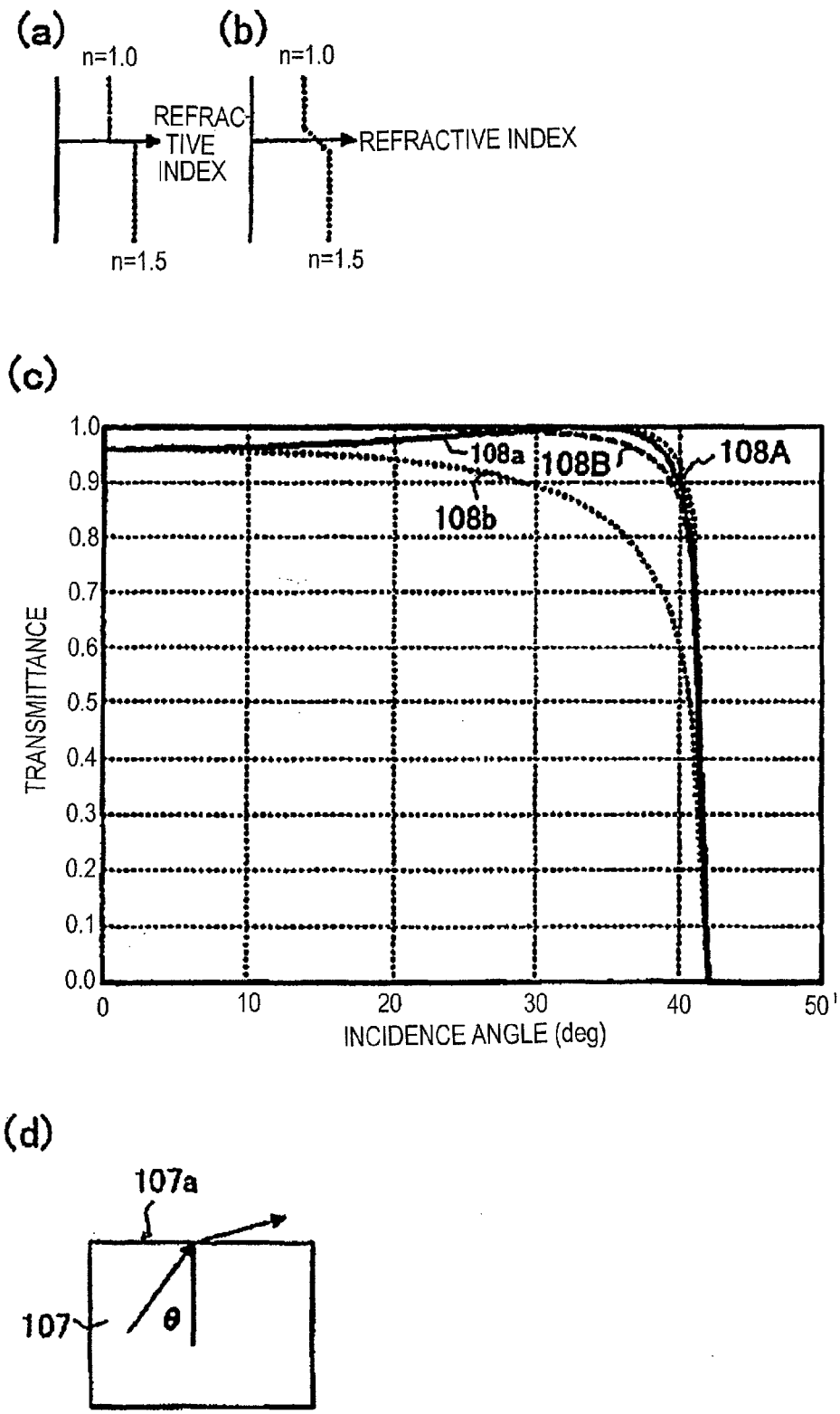
FIG. 28 (a) shows a step-like change of the refractive index; (b) shows a mild change of the refractive index; (c) shows the relationship between the incidence angle and the transmittance at the refraction surface; and (d) shows the relationship between the light beam and the refraction surface.

FIG. 28 illustrates the transmittance at a refraction surface (interface between a surface of a transparent layer and an air layer). As shown in FIG. 28($d$), when light propagates parallel to the plane of the paper sheet of the figure from the inside of a transparent layer 107 having a refractive index of 1.5, is incident on a refraction surface 107a of the transparent layer 107 at angle θ and is refracted to the air (refractive index: 1.0), the transmittance of the light is related to the polarization state of the light. Usually, the refractive index has a stepped distribution as shown in FIG. 28($a$) along the surface normal in the vicinity of the refraction surface 107a. Therefore, P polarization (vibration component having an electric field vector parallel to the plane of the paper sheet of the figure) exhibits a transmittance characteristic as represented by curve 108a, and S polarization (vibration component having an electric field vector perpendicular to the plane of the paper sheet of the figure) exhibits a transmittance characteristic as represented by curve 108b. The transmittance characteristics behave differently when the incidence angle is equal to or less than the critical angle (=41.8 degrees), but both become zero when the incidence angle exceeds the critical angle.

By contrast, assuming that the refractive index has a tapered distribution as shown in FIG. 28($b$) where a surface portion of the transparent layer 107 has a multi-layer structure, the P polarization exhibits a transmittance characteristic as represented by curve 108A, and the S polarization exhibits a transmittance characteristic as represented by curve 108B. Both of the transmittance characteristics become zero when the incidence angle exceeds the critical angle. When the incidence angle is equal to or less than the critical angle, both of the transmittances approach 100%, namely, approach the shape of the step function having the critical angle as the border. In FIG. 28($b$), the calculation is made on a structure including 50 layers having a refractive index of 1.5 to 1.0 with a deviation of 0.01 and each having a thickness of 0.01 μm. As the gradient of the refractive index change in the thickness direction is slower, the difference between the P polarization and the S polarization is smaller. As a result, the curves representing the transmittances of the P polarization and the S polarization with respect to the incidence angle both approach the shape of the step function.

Figure 29:
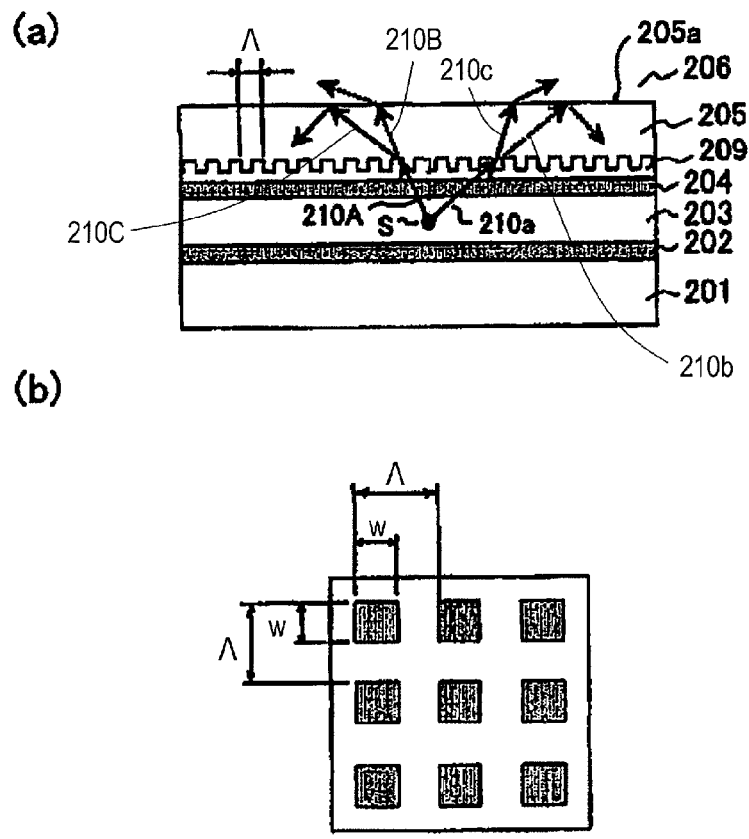
FIG. 29 (a) shows a cross-section of a light emitting device including a diffraction grating of a periodical configuration at an interface; and (b) shows a pattern of (a) as seen from above.

In order to prevent total reflection of light, it is necessary to take a measure to make the incidence angle of light on a refraction surface equal to or less than the critical angle. As one such measure, Patent Document No. 1 describes a light emitting device as shown in FIG. 29. The light emitting device uses an organic EL element including a diffraction grating 209 at an interface between a transparent substrate 205 and a transparent substrate 204. This light emitting device was studied.

As shown in FIG. 29($a$), on a substrate 201, an electrode 202, a light emitting layer 203, a transparent electrode 204, and the diffraction grating layer 209 are stacked in this order. On the diffraction grating layer 209, a transparent substrate 205 is provided. The diffraction grating layer 209 has a periodical concaved and convexed structure having a pitch Λ both in x and y directions at an interface with the transparent substrate 205. The shape of each convexed portion is a square having a width was shown in FIG. 29(b), and such convexed portions are arranged in a houndstooth check. By an application of a voltage between the electrode 202 and the transparent electrode 204, light is emitted at a point S in the light emitting layer 203. This light is transmitted through the transparent electrode 204 directly or after being reflected by the electrode 202, is transmitted through the diffraction grating 209, and is diffracted. For example, assuming that light 210a which is output from the point S advances straight without being diffracted by the diffraction grating layer 209, the light is, like light 210b, incident on a refraction surface 205a of the transparent substrate 205 at an angle equal to or greater than the critical angle and totally reflected. In actuality, however, the light is diffracted by the diffraction grating layer 209, and therefore the light, like light 210c, is incident on the refraction surface 205a at an angle smaller than the critical angle and so can be transmitted through the refraction surface 205a.

The diffraction orientation by the above-described diffraction grating will be described with reference to FIG. 30. The following light will be discussed: light having a wavelength λ, which propagates parallel to the plane of the paper sheet of the figure from the inside of a transparent layer 207 having a refractive index nA, is incident on a point ○ on a refraction surface 207a of the transparent layer 207 at angle θ and is diffracted to a transparent layer 206 having a refractive index nB. On the refraction surface 207a, a diffraction grating having a pitch Λ along the plane of the paper sheet of the figure is formed. A circle 211 having a radius nA and a circle 212 having a radius nB, both having the point ○ as the center, are drawn on the plane of the paper sheet of the figure. An orthogonal projection vector of an incident vector 210i (vector directed from a start point on a circumference of the circle 211 toward the point ○ at angle θ) with respect to the refraction surface 207a is labeled 210I (the orthogonal projection vector of the incident vector 210i is directed from the foot A of the perpendicular thereof toward the point ○). A vector 210r directed from the point ○ as the start point toward an end point on a circumference of the circle 212 is drawn such that an orthogonal projection vector 210R thereof is the same as the vector 210I. A vector starting from the foot C of the perpendicular and having a magnitude of $q\lambda/\Lambda$ (grating vector) will be discussed. q is a diffraction order (integer). In the figure, a vector 210D in the case where q=1 is drawn. Therefore, a vector 210d having the end point B of the vector 210D as the foot of the perpendicular and directed from the point ○ as the start point toward an end point on the circumference of the circle 212 is drawn. From the manner of drawing, the azimuth φ (angle made with the normal to the refraction surface) of the vector 210r is given by the following expression.

$nB \times \sin \phi = nA \times \sin \theta$ (expression 4)

This is exactly the Snell's Law. By contrast, the azimuth φ' (angle made with the normal to the refraction surface) of the vector 210d giving the orientation of the diffracted light beam is given by the following expression.

$nB \times \sin \phi' = nA \times \sin \theta - q\lambda/\Lambda$ (expression 5)

Figure 30:
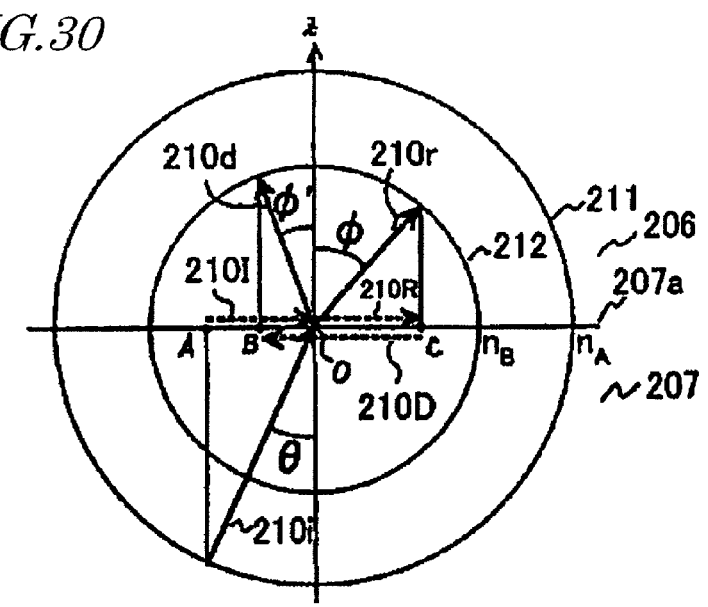
FIG. 30 shows diffraction orientations provided by the diffraction grating.

However, in the case of FIG. 30, the angle φ' is astride z axis (normal to the refractive surface; passing the point ○), and so is defined as having a negative sign.

Namely, the diffracted light beam is deviated in the orientation by $q\lambda/\Lambda$ from the refracted light beam. In FIG. 29, the light beam 210b assumed as not being diffracted corresponds to the refracted light beam. The light beam 210c which is diffracted is deviated in the orientation by $q\lambda/\Lambda$ from the light beam 210b and thus is prevented from being totally reflected by the refraction surface 205a. Accordingly, the light, which would otherwise be totally reflected, can be extracted. Therefore, as compared with the organic EL light emitting device with no diffraction grating layer, this light emitting device may be considered to possibly improve the light extraction efficiency.

However, light 210A which is output from the point S in FIG. 29(a) is discussed as follows. Assuming that the light 210A advances straight without being diffracted by the diffraction grating layer 209, the light, like light 210B, is incident on the refraction surface 205a of the transparent substrate 205 at an angle equal to or less than the critical angle and refracted by the refraction surface 205a to be transmitted. In actuality, however, the light is diffracted by the diffraction grating layer 209. Therefore, the light, like light 210C, is incident on the refraction surface 205a at an angle greater than the critical angle and thus is totally reflected. As can be seen from this, even where the diffraction grating layer 209 is provided, the improvement of the light extraction efficiency is not necessarily guaranteed.

In the light emitting device using the organic EL element shown in FIG. 29, diffracted light shifted in the orientation by a uniform amount of $q\lambda/\Lambda$ is generated in all the light beams. Light including such diffracted light has a light intensity distribution in accordance with the orientation, and the shift width $q\lambda/\Lambda$ depends on the wavelength λ of the output light. Therefore, there is a color unbalance in accordance with the orientation in which the light is output. Namely, the color of the light is different in accordance with the direction in which the light is seen. Such light is inconvenient for displays and also for illumination.

Figure 31:
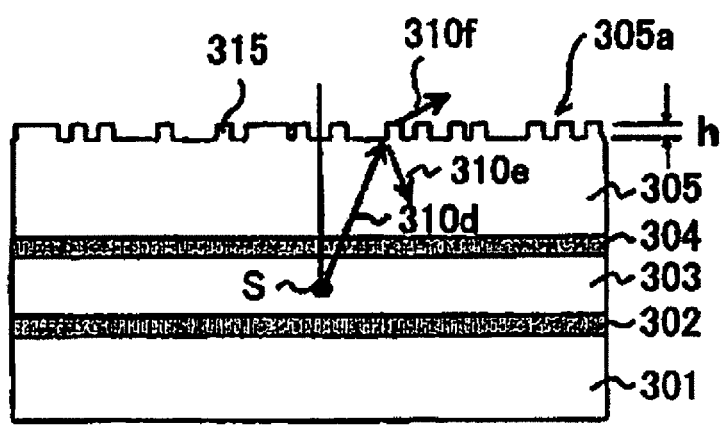
FIG. 31 (a) shows a cross-section of a light emitting device including randomly located protrusions at a surface thereof; and (b) shows a pattern of (a) as seen from above.
Figure 31:
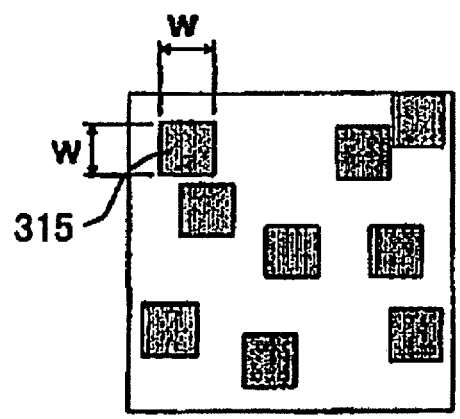

Patent Document No. 2 describes a light emitting device as shown in FIG. 31. The light emitting device uses an organic EL element including protrusions 315 at a surface of a transparent substrate 305. This light emitting device was studied. As shown in FIG. 31(a), on a substrate 301, an electrode 302, a light emitting layer 303, a transparent electrode 304, and the transparent substrate 305 are stacked in this order. At a surface 305a of the transparent substrate 305, the plurality of protrusions 315 are formed. The protrusions 315 each have a quadrangular prism shape with a width w and a height h, and are located randomly at the surface 305a of the transparent substrate 305 as shown in FIG. 31(b). The magnitude of w is in the range of 0.4 to 20 μm, and the magnitude of h is in the range of 0.4 to 10 μm. Such protrusions 315 are formed at a density in the range of 5000 to 1000000 pieces/mm². By an application of a voltage between the electrode 302 and the transparent electrode 304, light is emitted at the point S in the light emitting layer 303. This light is transmitted through the transparent electrode 304 directly or after being reflected by the electrode 302. A part thereof is extracted outside as 310f through the protrusions 315. In actuality, the protrusions 315 can be processed by side etching to become thinner toward a tip thereof. Even without side etching, the effective refractive index has a value in the vicinity of an intermediate value between the refractive indices of the transparent substrate 305 and air. Therefore, the refractive index distribution can be slowly changed equivalently. Accordingly, the refractive index distribution is close to that shown in FIG. 28(b), and so the protrusions 315 can partially prevent the light reflection as represented with 310e. As a result, the light extraction efficiency can be improved. Even where the size of the protrusions 315 is set to be greater than the wavelength, the interference of the extracted light can be suppressed because the protrusions 315 are located randomly.

However, in the case of the light emitting device having the structure shown in FIG. 31, assuming that the effect of the protrusions is to prevent the reflection as described in Patent Document No. 2, the improvement of the transmittance is only provided for light incident at an angle equal to or less than the critical angle, as is understood from a comparison of curves 108a and 108b with curves 108A and 108B in FIG. 28(c). The improvement of the light extraction efficiency is as low as 10 to 20%. A significant improvement is not expected.

Based on the above studies, the present inventors accumulated further studies on how to decrease the amount of light which is totally reflected by the refraction surface and to increase the amount of light which can be extracted. At the start of such further studies, the present inventors studied border conditions of light at a refraction surface.

Figure 32:
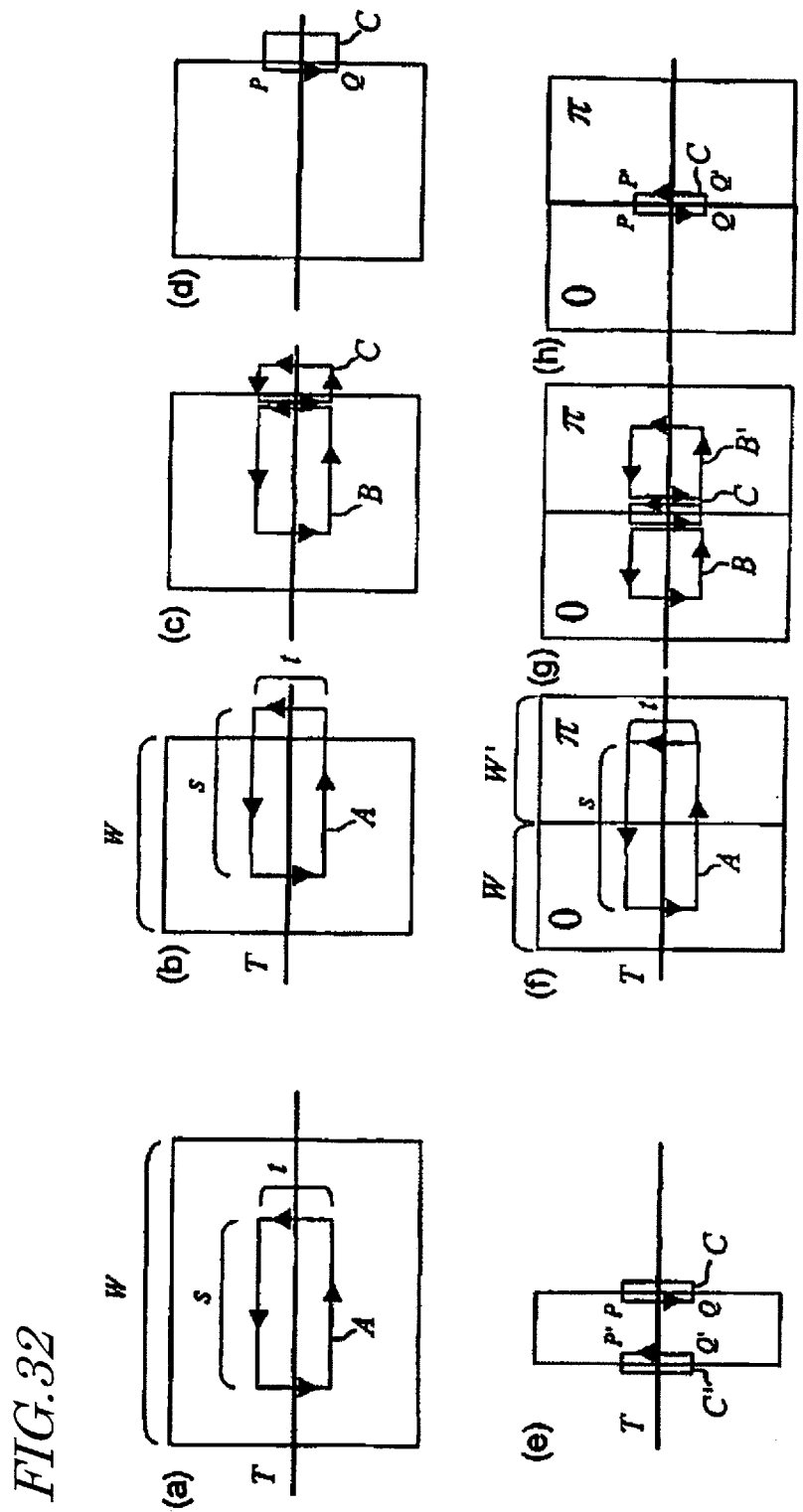
FIG. 32 (a) through (h) show border conditions of an optical field at the refraction surface.

FIG. 32 schematically shows border conditions of an optical field of a refraction surface. Light having a width W is incident on a refraction surface T. From the Maxwell's equations, regarding an electric field vector or a magnetic field vector, an integral along route A going circling across the refraction surface T is zero. This is on the preconditions that there is no charge or light source inside the circuit track and that the strength and phase of the electric field vector or the magnetic field vector along the refraction surface T are continuous.

In the case where the width W is sufficiently large as shown in FIG. 32(a), a width t perpendicular to the refraction surface can be negligibly small as compared with a width s along the refraction surface. In this case, among contour integral, only a component along the refraction surface remains. From this relationship, it is found that the electric field vector or the magnetic field vector is continuous across the refraction surface. Using this relationship of continuity, the Fresnel equations are derived. By these equations, the law of reflection, the law of refraction, the phenomenon of total reflection and the like are completely clarified.

When the width W of the light becomes as small as several tens of times the wavelength as shown in FIG. 32(b), the width t becomes non-negligible. In this case, when contour integral A is divided into B and C (see FIG. 32(c)), contour integral B is contained in the light flux and so becomes zero. The remaining contour integral C is merely of an integral value of route PQ in the light flux (see FIG. 32(d)) because the electric field vector or the magnetic field vector outside the light flux is zero. Therefore, contour integral C is not zero, and is, according to the calculations, equivalent to light emission in the circuit track. When the width W of the light is decreased to about 1/10 of the wavelength, as shown in FIG. 32(e), contour integral C and contour integral C' become closer to each other, and route PQ and route P'Q' overlap each other.

Therefore, the total contour integral of C and C' becomes zero, and thus no light is emitted in the circuit track.

In the case where, as shown in FIG. 32(f), light fluxes having a phase shift $\pi$ are arranged along the refraction surface, contour integral A across these light fluxes will be discussed. In this case also, when the width W of the light is decreased to several tens of times the wavelength or less, the width t becomes non-negligible. In this case, when contour integral A is divided into B, C and B' (see FIG. 32(g)), contour integrals B and B' are contained in the light flux and so become zero. The remaining contour integral C is merely of an integral value of route PQ and route Q'P' along the border between the two light fluxes (see FIG. 32(h)) because the component along the refraction surface is negligible. The integral of route Q'P' of a field having a light flux phase of $\pi$ is equal to the integral of route P'Q' of a field having a light flux phase of 0. Therefore, contour integral C is twice the integral of route PQ, and is, according to the calculations, equivalent to light emission in the circuit track. Even if the light flux phase is of a value other than $\pi$, as long as the light flux phase is not an integer multiple of $2\pi$, contour integral C is, according to the calculations, equivalent to light emission in the circuit track because the integral of route PQ and the integral of route Q'P' do not cancel each other.

Therefore, in addition to the case where light is transmitted through a narrow area, in the case where light fluxes transmitted through two narrow areas are different in phase, light is emitted in the vicinity of the border between the areas (it should be noted that merely the same behavior as light emission occurs, but light emission does not actually occur). This phenomenon is similar to the border diffraction proposed by Young before the theory of diffraction was formed, and so will be referred to as the "border diffraction effect" herein.

When light is emitted on the refraction surface T, the light propagates into a medium on both sides of the refraction surface T regardless of the incidence conditions. Namely, it is considered that even the light is incident at an angle equal to or greater than the critical angle, total reflection does not occur and there is a light component which is transmitted, as long as light is emitted on the refraction surface according to the calculations. Based on such results of discussion, the present inventors studied the following structure of a refraction surface for actually causing the phenomenon that light is transmitted even when the incidence angle exceeds the critical angle.

Figure 33:
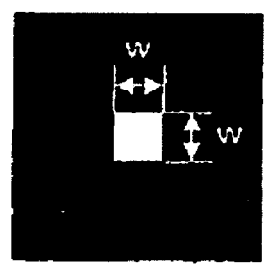
FIG. 33] (a) shows a pinhole; and (b) shows an arrangement of phase shifters.
Figure 33:
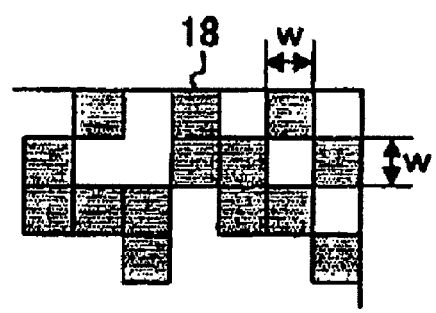

As examples in which the border diffraction effect is strongly exhibited, the present inventors picked up the models shown in FIG. 33. The model shown in FIG. 33(a) is obtained as follows. At a border face between the transparent substrate provided on the light emitting body and air, a pinhole is formed and the area other than the pinhole is shielded, so that pinhole light is provided (light is present only in the white square having a width w). The model shown in FIG. 33(b) is obtained as follows. A border face between the transparent substrate provided on the light emitting element and air is divided into checkerboard squares having a width w. On such a pattern, 180 degree phase shifters 180 are located randomly. First, the pinhole model was studied, but light was not actually extracted almost at all. Therefore, the phase shifter model having the phase shifters located randomly, which was considered to exhibit the same light extraction characteristic as that of the pinhole model, was also studied.

Figure 34:
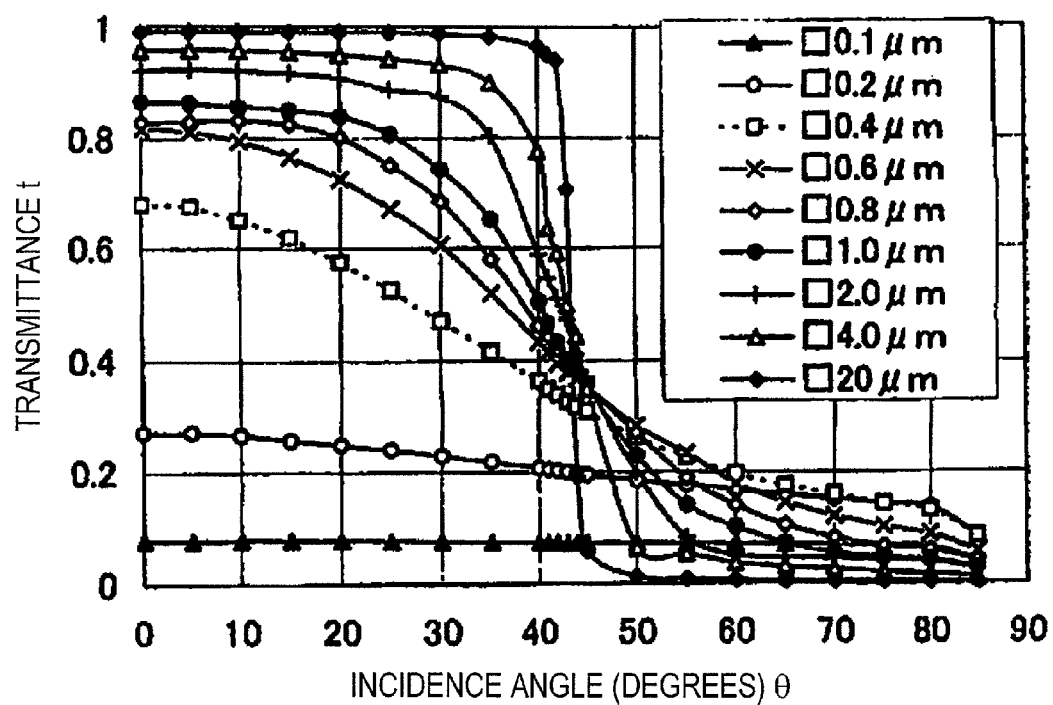
FIG. 34 shows the transmittance with respect to the incidence angle on a refraction surface having phase shifters randomly located thereon.

FIG. 34 shows the incidence angle dependence of the transmittance t of the refraction surface in the structure shown in FIG. 33. FIG. 34 shows how much of light having a wavelength of 0.635 μm and a light amount of 1, which is incident on the border face between the transparent substrate having a refractive index of 1.457 and air at angle θ (angle made with the normal to the refraction surface), is output to the air in the first-time light extraction. The width w is used as the parameter (w=0.1, 0.2, 0.4, 0.6, 0.8, 1.0, 2.0, 4.0, 20.0 μm). (The pinhole light and the 180 degree phase shifters have exactly the same characteristic, and so the characteristic of the 180 degree phase shifters is used.) According to the characteristic of w=20 μm, which is close to the condition of FIG. 32(a), when the incidence angle exceeds the critical angle (43.34 degrees), the transmittance becomes almost zero. When w becomes as small as 0.4 to 1.0 μm, even when the incidence angle exceeds the critical angle, there are high values of transmittance because of the border diffraction effect described with reference to FIGS. 32(d) and (h). When w becomes smaller (w=0.1, 0.2 μm), the transmittance approaches 0 at any incidence angle as described with respect to FIG. 32(e). FIG. 34 shows the analysis results based on the wave equation of Helmholtz (so-called scalar wave equation), and so does not exhibit the difference between the P polarization and the S polarization.

Figure 35:
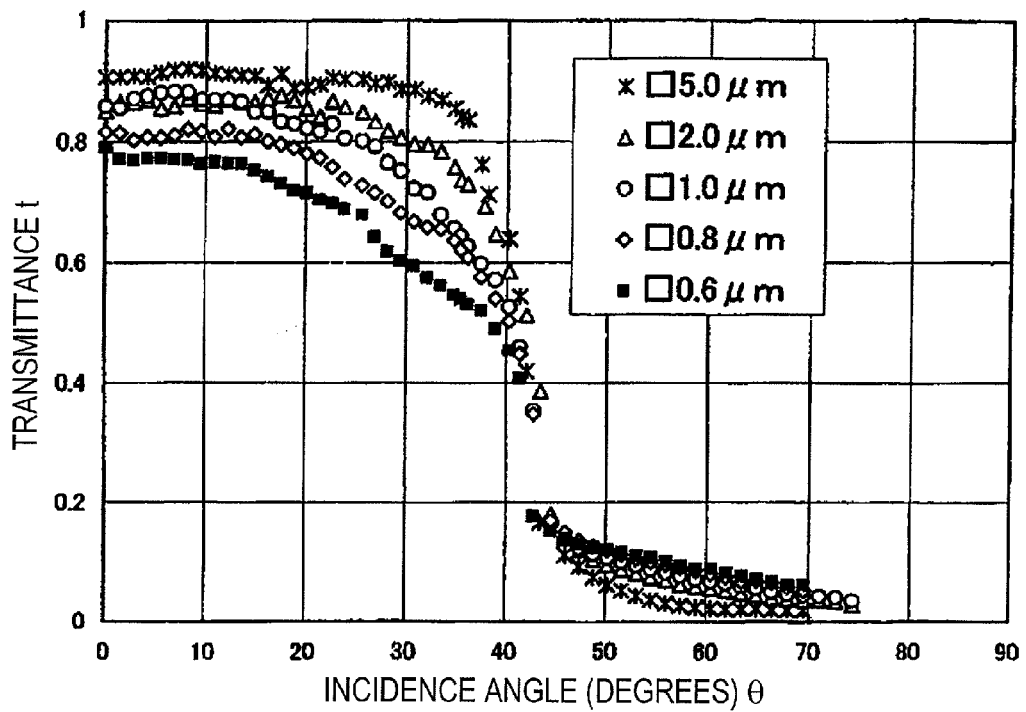
FIG. 35 provides experimental results showing the transmittance with respect to the incidence angle on a refraction surface having phase shifters randomly located thereon.
Figure 36:
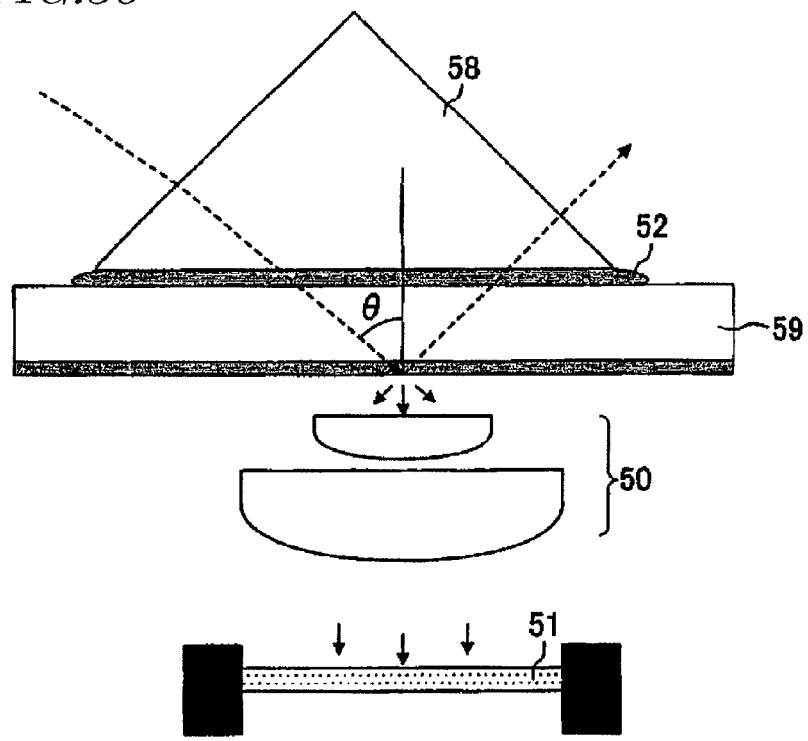
FIG. 36 shows a structure of an experiment device for measuring the transmittance with respect to the incidence angle.

FIG. 35 provides the experimental results showing the incidence angle dependence of the transmittance t in the first-time light extraction of the incident P polarization. It is actually difficult to produce precise phase shifters 18. Therefore, the experiment was performed using a mask in which the portions of the phase of 0 degrees are made light-transmissive and the portions of the phase of 180 degrees are covered with a light shielding film (Cr film) (pattern of checkerboard squares having a width w, which are covered with light shielding films randomly; same as a model in which pinhole light is randomly located) (When being normalized using the amount of light incident on areas not covered with the light shielding films, the transmittance characteristic in this case also corresponds to FIG. 34 according to the calculations.) In the mask patterns actually produced, the width w was 0.6, 0.8, 1.0, 2.0, and 5.0 μm. As shown in FIG. 36, the experiment device includes a semiconductor laser (wavelength: 0.635 μm), a triangular prism 58 (BK7), a mask substrate 59 (synthetic quartz; refractive index: 1.457; having a mask pattern on the rear surface), a light collection lens system 50, and a light detector 51. The triangular prism is put into close contact with a surface of the mask substrate in the state where a matching liquid 52 having a refractive index of 1.51 is held therebetween, and laser light is incident while the azimuth is measured from the side of the triangular prism. The transmitted light leaking from the rear surface is collected by the light collection lens system 50, and the amount of the transmitted light is measured by the light detector 51. In the case where the mask is used, the light corresponding to the light shielding films occupying ½ of the entire area size is blocked, and so the amount of the transmitted light is ½ of that obtained when the phase shifters are used. Therefore, the transmittance t is normalized with the amount of light incident on the areas with no light shielding films (½ of the entire amount of light). The experimental results match well with the analysis results shown in FIG. 34. It is understood that even when the incidence angle exceeds the critical angle (43.34 degrees), there are high values of transmittance and that this tendency is stronger as w is smaller.

Based on these results, the present inventors made further studies and conceived a novel light emitting device which significantly improves the light extraction efficiency by preventing total reflection.

Hereinafter, embodiments of the present invention will be described in detail with reference to the figures. In the figures described below, elements having substantially identical functions will bear identical reference numerals for the simplicity of description.

(Embodiment 1)

Embodiment 1 Will be Described with Reference to FIGS. 1 through 5.

FIG. 1(a) shows a cross-sectional structure of a light emitting device using an organic EL element in Embodiment 1, and how light propagates. On a substrate 1, an electrode 2, a light emitting layer 3, and a transparent electrode 4 are stacked in this order. On the transparent electrode 4, a transparent substrate (transparent sheet or transparent protecting layer) 5 is provided. The substrate 1, the electrode 2, the light emitting layer 3, and the transparent electrode 4 form a light emitting body, and a surface of the transparent electrode 4 is a surface of the light emitting body. One of surfaces of the transparent substrate 5 is located to face a light emitting face of the light emitting body. At the other surface of the transparent substrate 5, a surface configuration 13 having a concaved and convexed pattern obtained by dividing the surface into tiny areas is formed. The surface configuration 13 is in contact with an air layer 6 which is a medium.

By an application of a voltage between the electrode 2 and the transparent electrode 4, light is emitted at a point S in the light emitting layer 3. This light is transmitted through the transparent electrode 4 directly or after being reflected by the electrode 2, and is incident on a point P on the surface configuration at the surface of the transparent substrate 5 at angle θ with respect to the surface normal to the surface. The light is diffracted by the surface configuration 13 and output to the air layer 6.

Where the refractive index of the air layer 6 is n0 and the refractive index of the transparent substrate 5 is n1, total reflection should occur when the incidence angle θ exceeds the critical angle $\theta c = \sin^{-1}(n0/n1)$. However, owing to the surface configuration 13 provided at the surface of the transparent substrate 5, even though the light is incident on a point Q at an angle equal to or greater than the critical angle θc, the light is diffracted and output to the air layer 6 without being totally reflected (first-time light extraction). The light is partially reflected at the point Q, but the reflected component is again incident on a point R on the surface configuration 13 after being reflected by the electrode 2. A part thereof is output to the air layer 6 (second-time light extraction), and the remaining light is reflected. This process is repeated infinitely.

Now, a light emitting device using a conventional organic EL element with no surface configuration 13 will be discussed. The light incident on an interface between the transparent substrate and the air layer at an angle equal to or greater than the critical angle is totally reflected. Even though the light is reflected by the electrode, the light is again incident on the interface between the transparent substrate and the air layer at an angle equal to or greater than the critical angle. Therefore, the second-time and subsequent light extractions do not occur. The light emitting device using the conventional organic EL element is different on this point from the light emitting device in this embodiment.

Hereinafter, the surface configuration 13, which is a feature in this embodiment, will be described in detail. For easier understanding, features of the surface configuration 13 will be described together with formation steps thereof.

Figure 1:
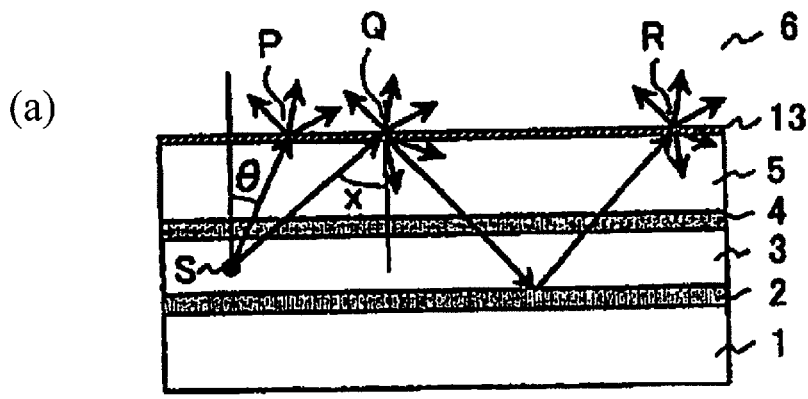
FIG. 1 (a) shows a cross-sectional structure of an organic electroluminescence element in Embodiment 1, and how light propagates; (b) shows a cross-section of a light emitting device including an adjusting layer; and (c) shows a cross-section of a light emitting device including a surface configuration also at a border with the adjusting layer.
Figure 1:
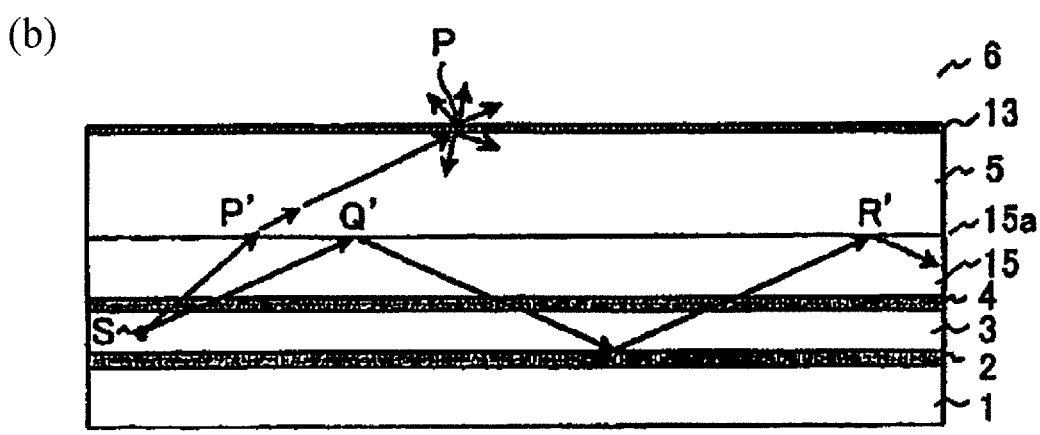
Figure 1:
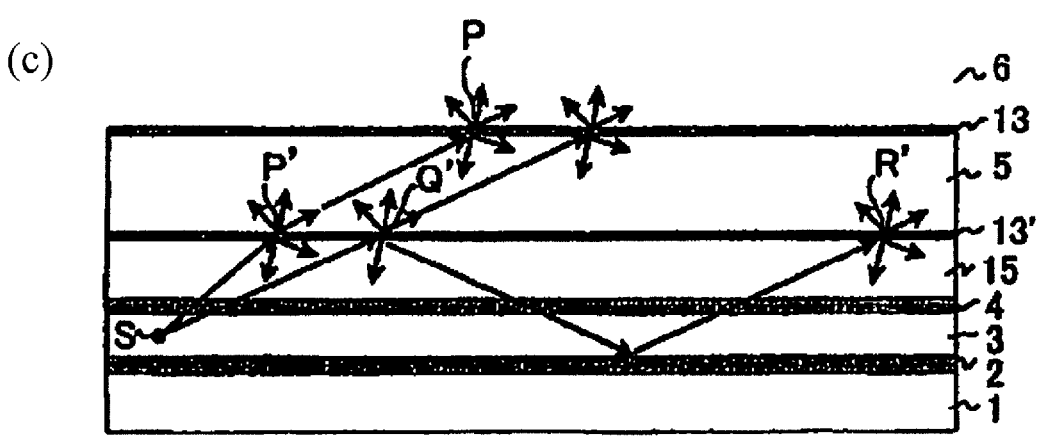
Figure 2:
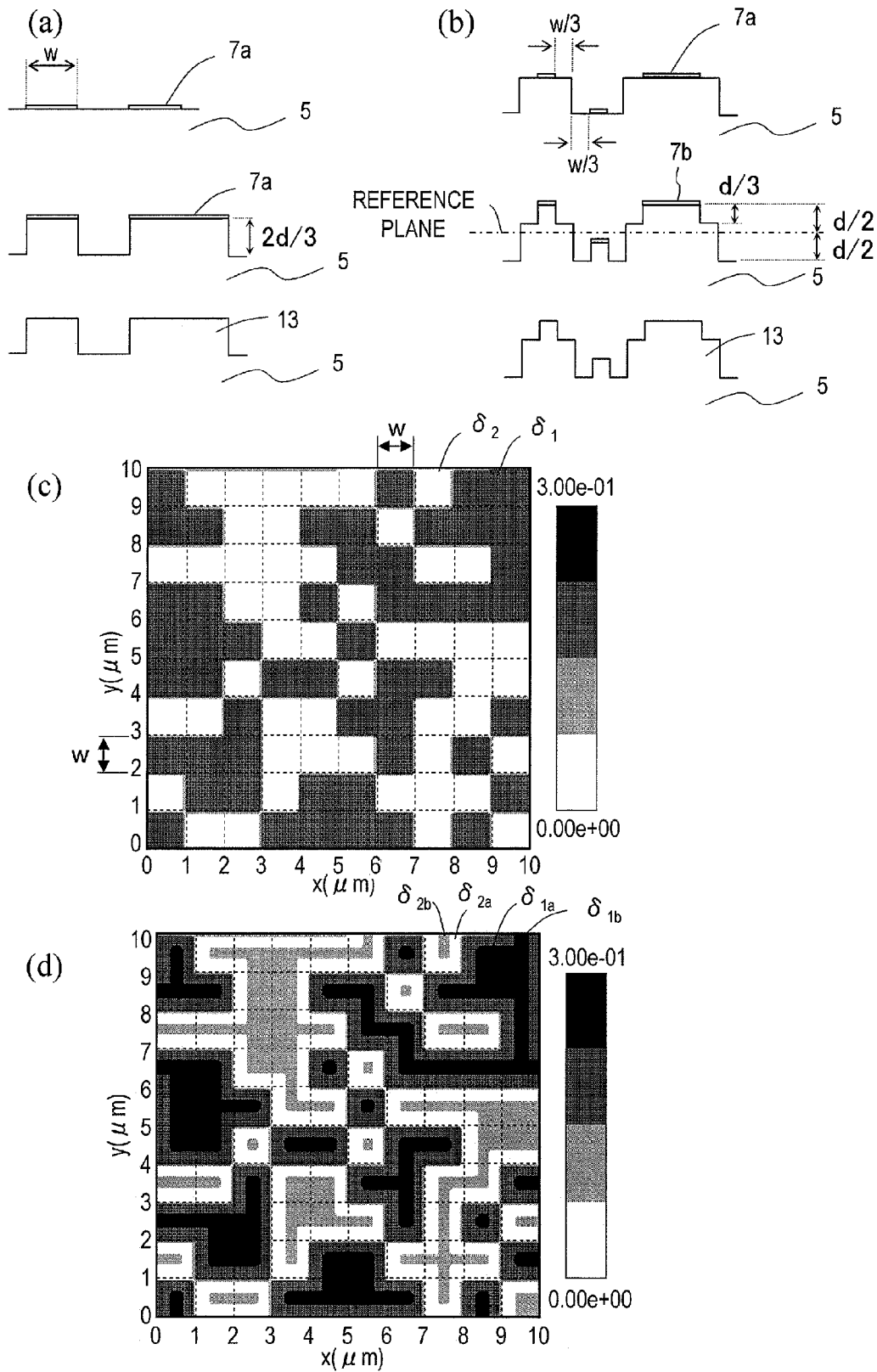
FIG. 2 (a) is a cross-sectional view showing a first process for forming a surface configuration in Embodiment 1; (b) is a cross-sectional view showing a second process for forming the surface configuration; (c) shows a pattern of the surface configuration formed by the first process; and (d) shows a final pattern of the surface configuration formed by the second process.

FIG. 2 shows a formation procedure, cross-sectional views, and patterns of the surface configuration 13 in Embodiment 1. The surface configuration 13 is formed in two processes. FIG. 2(a) shows a first process, and FIG. 2(b) shows a second process. In FIG. 2(a), a photoresist formed on the transparent substrate 5 is exposed by a technique of reduction exposure or the like using a first mask, and the exposed parts are removed to form a resist pattern 7a (development). The transparent substrate 5 is etched by a depth of 2d/3, and the resist is removed.

FIG. 2(c) shows a pattern formed by the first process. On this stage, the surface configuration 13 is a result of the following: the surface of the transparent substrate 5 is divided into checkerboard squares (tiny square areas δ) each having a width w (referred to as the "border width") with no gap, and convexed portions and portions relatively concaved to the convexed portions are randomly assigned while probability P of each square being a convexed portion (tiny area $\delta_1$, gray square) is 50% and probability 1−P of each square being a concaved portion (tiny area $\delta_2$, white square) is 50% (probability P may be any other value than 50%). FIG. 2(c) shows an example in which w=1.0 μm. Namely, one tiny area δ is adjacent to, and surrounded by, others of the plurality of tiny areas δ. Tiny areas $δ_1$ protrude upward from tiny areas $δ_2$ toward the surface of the transparent substrate 5 by 2d/3. The tiny areas δ are square in this embodiment, but may be of another shape as long as the diameter of the maximum circle among the circles inscribed to the tiny areas δ is 0.2 μm or greater and 3 μm or less.

The probability of each tiny area δ being a tiny area $δ_1$ or a tiny area $δ_2$ is respectively P or 1−P. Therefore, it is possible that two or more tiny areas $δ_1$ or two or more tiny areas $δ_2$ are continuously existent. In this case, no border is formed between the continuous tiny areas $δ_1$ or $δ_2$, and the border is virtual. However, in this case also, the border between the areas is not existent merely because the tiny areas $δ_1$ or $δ_2$ are continuous, and the surface of the transparent substrate 5 is still divided into the tiny squares δ as the basic unit.

In FIG. 2(b), a photoresist is again applied on the transparent substrate 5 and is exposed by a technique of reduction exposure or the like using a second mask, and the exposed parts are removed to form a resist pattern 7b (development). The transparent substrate 5 is etched by a depth of d/3, and the resist is removed. The exposed parts (resist-removed parts) in this process are areas each along the border between the tiny area $δ_1$ and the tiny area $δ_2$. Areas each having a width of 2w/3 and having the border at the center are exposed.

FIG. 2(d) shows a final pattern formed by the second process. Each tiny area $δ_1$ is divided into two, i.e., into an area $δ_{1a}$ (dark gray area) which is in contact with the corresponding tiny area $δ_2$ and having a width of w/3, and the remaining tiny area $δ_{1b}$ (black area). Each tiny area $δ_2$ is divided into two, i.e., into an area $δ_{2a}$ (white area) which is in contact with the corresponding tiny area $δ_1$ and having a width of w/3, and the remaining tiny area $δ_{2b}$ (light gray area). Here, a reference plane parallel to the surface of the transparent substrate 5 is set at an intermediate position in a direction vertical to the surface of the transparent substrate 5. From the reference plane, each tiny area $δ_{1b}$ protrudes upward by d/2, each tiny area $δ_{1a}$ protrudes upward by d/6, each tiny area $δ_{2a}$ is recessed downward by d/2, and each tiny area $δ_{2b}$ is recessed downward by d/6. The first process and the second process may be performed in this order or in the opposite order. The ratio of the etching depth between the first process and the second process is 2:1, but may be another ratio. Any ratio is usable as long as the etching results in the state where from the reference plane, each tiny area $δ_{1b}$ protrudes upward by d/2, each tiny area $δ_{1a}$ protrudes upward by a value of 0 to d/2, each tiny area $δ_{2a}$ is recessed downward by d/2, and each tiny area $δ_{2b}$ is recessed downward by a value of 0 to d/2. Instead of the second mask, an inverted mask thereof (mask in which the light shielding portions and the light transmitting portions are exchanged with each other) may be used. In this case, the final pattern formed by the second process is the same as in FIG. 2(d), but from the reference plane, each tiny area $δ_{1a}$ protrudes upward by d/2, each tiny area $δ_{1b}$ protrudes upward by d/6, each tiny area $δ_{2b}$ is recessed downward by d/2, and each tiny area $δδ_{2a}$ is recessed downward by d/6.

The surface configuration 13 may be formed as follows. A die having a concaved and convexed pattern is formed by etching, and this shape is transferred onto a resin sheet by pressing. This sheet is used as the transparent substrate 5 and is bonded to the transparent electrode 4 via an adhesive layer. In this case, the transparent substrate 5 is a transparent sheet. Alternatively, a surface of a sheet or a surface of the transparent substrate 5 formed as a protecting layer may be directly etched or the like to form a concaved and convexed pattern.

Light diffracted by such a random pattern propagates in random orientations. Therefore, there is no distribution of the light intensity in accordance with the orientation or no color unbalance in accordance with the orientation, which occurs when the light emitting device described in Patent Document No. 1 is used. Light incident from the outside (from the side of the air layer) is reflected by the surface configuration 13 at the surface of the transparent substrate 5. However, the reflected light is diffracted in random orientations. Therefore, an image of the outside is not seen on the surface of the transparent substrate 5, and so there is no need for optical processing such as providing a reflection preventing film or the like. As a result, the production cost can be suppressed low.

Figure 3A:
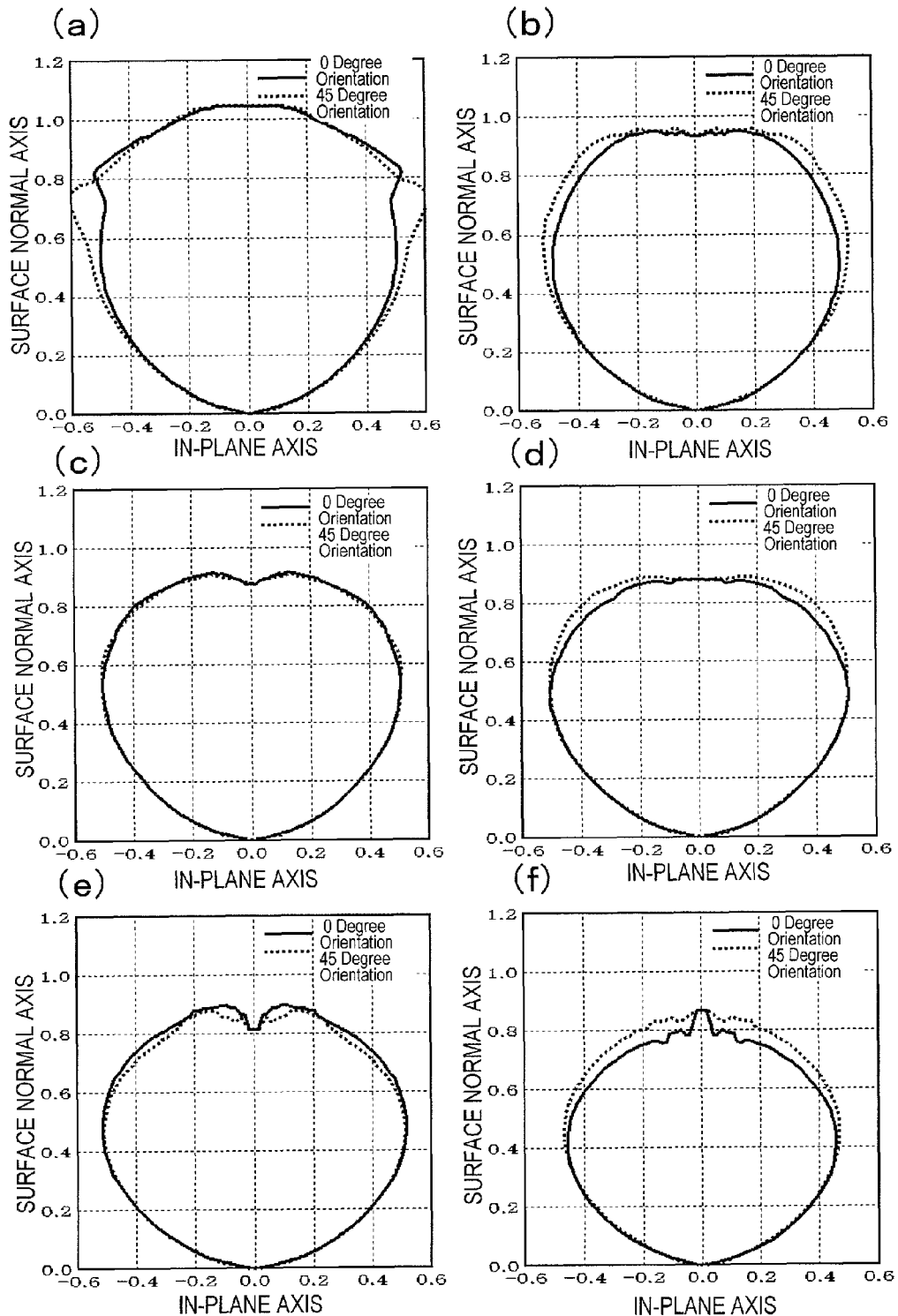
FIG. 3A (a) through (f) show the viewing angle dependence of light output from the surface configuration in Embodiment 1.
Figure 3B:
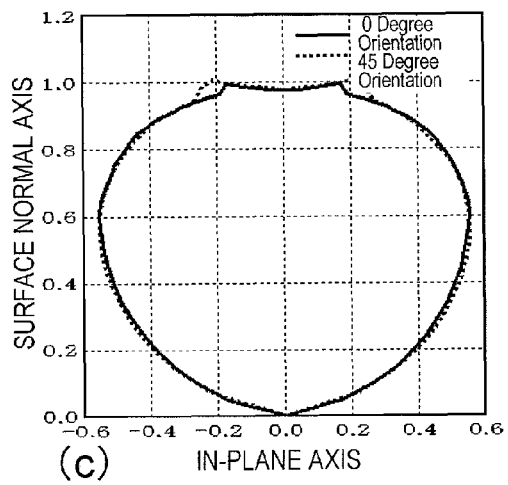
FIG. 3B (a) through (f) show the viewing angle dependence of light output from the surface configuration in Embodiment 1.
Figure 3B:
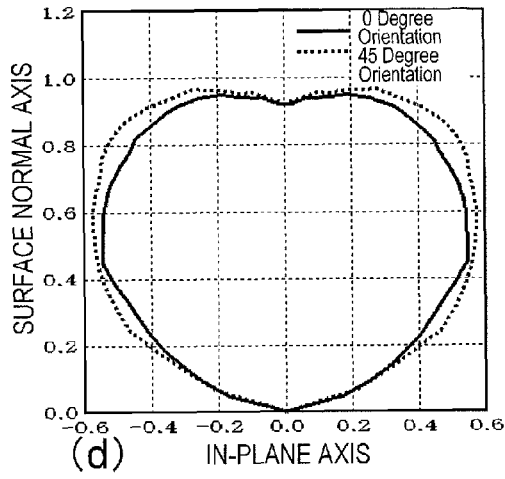
Figure 3B:
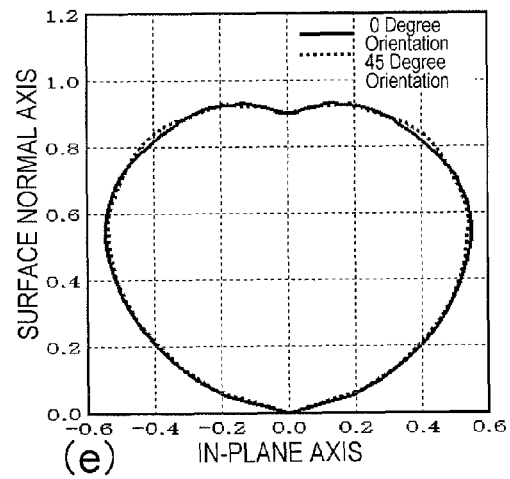
Figure 3B:
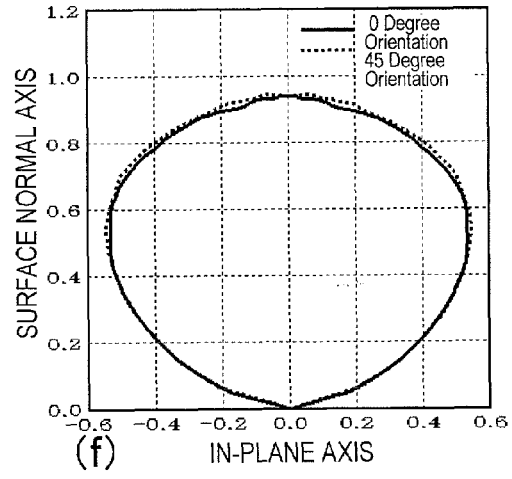
Figure 3B:
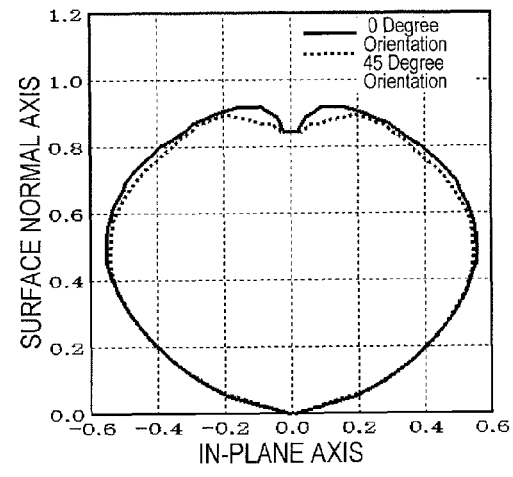
Figure 3B:
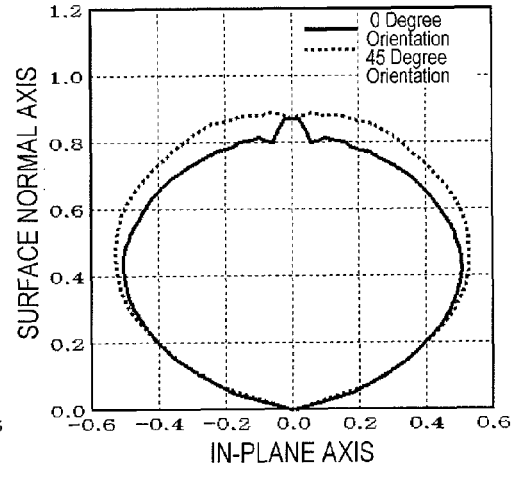

FIGS. 3A and 3B show analysis results of the viewing angle dependence of the light extracted from the surface configuration 13 in the first-time light extraction in Embodiment 1. The step d=0.6 μm, and the wavelength λ and the border width w are parameters. FIGS. 3A(a) through (f) show the results in the case where λ=0.450 μm. FIGS. 3B(a) through (f) show the results in the case where λ=0.635 μm. In each of FIGS. 3A and 3B, (a) shows the results in the case where w=0.5 μm, (b) shows the results in the case where w=1.0 μm, (c) shows the results in the case where w=1.5 μm, (d) shows the results in the case where w=2.0 μm, (e) shows the results in the case where w=3.0 μm, and (f) shows the results in the case where w=4.0 μm.

A vector connecting the origin of the horizontal axis and a point on a curve represents the intensity and the orientation of the output light. The length of the vector corresponds to the light intensity, and the orientation of the vector corresponds to the orientation of the output light. The vertical axis corresponds to the orientation of the surface normal axis, and the horizontal axis corresponds to the orientation of the in-plane axis. The solid line represents the analysis results of the viewing angle dependence in a cross-section having an in-plane axis along x axis or y axis in FIG. 2(d) (longitude orientation: 0 degrees, 90 degrees). The dotted line represents the analysis results of the viewing angle dependence in a cross-section having an in-plane axis along a straight line of y=x or y=−x (longitude orientation: 45 degrees, 135 degrees). The results at the orientation of 90 degrees match the results at the orientation of 0 degrees and so are omitted, and the results at the orientation of 135 degrees match the results at the orientation of 45 degrees and so are omitted. As the curve is slower, the change in the light intensity occurring in accordance with the difference in the viewing angle is smaller.

As can be seen from these figures, when the border width w=0.5 μm, there are angles of deviation (latitudes) with respect to which the intensity fluctuation is large; and when w=1.0 to 2.0 μm, the solid line and the dotted line both exhibit a slow intensity fluctuation with respect to the angle of deviation (i.e., small intensity difference caused by the parallax). When w=3.0 μm or 4.0 μm, the intensity fluctuation with respect to the angle of deviation becomes large in the vicinity of the direction of the surface normal. Accordingly, it is understood that the viewing angle dependence showing a slow intensity fluctuation with respect to the angle of deviation is obtained under the condition that the border width w=0.5 μm or greater and 3.0 μm or less.

Figure 4:
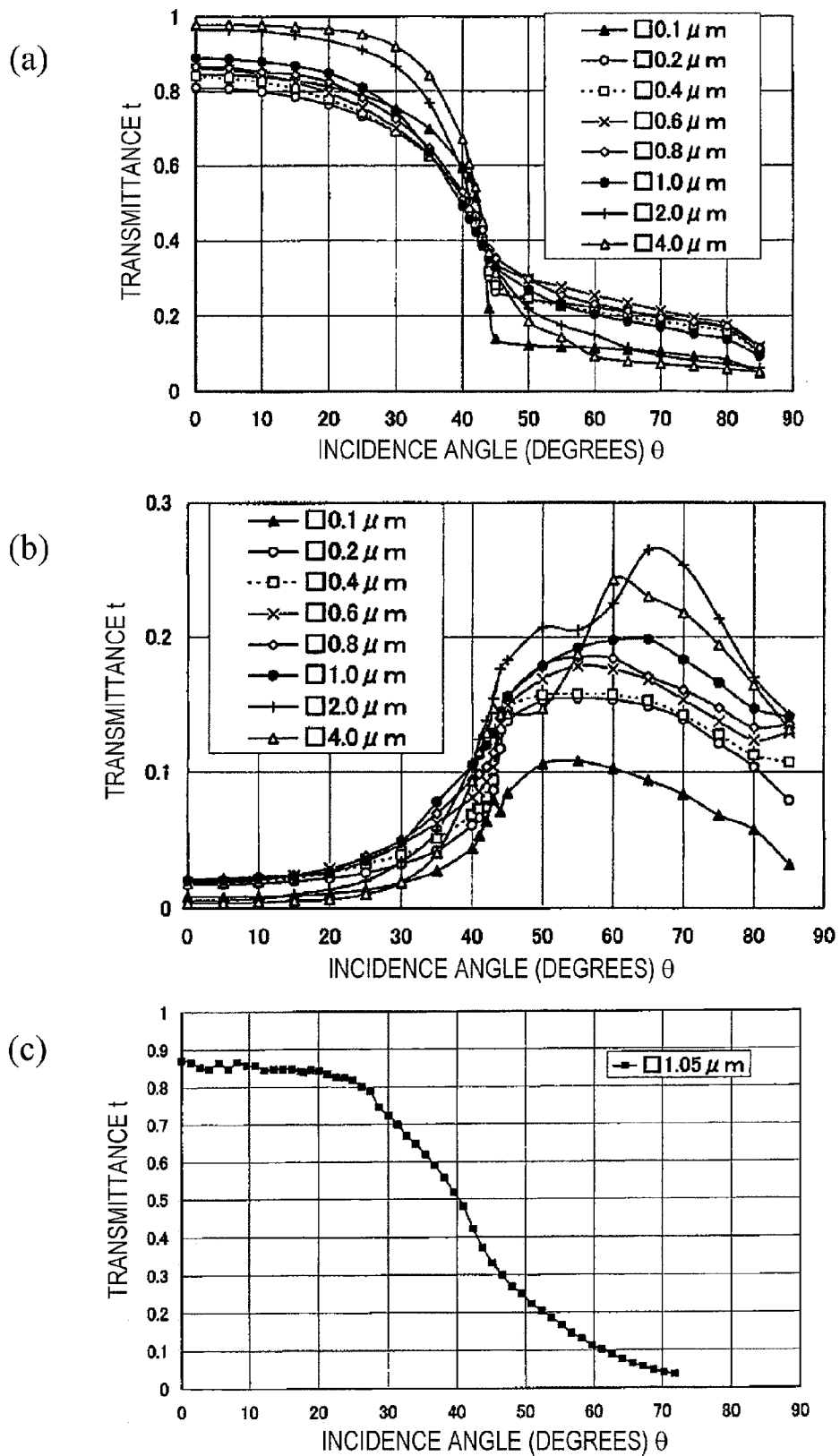
FIG. 4 FIG. 4 shows the incidence angle dependence of the transmittance t of the surface configuration in Embodiment 1; (a) shows the incidence angle dependence of the transmittance in the first-time light extraction; (b) shows the incidence angle dependence of the transmittance in the second-time light extraction; and (c) provides experimental results showing the incidence angle dependence of the transmittance in the first-time light extraction.

FIG. 4 shows the incidence angle dependence of the transmittance t of the surface configuration 13 in Embodiment 1. FIG. 4(a) shows how much of light having a light amount of 1 which is incident on the surface configuration of the transparent substrate 5 at angle θ (angle made with the refraction surface normal) is output to the air 6 in the first-time light extraction. FIG. 4(b) shows the incidence angle dependence of the transmittance in the case where the light is reflected by the surface configuration 13, reflected by the electrode 2 and again incident on the surface configuration 13, namely, the incidence angle dependence of the transmittance in the second-time light extraction. It is assumed that the reflectance by the electrode 2 is 100% and no light is absorbed while the light is reciprocated between the surface configuration 13 and the electrode 2. In all of the figures, a refractive index of the light emitting layer 3 and the transparent substrate 5 is n1=1.457; a refractive index of the air 6 is n0=1.0; the wavelength of light is λ=0.635 μm; the step of the tiny areas $δ_{1b}$ with respect to the tiny areas $δ_{2a}$ is d=0.7 μm; the area size ratio of the tiny areas $δ_1$ is P=0.5; and the width w of the surface configuration is the parameter (w=0.1, 0.2, 0.4, 0.6, 0.8, 1.0, 2.0, 4.0 μm). The step d=0.7 μm corresponds to the condition under which when light is incident vertically, the light transmitted through the concaved portion and the light transmitted through the convexed portion have a phase shift of π(d=λ/2(n1−n0)).

The results shown in FIG. 4(*a*) are close to the results obtained where the 180 degree phase shifters 180 are used (FIG. 34) except for the results when w=0.1 and 0.2 μm. High values of transmittance are exhibited even when the incidence angle exceeds the critical angle. FIG. 4(*c*) provides the experimental results showing the incidence angle dependence of the transmittance t of the incident P polarization. The experiment was performed as follows. A surface configuration 13 having a depth d=0.6 μm and a border width w=1.05 μm was formed on a quartz substrate by an electron beam technique. For the measurement, the measuring device shown in FIG. 36 was used. The experimental results match well the analysis results shown in FIG. 4(*a*). It is understood that high values of transmittance are exhibited even when the incidence angle exceeds the critical angle (43.34 degrees). As described above before this embodiment, the reason why light is transmitted even when the incidence angle exceeds the critical angle is that equivalent light emission (so-called border diffraction effect) occurs on the refraction surface and this light propagates in the medium on both sides of the refraction surface.

Figure 5:
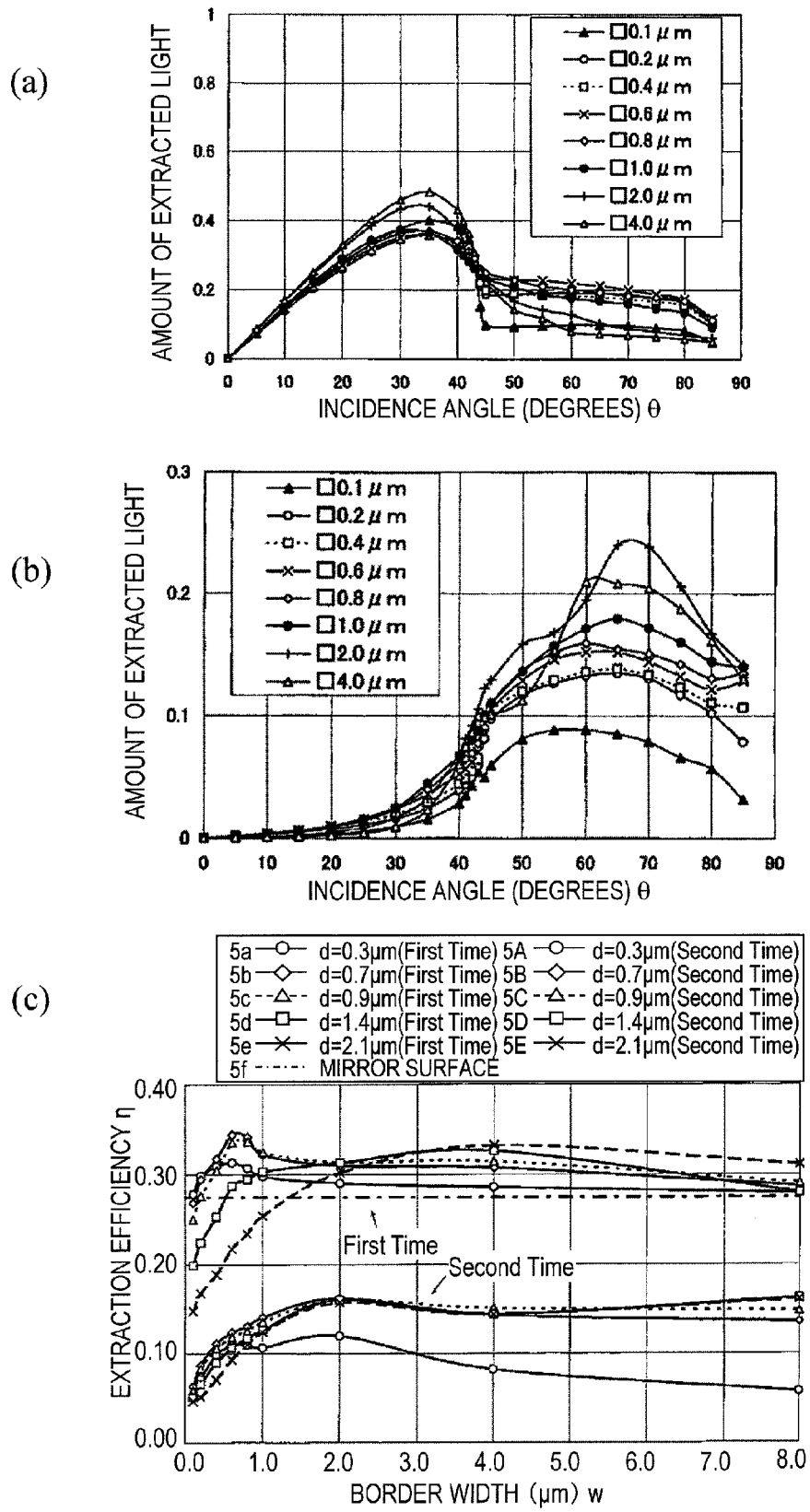
FIG. 5 FIG. 5 shows the incidence angle dependence of the amount of light extracted from the surface configuration in Embodiment 1; (a) shows the incidence angle dependence of the amount of extracted light in the first-time light extraction; (b) shows the incidence angle dependence of the amount of extracted light in the second-time light extraction; and (c) shows the light extraction efficiency.

Assuming that light generated by point light emission is uniformly diffused in the transparent substrate 5 as a spherical wave, the sum of the amounts of light which is present between the light emission orientation θ (matching the incidence angle θ mentioned above) and θ+dθ is in proportion to sin θdθ. Accordingly, the amount of extracted light is in proportion to a value obtained by multiplying the transmittance t shown in FIGS. 4(*a*) and (*b*) by sin θ. FIGS. 5(*a*) and (*b*) show the incidence angle dependence of the amount of light extracted from the surface configuration in Embodiment 1. Namely, FIG. 5(*a*) shows how much of light having a light amount of 1 which is emitted at a point in the transparent substrate 5 (in actuality, a point in the light emitting layer) and incident on the surface configuration at angle θ (angle made with the refraction surface normal) is output to the air layer 6 in the first-time light extraction. FIG. 5(*b*) shows the incidence angle dependence of the amount of extracted light in the case where the light is reflected once by the surface configuration 13, reflected by the electrode 2 and again incident on the surface configuration 13, namely, the incidence angle dependence of the amount of extracted light in the second-time light extraction. It is assumed that the reflectance by the electrode 2 is 100% and no light is absorbed while the light is reciprocated between the surface configuration 13 and the electrode 2.

The light extraction efficiency is obtained by integrating the amount of extracted light with incidence angle θ. FIG. 5(*c*) shows the light extraction efficiency from the surface configuration 13 in Embodiment 1. FIG. 5(*c*), in which the horizontal axis represents the border width w of the surface configuration 13, shows the light extraction efficiency obtained under the same conditions as those of FIG. 4(*a*). FIG. 5(*c*) shows the light extraction efficiency (efficiency η1 in the first-time light extraction) when the step of the surface configuration 13 is d=0.3, 0.9, 1.4 and 2.1 μm in addition to when d=0.7 μm, and also the light extraction efficiency in the case where the light is reflected by the surface configuration 13, reflected by the electrode 2 and again incident on the surface configuration 13 (efficiency η2 in the second-time light extraction) with an assumption that no light is attenuated while reciprocating between the surface configuration 13 and the electrode 2, namely, that no light is absorbed by the transparent electrode 4 or there is no reflection loss of light by the electrode 2. Curve 5*a* and curve 5A respectively represent the light extraction efficiency in the first-time light extraction and the second-time light extraction when d=0.3 μm. Curve 5*b* and curve 5B respectively represent the light extraction efficiency in the first-time light extraction and the second-time light extraction when d 0.7 μm. Curve 5*c* and curve 5C respectively represent the light extraction efficiency in the first-time light extraction and the second-time light extraction when d=0.9 μm. Curve 5*d* and curve 5D respectively represent the light extraction efficiency in the first-time light extraction and the second-time light extraction when d=1.4 μm. Curve 5*e* and curve 5E respectively represent the light extraction efficiency in the first-time light extraction and the second-time light extraction when d 2.1 μm.

All the curves significantly drop when the border width w is 0.2 μm or less. Therefore, the lower limit of the border width w can be considered to be about 0.2 μm. In a range limited in terms of the viewing angle dependence (w=0.5 to 3.0 μm), curves 5*a* and 5A exhibit a lower light extraction efficiency than the light extraction efficiency at the other depths, and so the deterioration is considered to start when the step d=0.3 μm. Therefore, the lower limit of d can be considered to be about 0.2 μm. As d is increased, the light extraction efficiency in the first-time light extraction is decreased in an area where w is small, and the maximum point thereof is shifted to the side on which w is larger. Up to d=2.1 μm, the maximum value of the light extraction efficiency is in the vicinity of w=3.0 μm. When d is larger, the light extraction efficiency is decreased in the entire area in which w=0.5 to 3.0 μm. Therefore, the upper limit of d can be considered to be about 3 μm. Accordingly, a recommended range of depth d is 0.2 to 3 μm. Such a range of depth d is recommended for the case where the above-described ranges of the wavelength λ of light, the refractive index n1 of the transparent substrate 5 and the refractive index n0 of the air 6 are used. Even when the wavelength of the light to be transmitted, the refractive index of the transparent substrate, and the refractive index of the medium in contact with the transparent substrate are different from the above-mentioned values, substantially the same effects are considered to be provided as long as the phase shift of the light transmitted through each tiny area corresponds to the above-mentioned range of d. Accordingly, in the case where the above-mentioned range of d is generalized using the wavelength λ of the light to be transmitted, the refractive index n1 of the transparent substrate 5, and the refractive index n0 of the medium in contact with the transparent substrate 5, it is preferable that depth d fulfills $2λ/(n1−n0) \geq d \geq λ/6(n1−n0)$. Here, as the medium in contact with the transparent substrate 5, any medium having a refractive index lower than the refractive index n1 of the transparent substrate 5 is usable.

At all the depths fulfilling d≦0.9 μm, the light extraction efficiency in the first-time light extraction is maximum when the border width w=0.4 to 1 μm. When w is decreased or increased, the light extraction efficiency becomes asymptotic to 0.27 (value given by expression 3, the light extraction efficiency in the case where the surface is a mirror surface, represented by straight line 5f in FIG. 5(c)). The light extraction efficiency in the second-time light extraction is maximum when w=1.0 µm to 3.0 µm at all the depths fulfilling d≦0.9 µm. When w is increased, the light extraction efficiency becomes asymptotic to 0.0 (not appear in the range shown in FIG. 5(c)). When w≦0.4 µm, the light extraction efficiency is converged to 0.0 as w is decreased.

Where the light transmittance, as seen from the transparent substrate 5, while the light is reciprocated between the surface of the transparent substrate 5 and the electrode 2 is τ, the light extraction efficiency in the second-time light extraction in consideration of the light attenuation occurring during the reciprocation is τ×η2. Assuming that the light extraction is not limited to once or twice and is repeated infinitely and the relationship thereof forms a geometric progression, where the light extraction efficiency in the first-time light extraction is η1 and the light extraction efficiency in the second-time light extraction is τ×η2, the light extraction efficiency in the n'th-time light extraction is expected to be $\eta_1 \times (\tau \times \eta_2/\eta_1)^{n-1}$. Accordingly, the total light extraction efficiency in the first through n'th-time light extraction is:

$$\eta_1 \times \sum_{k=1}^{n} \left(\tau \times \frac{\eta_2}{\eta_1}\right)^{k-1} \quad \text{(expression 6)}$$

The light extraction efficiency in an infinite-numbered time light extraction is asymptotic to $\eta_1/(1-\tau \times \eta_2/\eta_1)$.

Figure 26:
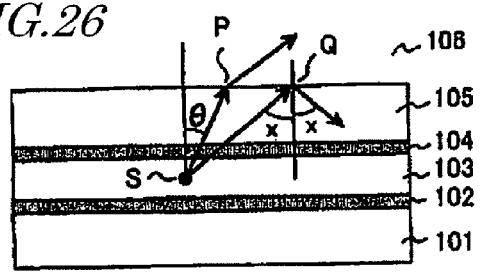
FIG. 26 shows a cross-sectional structure of an organic electroluminescence element, and how light propagates.
Figure 27:
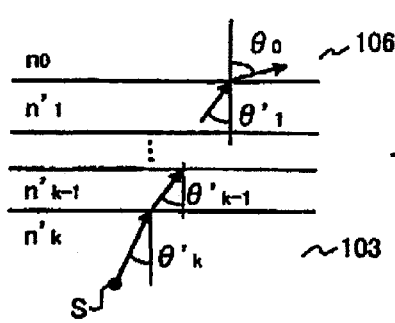
FIG. 27 (a) shows a transparent substrate having a multi-layer structure; and (b) shows a range of light which can be extracted.
Figure 27:
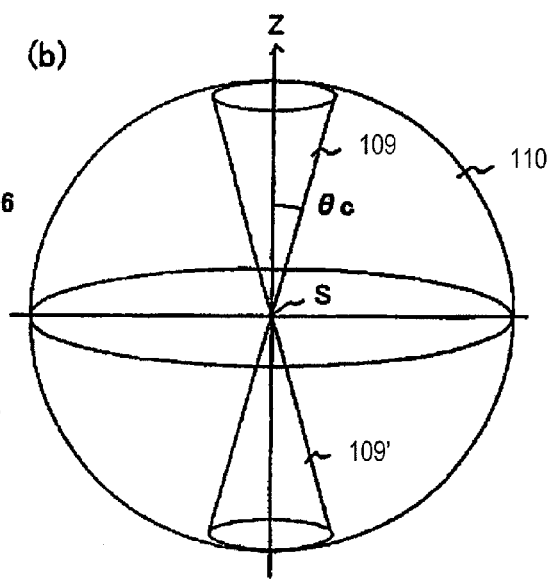

In FIG. 5(c), curves 5b and 5B (d=0.7 µm) indicate that when w=0.6 µm, η1=0.344 and η2=0.124. Where τ=0.88, the light extraction efficiency is 0.504. When w=1.0 µm, η1=0.322 and η2=0.140. The light extraction efficiency is 0.522. In the case of the conventional light emitting device shown in FIG. 26 and FIG. 28(a), η1=0.274 and η2=0. The light extraction efficiency is zero in the second-time and all the subsequent light extractions. Thus, the total light extraction efficiency is 0.274. Accordingly, it is understood that the light extraction efficiency which can be realized by the light emitting device in this embodiment is 1.84 times the light extraction efficiency realized by the light emitting device shown in FIG. 28(a) under the condition of w=0.6 µm, and is 1.91 times under the condition of w=1.0 µm.

Based on expression 6, as the light transmittance τ while the light is reciprocated between the transparent substrate 5 and the electrode 2 is larger, the light extraction efficiency is increased. In actuality, the light emitting layer 3 is surrounded by a plurality of transparent layers and the like in addition to the electrode 2 and the transparent electrode 4. The design of such layers (determination on the refractive index and thickness of the layers including the light emitting layer 3) should be made such that the light transmittance τ is maximum. At this point, the phase shift of the reflection by the surface configuration 13 is randomly distributed. Therefore, superposition of the reflected light is handled incoherently (as intensity addition, not as amplitude addition). Namely, the influence of the reflection by the surface of the transparent substrate 5 is negligible, and so the light can be virtually handled as having a reflectance of 0% and a transmittance of 100%. The refractive index and thickness of each layer are determined with the preconditions that, when light is output from the transparent substrate 5 in the above-mentioned conditions, reciprocated in a multiplex manner between a plurality of layers including the light emitting layers 3 and returns to the transparent substrate 5, the superposition amount of the complex light amplitude is maximized.

When the refractive index n1 of the transparent substrate 5 is smaller than a refractive index n2 of the light emitting layer 3, total reflection occurs even at a refractive index border face between the transparent substrate 5 and the light emitting layer 3. In addition, by the refraction at this border face, energy of the refracted light is transferred toward the surface normal direction. Therefore, when this light is incident on the surface configuration 13 as it is, the advantage of the surface configuration 13, which is effective for light transmission on the side on which the incidence angle is larger, is spoiled. For example, in an organic EL element, a transparent adjusting layer is occasionally provided on the transparent electrode 4 in order to adjust the light transmittance while the light is reciprocated between the transparent substrate 5 and the electrode 2. In this case, the transparent substrate 5 is provided on the adjusting layer (namely, the organic EL element including the adjusting layer can be referred to as the "light emitting body"). However, when the refractive index n1 of the transparent substrate 5 is smaller than a refractive index n1' of the adjusting layer, there is a border face, at which total reflection occurs, between the transparent substrate 5 and the adjusting layer. Especially when n1'−n1>0.1, the influence thereof is non-negligible. FIG. 1(b) shows how the light propagates in such a case.

In FIG. 1(b), the light emitted at a point S in the light emitting layer 3 having a refractive index n2 is transmitted through the transparent electrode 4 directly or after being reflected by the electrode 2, and is transmitted through an adjusting layer 15 having a refractive index n1'. The light is refracted at the point P' on a border face 15a, is transmitted through the transparent substrate 5 having a refractive index n1, and is output to the air layer 6 via the point P on the border face between the transparent substrate 5 and the air 6. Here, n1'≧n2>n1>0.1. n1' may be smaller than n2, but in this case, total reflection occurs also between the transparent electrode 4 and the adjusting layer 15. At the border face between the transparent substrate 5 and the air 6, the surface configuration 13 in this embodiment is formed. Therefore, even light incident at an angle exceeding the critical angle can be extracted to the air layer 6. However, since n1'>n1, total reflection occurs also at the border face 15a. Namely, light incident on a point Q', for which the incidence angle is larger than the incidence angle for the incidence on the point P', is totally reflected. This light is totally reflected in repetition between the electrode 2 and the surface configuration 13, and cannot be extracted to the air 6. In addition, the light transmitted through the border face 15a is refracted and as a result, energy of such light is transferred toward the surface normal direction. Therefore, the light extraction efficiency from the surface configuration 13 is decreased.

In this case, as shown in FIG. 1(c), a surface configuration 13' in this embodiment is provided also at a border face between the adjusting layer 15 and the transparent substrate 5. Owing to this, the light incident on the border face at an angle exceeding the critical angle can be extracted to the air 6. Namely, owing to the surface configuration 13', even when light is incident on the point Q', for which the incidence angle exceeds the critical angle, total reflection does not occur, and the light is partially transmitted. The component reflected by the border face is reflected by the electrode 2, and is again incident on a point R' on the surface configuration 13'. A part thereof can be output to the air 6 via the surface configuration 13. This process is repeated infinitely. In addition, the light transmitted through the surface configuration 13' is diffracted and as a result, energy of such light is expanded in all the orientations. Therefore, the light extraction efficiency from the surface configuration 13 can be kept high. Since the diffraction orientation loses regularity because of the light extraction from the surface configuration 13, the surface configuration 13' may be of a regular pattern such as a houndstooth check pattern, a checkered pattern or the like. The structure shown in FIG. 1(c) is complicated in that double surface configurations 13 and 13' having a concaved and convexed pattern need to be formed, but allows use of a material having a low refractive index for the transparent substrate 5 and thus has an advantage that the material can be chosen from a wide range.

(Embodiment 2)

Figure 6:
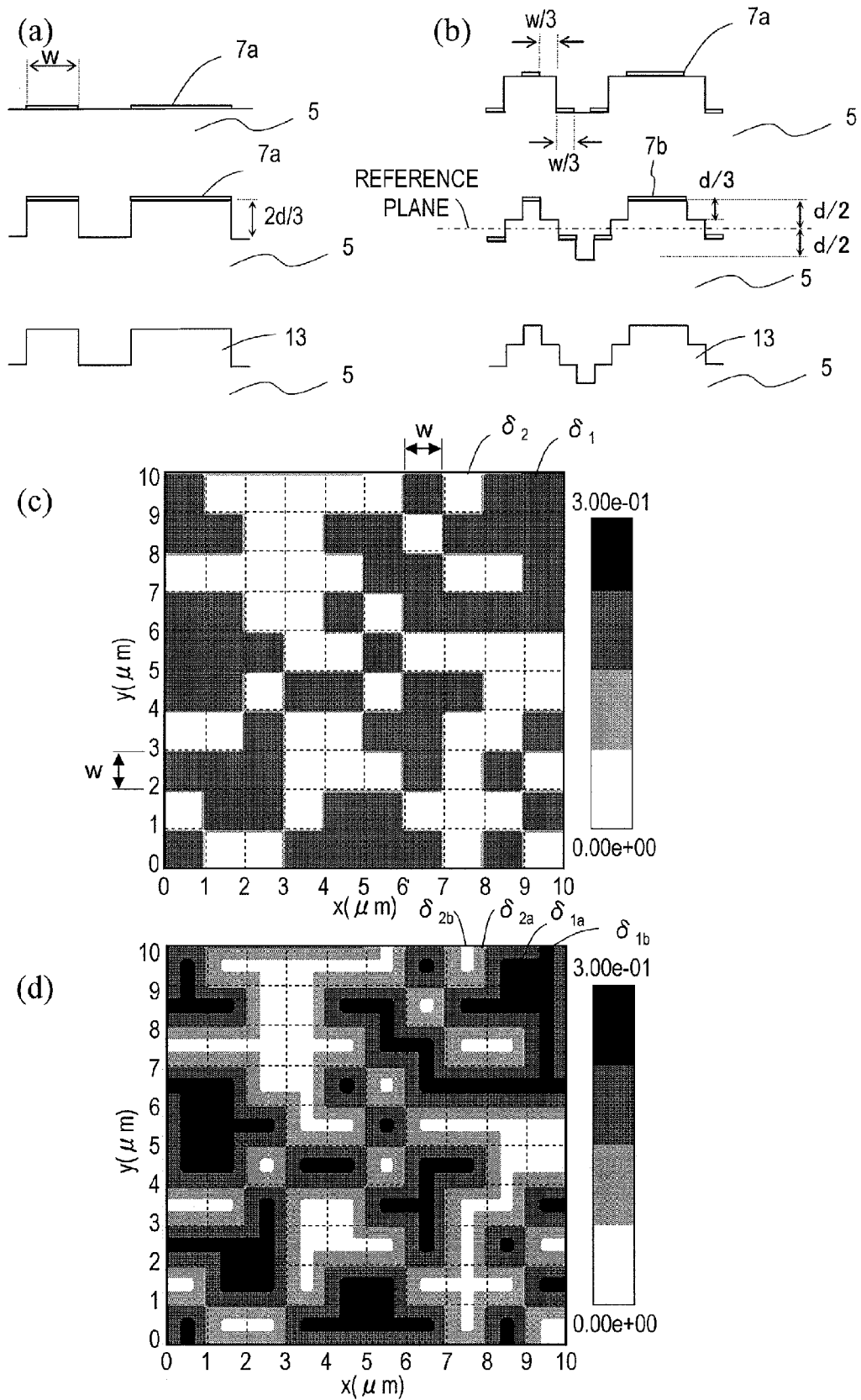
FIG. 6 (a) is a cross-sectional view showing a first process for forming a surface configuration in Embodiment 2; (b) is a cross-sectional view showing a second process for forming the surface configuration; (c) shows a pattern of the surface configuration formed by the first process; and (d) shows a final pattern of the surface configuration formed by the second process.
Figure 7A:
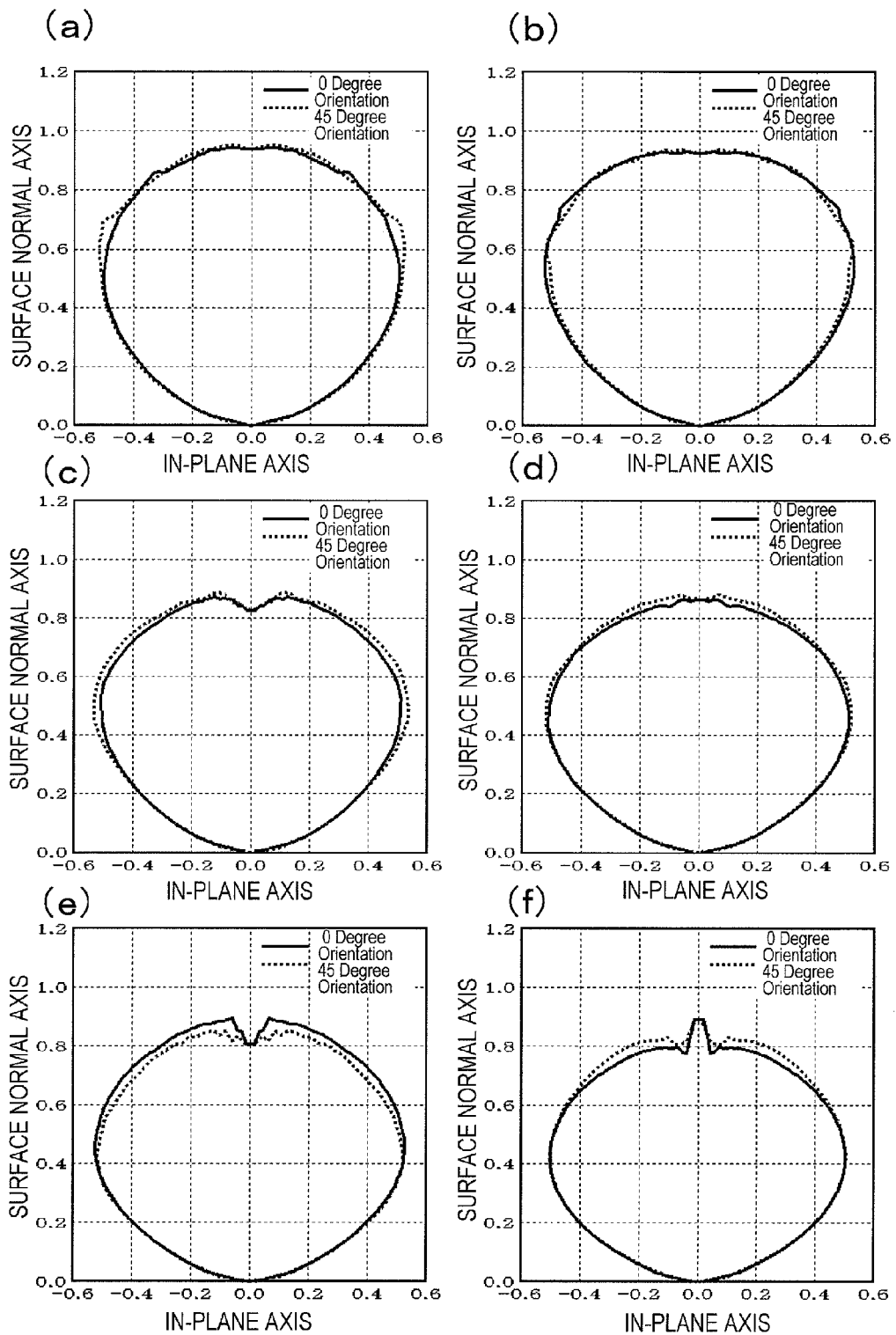
FIG. 7A (a) through (f) show the viewing angle dependence of light output from the surface configuration in Embodiment 2.
Figure 7B:
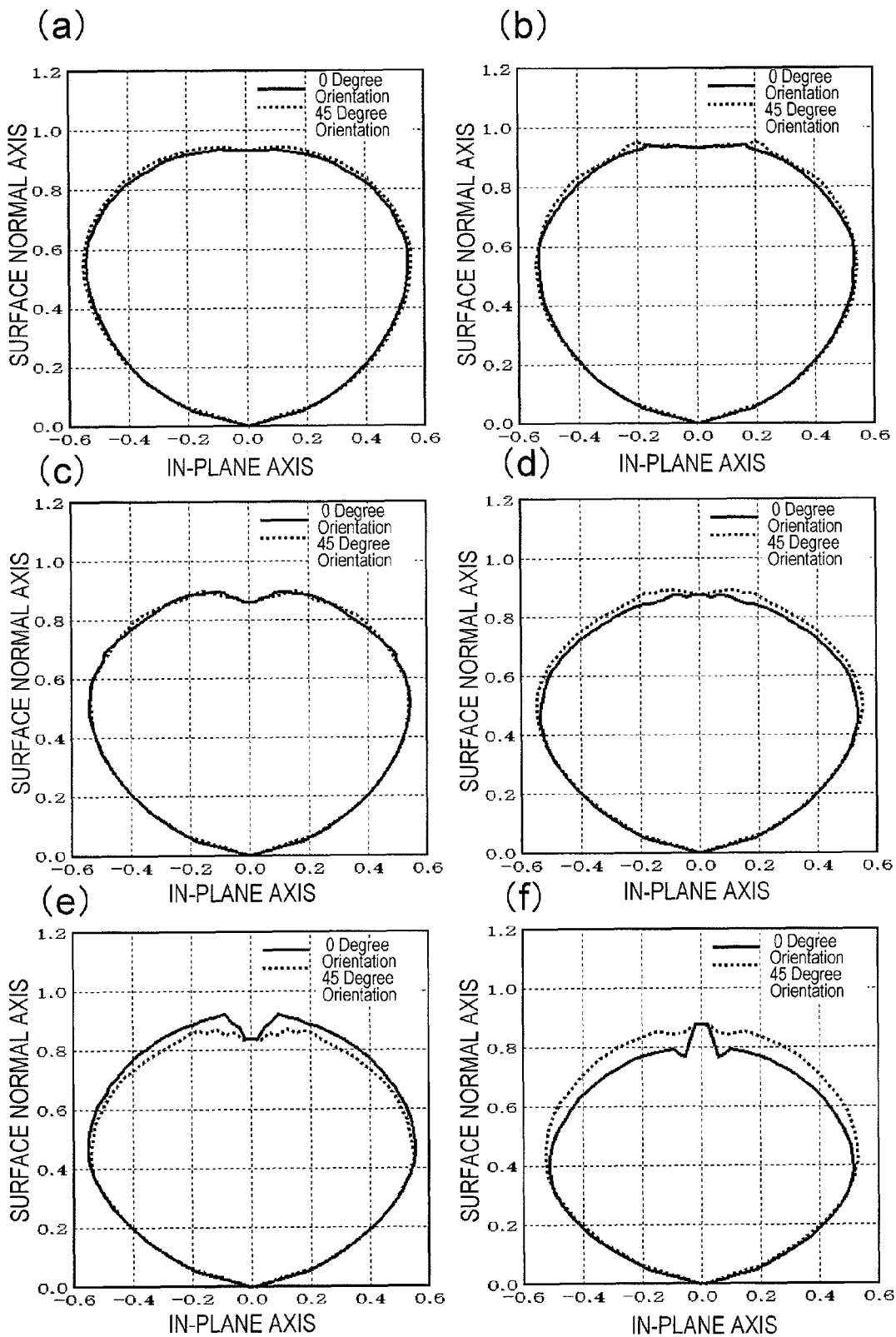
FIG. 7B (a) through (f) show the viewing angle dependence of light output from the surface configuration in Embodiment 2.
Figure 8:
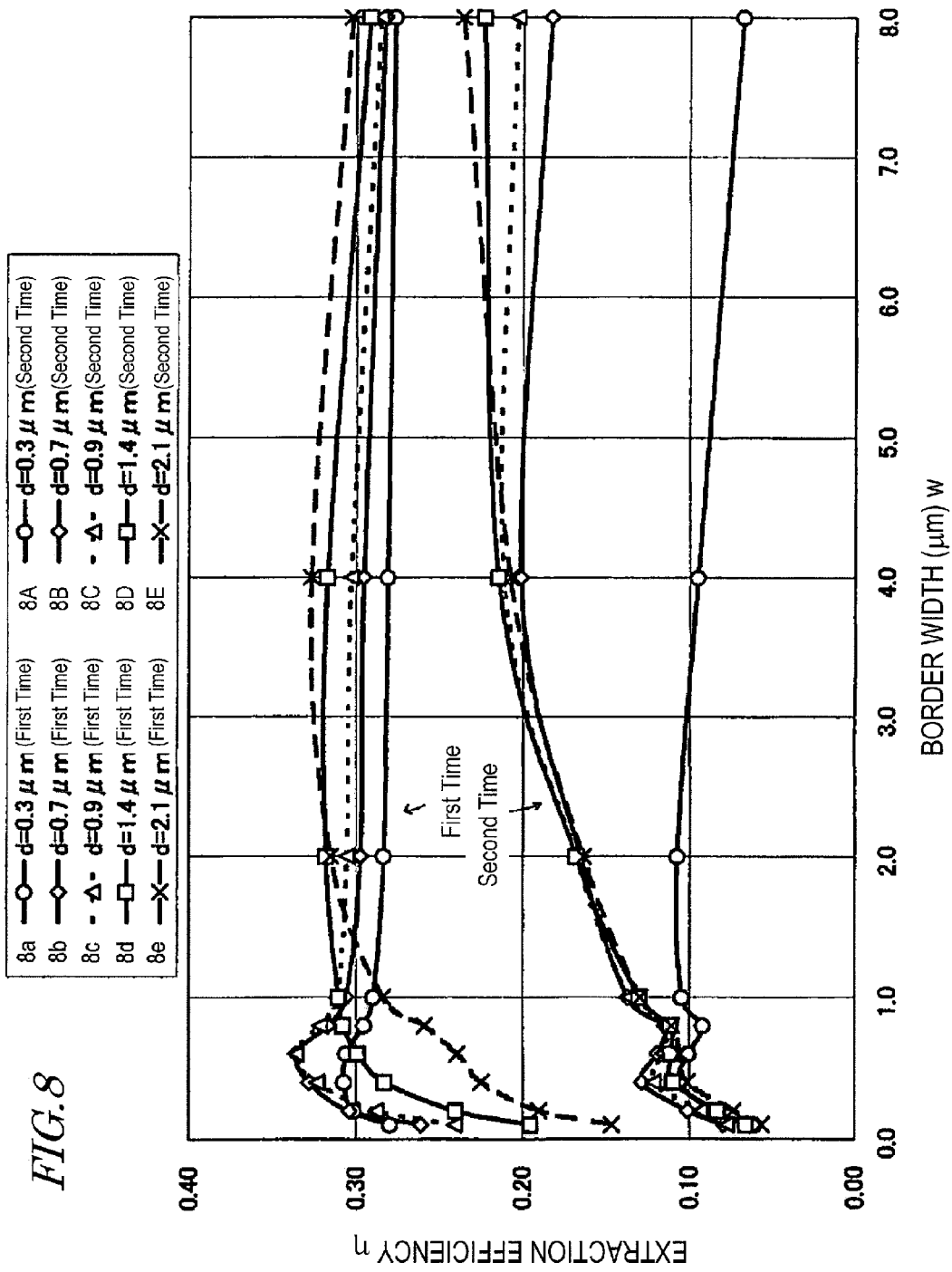
FIG. 8 shows the light extraction efficiency realized by the surface configuration in Embodiment 2.

With reference to FIGS. 6 through 8, Embodiment 2 will be described. Embodiment 2 is different from Embodiment 1 only in the pattern of the surface configuration 13 and is the same as Embodiment 1 in all the other elements. The common elements as those of Embodiment 1 will not be described.

FIG. 6 shows a formation procedure, cross-sectional views, and patterns of the surface configuration 13 in Embodiment 2. The surface configuration 13 is formed in two processes. FIG. 6(a) shows a first process, and FIG. 6(b) shows a second process. In FIG. 6(a), a photoresist formed on the transparent substrate 5 is exposed by a technique of reduction exposure or the like using a first mask, and the exposed parts are removed to form a resist pattern 7a (development). The transparent substrate 5 is etched by a depth of 2d/3, and the resist is removed. FIG. 6(c) shows a pattern formed by the first process. On this stage, the surface configuration 13 is a result of the following: the surface of the transparent substrate 5 is divided into checkerboard squares (tiny square areas δ) each having the width w (referred to as the "border width") with no gap, and convexed portions and portions relatively concaved to the convexed portions are randomly assigned while probability P of each square being a convexed portion (tiny area $\delta_1$, gray square) is 50% and probability 1−P of each square being a concaved portion (tiny area $\delta_2$, white square) is 50% (probability P may be any other value than 50%). FIG. 6(c) shows an example in which w=1.0 µm. Namely, one tiny area δ is adjacent to, and surrounded by, others of the plurality of tiny areas δ. Tiny areas $\delta_1$ protrude upward from tiny areas $\delta_2$ toward the surface of the transparent substrate 5 by 2d/3. The tiny areas δ are square in this embodiment, but may be of another shape as long as the diameter of the maximum circle among the circles inscribed to the tiny areas δ is 0.2 µm or greater and 3 µm or less.

In FIG. 6(b), a photoresist is again applied on the transparent substrate 5 and is exposed by a technique of reduction exposure or the like using a second mask, and the exposed parts are removed to form a resist pattern 7b (development). The transparent substrate 5 is etched by a depth of d/3, and the resist is removed. The exposed parts (resist-removed parts) in this process each include two areas along the border between the tiny area $\delta_1$ and the tiny area $\delta_2$. Areas each having a width of w/3 and extending on the side of the tiny area $\delta_1$ from the border between the tiny area $\delta_1$ and the tiny area $\delta_2$, and areas each having a width of w/3 and extending on the side of the tiny area $\delta_2$ from the border between the tiny area $\delta_1$ and the tiny area $\delta_2$, are exposed.

FIG. 6(d) shows a final pattern formed by the second process. Each tiny area $\delta_1$ is divided into two, i.e., into an area $\delta_{1a}$ (dark gray area) which is in contact with the corresponding tiny area $\delta_2$ and having a width of w/3, and the remaining tiny area $\delta_{1b}$ (black area). Each tiny area $\delta_2$ is divided into two, i.e., into an area $\delta_{2a}$ (light gray area) which is in contact with the corresponding tiny area $\delta_1$ and having a width of w/3, and the remaining tiny area $\delta_{2b}$ (white area). Here, a reference plane parallel to the surface of the transparent substrate 5 is set at an intermediate position in a direction vertical to the surface of the transparent substrate 5. From the reference plane, each tiny area $\delta_{1b}$ protrudes upward by d/2, each tiny area $\delta_{1a}$ protrudes upward by d/6, each tiny area $\delta_{2b}$ is recessed downward by d/2, and each tiny area $\delta_{2a}$ is recessed downward by d/6. The first process and the second process may be performed in this order or in the opposite order. The ratio of the etching depth between the first process and the second process is 2:1, but may be another ratio. Any ratio is usable as long as the etching results in the state where from the reference plane, each tiny area $\delta_{1b}$ protrudes upward by d/2, each tiny area $\delta_{1a}$ protrudes upward by a value of 0 to d/2, each tiny area $\delta_{2b}$ is recessed downward by d/2, and each tiny area $\delta_{2a}$ is recessed downward by a value of 0 to d/2. Instead of the second mask, an inverted mask thereof (mask in which the light shielding portions and the light transmitting portions are exchanged with each other) may be used. In this case, the final pattern formed by the second process is the same as in FIG. 6(d), but from the reference plane, each tiny area $\delta_{1a}$ protrudes upward by d/2, each tiny area $\delta_{1b}$ protrudes upward by d/6, each tiny area $\delta_{2a}$ is recessed downward by d/2, and each tiny area $\delta_{2b}$ is recessed downward by d/6.

FIGS. 7A and 7B show analysis results of the viewing angle dependence of the light extracted from the surface configuration in the first-time light extraction in Embodiment 2. The step d=0.6 µm, and the wavelength λ and the border width w are parameters. FIGS. 7A(a) through (f) show the results in the case where λ=0.450 µm. FIGS. 7B(a) through (f) show the results in the case where λ=0.635 µm. In each of FIGS. 7A and 7B, (a) shows the results in the case where w=0.5 µm, (b) shows the results in the case where w=1.0 µm, (c) shows the results in the case where w=1.5 µm, (d) shows the results in the case where w=2.0 µm, (e) shows the results in the case where w=3.0 µm, and (f) shows the results in the case where w=4.0 µm.

When the border width w=0.5 to 2.0 µm, the solid line and the dotted line both exhibit a slow intensity fluctuation with respect to the angle of deviation (latitude) (i.e., small intensity difference caused by the parallax). When w is increased to 3.0 µm or 4.0 µm, the intensity fluctuation with respect to the angle of deviation becomes large in the vicinity of the direction of the surface normal. Accordingly, it is understood that the viewing angle dependence showing a slow intensity fluctuation with respect to the angle of deviation is obtained under the condition that the border width w=3.0 µm or less.

FIG. 8 shows the light extraction efficiency from the surface configuration 13 in Embodiment 2. FIG. 8, in which the horizontal axis represents the border width w of the surface configuration 13, shows the light extraction efficiency obtained under the same conditions as those of FIG. 5(c). FIG. 8 shows the light extraction efficiency (efficiency η1 in the first-time light extraction) when the step of the surface configuration 13 is d=0.3, 0.9, 1.4 and 2.1 µm in addition to when d=0.7 µm, and also the light extraction efficiency in the case where the light is reflected by the surface configuration 13, reflected by the electrode 2 and again incident on the surface configuration (efficiency η2 in the second-time light extraction) with an assumption that no light is attenuated while reciprocating between the surface configuration 13 and the electrode 2, namely, that no light is absorbed by the transparent electrode 4 or there is no reflection loss of light by the electrode 2. Curve 8a and curve 8A respectively represent the light extraction efficiency in the first-time light extraction and the second-time light extraction when d=0.3 µm. Curve 8b and curve 8B respectively represent the light extraction efficiency in the first-time light extraction and the second-time light extraction when d=0.7 µm. Curve 8c and curve 8C respectively represent the light extraction efficiency in the first-time light extraction and the second-time light extraction when d=0.9 µm. Curve 8d and curve 8D respectively represent the light extraction efficiency in the first-time light extraction and the second-time light extraction when d=1.4 µm. Curve 8e and curve 8E respectively represent the light extraction efficiency in the first-time light extraction and the second-time light extraction when d=2.1 µm. All the curves significantly drop when the border width w is 0.2 µm or less. Therefore, the lower limit of the border width w can be considered to be about 0.2 µm. In a range in which the viewing angle dependence is small (w=3.0 µm or less), curves 8a and 8A exhibit a lower light extraction efficiency than the light extraction efficiency at the other depths, and so the deterioration is considered to start when the step d=0.3 µm. Therefore, the lower limit of d can be considered to be about 0.2 µm. As d is increased, the light extraction efficiency in the first-time light extraction is decreased in an area where w is small, and the maximum point thereof is shifted to the side on which w is larger. Up to d=2.1 µm, the light extraction efficiency is kept high in the vicinity of w=3.0 µm. When d is larger, the light extraction efficiency is decreased in the entire area in which w=0.5 to 3.0 µm. Therefore, the upper limit of d can be considered to be about 3 µm. Accordingly, a recommended range of depth d is 0.2 to 3 µm. Such a recommended range of depth d, which is represented using the refractive index n1 of the transparent substrate 5, the refractive index n0 of the air 6 and the wavelength λ of the center of the light spectrum like in Embodiment 1, is $2\lambda/(n1-n0) \geqq d \geqq \lambda/6(n1-n0)$.

At all the depths fulfilling d≦0.9 µm, the light extraction efficiency in the first-time light extraction is maximum when the border width w=0.2 to 1 µm. When w is decreased or increased, the light extraction efficiency becomes asymptotic to 0.27 (value given by expression 3, the light extraction efficiency in the case where the surface is a mirror surface). The light extraction efficiency in the second-time light extraction is maximum when w=1.0 µm to 8.0 µm at all the depths fulfilling d≦0.9 µm. When w is increased, the light extraction efficiency becomes asymptotic to 0.0 (not appear in the range shown in FIG. 8). When w≦0.4 µm, the light extraction efficiency is converged to 0.0 as w is decreased.

In FIG. 8, curves 8b and 8B (d=0.7 µm) indicate that when w=0.6 µm, η1=0.335 and η2=0.119. Where τ=0.88, the light extraction efficiency is 0.487. When w=1.0 µm, η1=0.306 and η2=0.130. The light extraction efficiency is 0.489. In the case of the conventional light emitting device shown in FIG. 26 and FIG. 28(a), η1=0.274 and η2=0. The light extraction efficiency is zero in the second-time and all the subsequent light extractions. Thus, the total light extraction efficiency is 0.274. Accordingly, it is understood that the light extraction efficiency which can be realized by the light emitting device in this embodiment is 1.78 times the light extraction efficiency realized by the light emitting device shown in FIG. 28(a) under the condition of w=0.6 µm, and is 1.78 times under the condition of w=1.0 µm.

As can be seen from the cross-sectional view in FIG. 6(b), the tiny areas $\delta_{1a}$ and $\delta_{2a}$ can be regarded as being provided by forming the slope from the tiny area $\delta_{1b}$ to the tiny area $\delta_{2b}$ into steps. It is easily analogized that substantially the same effects are provided by further dividing the steps from the tiny area $\delta_{1b}$ to the tiny area $\delta_{2b}$. Ultimately, these steps may be formed into a slope. Namely, substantially the same effects are provided even where the tiny areas $\delta_{1b}$ and $\delta_{2b}$ are slopes. (Embodiment 3)

Figure 9:
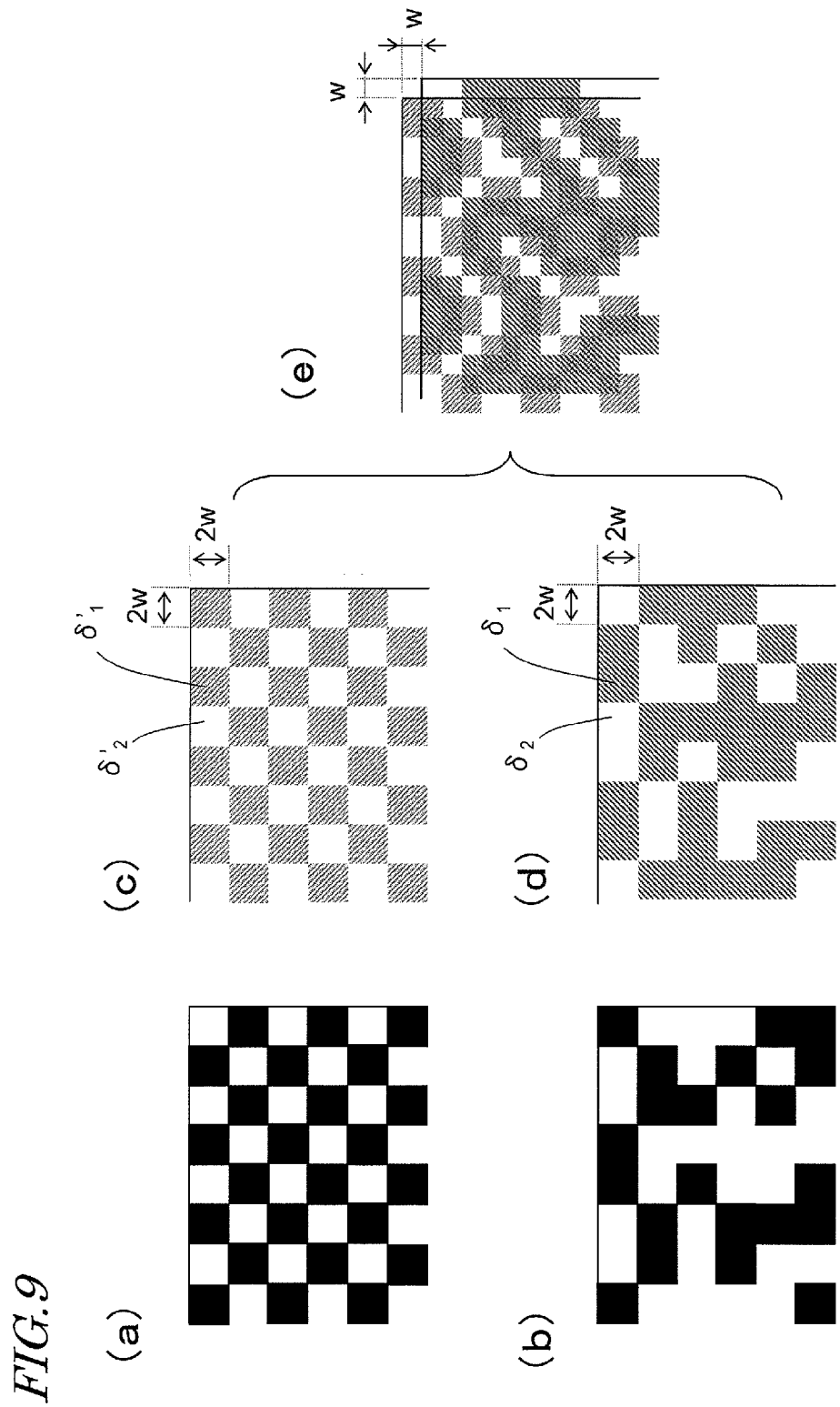
FIG. 9 (a) and (c) provide patterns showing a first process for forming a surface configuration in Embodiment 3; (b) and (d) provide patterns showing a second process for forming the surface configuration in Embodiment 3; (e) shows a final pattern of the surface configuration formed by the first and second processes.
Figure 10A:
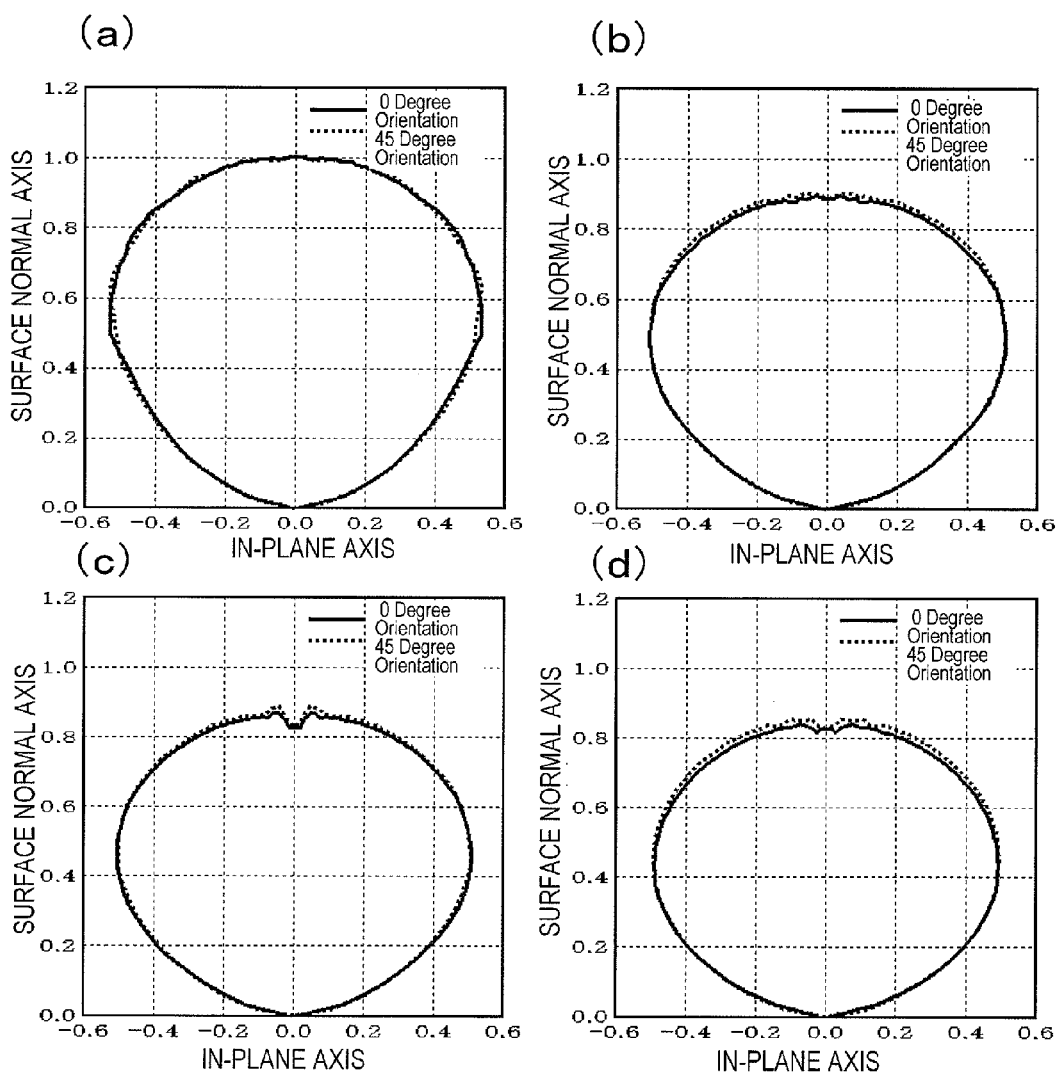
FIG. 10A (a) through (d) show the viewing angle dependence of light output from the surface configuration in Embodiment 3.
Figure 10B:
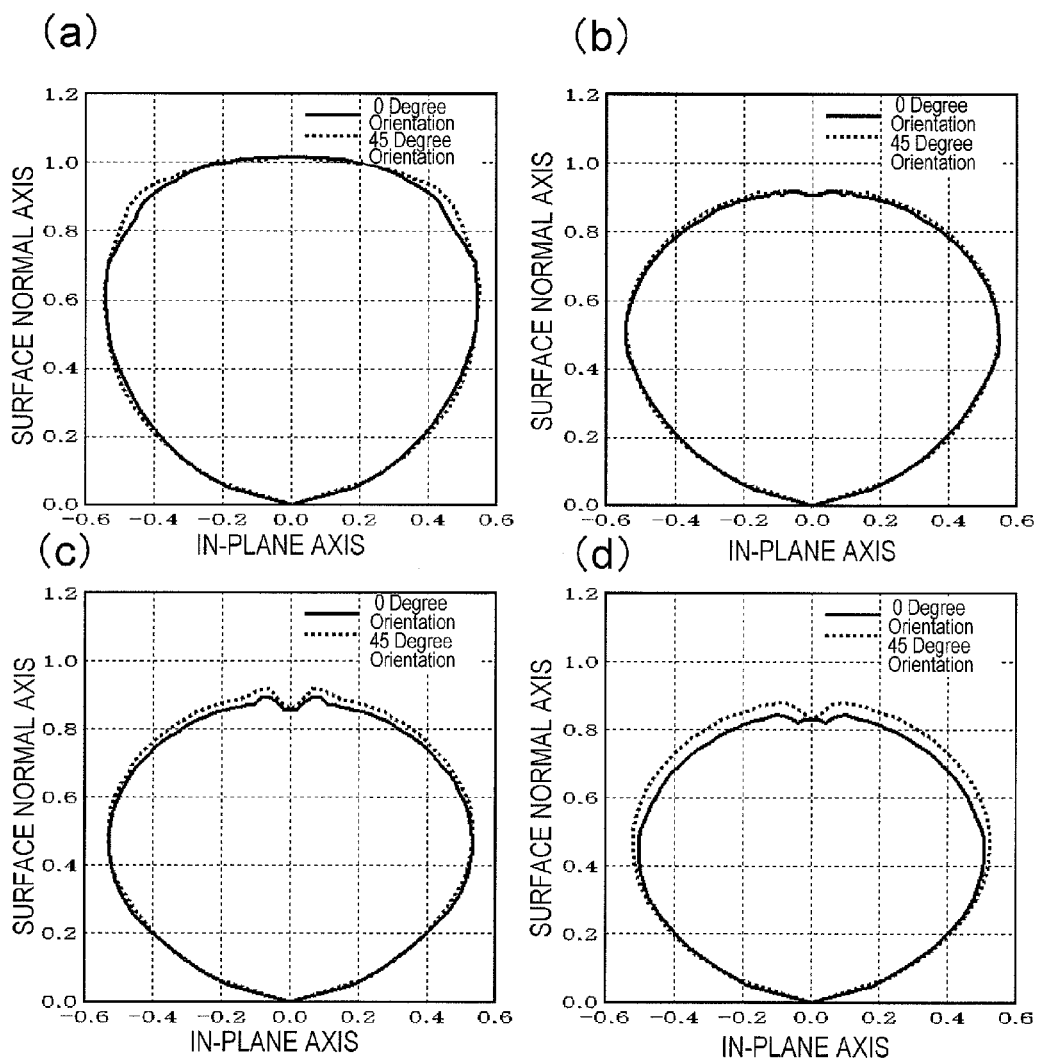
FIG. 10B (a) through (d) show the viewing angle dependence of light output from the surface configuration in Embodiment 3.
Figure 11:
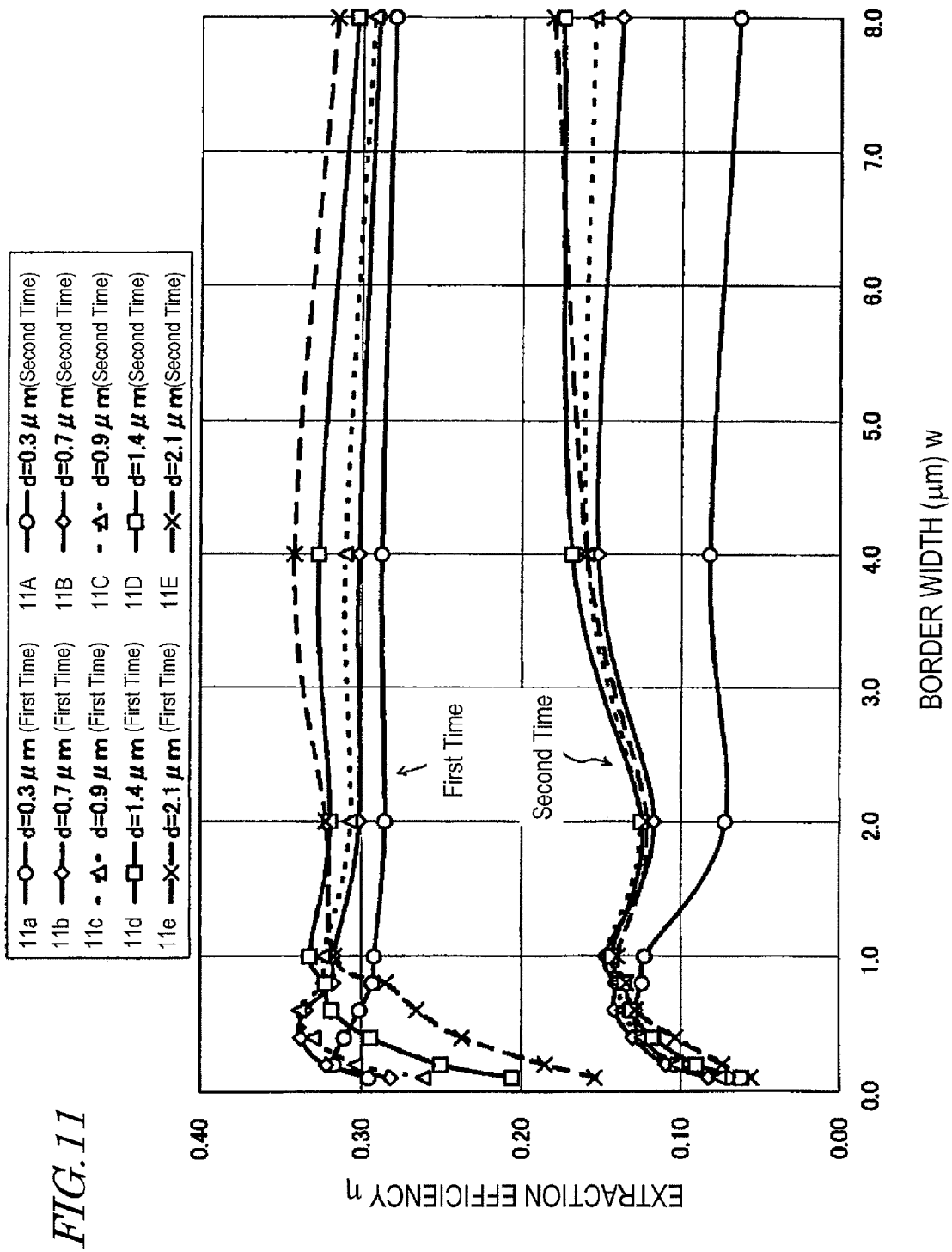
FIG. 11 shows the light extraction efficiency realized by the surface configuration in Embodiment 3.

With reference to FIGS. 9 through 11, Embodiment 3 will be described. Embodiment 3 is different from Embodiment 1 only in the pattern of the surface configuration 13 and is the same as Embodiment 1 in all the other elements. The common elements as those of Embodiment 1 will not be described.

FIG. 9 shows a formation procedure and patterns of the surface configuration 13 in Embodiment 3. The surface configuration 13 is formed in two processes. FIGS. 9(a) and (c) show a first process, and FIGS. 9(b) and (d) show a second process.

In the first process, a photoresist formed on the transparent substrate 5 is exposed by a technique of reduction exposure or the like using a mask shown in FIG. 9(a), and the exposed parts are removed to form a resist pattern (development). The transparent substrate 5 is etched by a depth of d/3, and the resist is removed. FIG. 9(c) shows a pattern formed by the first process. On this stage, the surface configuration 13 is a result of the following: the surface of the transparent substrate 5 is divided into checkerboard squares (tiny square areas δ') each having a width of 2w (w will be referred to as the "border width") with no gap, and convexed portions (tiny areas $\delta'_1$; stripes from the upper left corner to the lower right corner) and portions relatively concaved to the convexed portions (tiny areas $\delta'_2$; white square) are assigned in a checkerboard pattern. Namely, tiny areas $\delta'_1$ protrude upward from tiny areas $\delta'_2$ toward the surface of the transparent substrate 5 by d/3. The tiny areas δ' are square in this embodiment, but may be of another shape as long as the diameter of the maximum circle among the circles inscribed to the tiny areas δ' is 0.2 µm or greater and 3 µm or less.

In the second process, a photoresist formed on the transparent substrate 5 is exposed by a technique of reduction exposure or the like using a mask shown in FIG. 9(b), and the exposed parts are removed to form a resist pattern (development). The transparent substrate 5 is etched by a depth of 2d/3, and the resist is removed. FIG. 9(d) shows a pattern formed by the second process. The surface configuration 13 is a result of the following: the surface of the transparent substrate 5 is divided into checkerboard squares (tiny square areas δ) each having a width of 2w (w will be referred to as the "border width") with no gap, and convexed portions and portions relatively concaved to the convexed portions are randomly assigned while probability P of each square being a convexed portion (tiny area $\delta_1$, stripes from the upper right corner to the lower left corner) is 50% and probability 1−P of each square being a concaved portion (tiny area $\delta_2$, white square) is 50% (probability P may be any other value than 50%). Namely, one tiny area δ is adjacent to, and surrounded by, others of the plurality of tiny areas δ. The tiny areas $\delta_1$ protrude upward from the tiny areas $\delta_2$ toward the surface of the transparent substrate 5 by 2d/3.

In actuality, as shown in FIG. 9(e), the first process and the second process are performed in this order or in the opposite order with the two patterns being shifted by w in both of longitudinal and lateral directions (the shifting amount does not need to be w). Accordingly, the surface of the transparent substrate 5 is divided into the tiny areas δ' (the tiny areas $\delta'_1$ and $\delta'_2$) by the first process, and is divided into the tiny areas δ (the tiny areas $\delta_1$ and $\delta_2$) by the second process, such that the tiny areas δ are independent from, and overlap, the tiny areas δ' obtained by the first process.

A reference plane parallel to the surface of the transparent substrate 5 is set at an intermediate position in a direction vertical to the surface of the transparent substrate 5. From the reference plane, each area in which the tiny areas $\delta_1$ and $\delta'_1$ overlap each other protrudes upward by d/2, each area in which the tiny areas $\delta_1$ and $\delta'_2$ overlap each other protrudes upward by d/6, each area in which the tiny areas $\delta_2$ and $\delta'_2$ overlap each other is recessed downward by d/2, and each area in which the tiny areas $\delta_2$ and $\delta'_1$ overlap each other is recessed downward by d/6. The ratio of the etching depth between the first process and the second process is 1:2, but may be another ratio. Any ratio is usable as long as the etching results in the state where from the reference plane, each area in which the tiny areas $\delta_1$ and $\delta'_1$ overlap each other protrudes upward by d/2, each area in which the tiny areas $\delta_1$ and $\delta'_2$ overlap each other protrudes upward by a value of 0 to d/2, each area in which the tiny areas $\delta_2$ and $\delta'_2$ overlap each other is recessed downward by d/2, and each area in which the tiny areas $\delta_2$ and $\delta'_1$ overlap each other is recessed downward by a value of 0 to d/2.

Owing to this, at least a part of the plurality of tiny areas $\delta_1$ and $\delta_2$ overlaps at least a part of the plurality of tiny areas $\delta'_1$ and $\delta'_2$. The shifting width w does not match the width 2w of each of the tiny areas $\delta_1$, $\delta_2$, $\delta'_1$ and $\delta'_2$. Therefore, the borders between the tiny areas may cross each other but do not overlap each other.

FIGS. 10A and 10B show analysis results of the viewing angle dependence of the light extracted from the surface configuration in the first-time light extraction in Embodiment 3. The step d=0.6 µm, and the wavelength λ and the border width w are parameters. FIGS. 10A(a) through (d) show the results in the case where λ=0.450 µm. FIGS. 10B(a) through (d) show the results in the case where λ=0.635 µm. In each of FIGS. 10A and 10B, (a) shows the results in the case where w=0.5 µm, (b) shows the results in the case where w=1.0 µm, (c) shows the results in the case where w=1.5 µm, and (d) shows the results in the case where w=2.0 µm. When the border width w=0.5 µm or 1.0 µm, the solid line and the dotted line both exhibit a slow intensity fluctuation with respect to the angle of deviation (i.e., small intensity difference caused by the parallax). When w is increased to 1.5 µm or 2.0 µm, the intensity fluctuation with respect to the angle of deviation becomes large in the vicinity of the direction of the surface normal. Accordingly, it is understood that the viewing angle dependence showing a slow intensity fluctuation with respect to the angle of deviation (latitude) is obtained under the condition that the border width w=1.5 µm or less.

FIG. 11 shows the light extraction efficiency from the surface configuration 13 in Embodiment 3. FIG. 11, in which the horizontal axis represents the border width w of the surface configuration 13, shows the light extraction efficiency obtained under the same conditions as those of FIG. 5(c). FIG. 11 shows the light extraction efficiency (efficiency η1 in the first-time light extraction) when the step of the surface configuration 13 is d=0.3, 0.9, 1.4 and 2.1 µm in addition to when d=0.7 µm, and also the light extraction efficiency in the case where the light is reflected by the surface configuration 13, reflected by the electrode 2 and again incident on the surface configuration (efficiency η2 in the second-time light extraction) with an assumption that no light is attenuated while reciprocating between the surface configuration 13 and the electrode 2, namely, that no light is absorbed by the transparent electrode 4 or there is no reflection loss of light by the electrode 2. Curve 11a and curve 11A respectively represent the light extraction efficiency in the first-time light extraction and the second-time light extraction when d=0.3 µm. Curve 11b and curve 11B respectively represent the light extraction efficiency in the first-time light extraction and the second-time light extraction when d=0.7 µm. Curve 11c and curve 11C respectively represent the light extraction efficiency in the first-time light extraction and the second-time light extraction when d=0.9 µm. Curve 11d and curve 11D respectively represent the light extraction efficiency in the first-time light extraction and the second-time light extraction when d=1.4 µm. Curve 11e and curve 11E respectively represent the light extraction efficiency in the first-time light extraction and the second-time light extraction when d=2.1 µm. All the curves significantly drop when the border width w is 0.2 µm or less. Therefore, the lower limit of the border width w can be considered to be about 0.2 µm. In a part of a range limited in terms of the viewing angle dependence (w=1.5 µm or less), curves 11a and 11A exhibit a lower light extraction efficiency than the light extraction efficiency at the other depths, and so the deterioration is considered to start when the step d=0.3 µm. Therefore, the lower limit of d can be considered to be about 0.2 µm. As d is increased, the light extraction efficiency in the first-time light extraction is decreased in an area where w is small, and the maximum point thereof is shifted to the side on which w is larger. Up to d=2.1 µm, the light extraction efficiency is kept high in the vicinity of w=1.5 µm. When d is larger, the light extraction efficiency is decreased in the entire area in which w≦1.5 µm. Therefore, the upper limit of d can be considered to be about 3 µm. Accordingly, a recommended range of depth d is 0.2 to 3 µm. Such a recommended range of depth d, which is represented using the refractive index n1 of the transparent substrate 5, the refractive index n0 of the air 6 and the wavelength λ of the center of the light spectrum like in Embodiment 1, is 2×/(n1−n0)≧d≧λ/6(n1−n0).

At all the depths fulfilling d≦0.9 µm, the light extraction efficiency in the first-time light extraction is maximum when the border width w=0.2 to 1 µm. When w is decreased or increased, the light extraction efficiency becomes asymptotic to 0.27 (value given by expression 3, the light extraction efficiency in the case where the surface is a mirror surface). The light extraction efficiency in the second-time light extraction is maximum when w=0.4 µm to 8.0 µm at all the depths fulfilling d≦0.9 µm. When w is increased, the light extraction efficiency becomes asymptotic to 0.0 (not appear in the range shown in FIG. 11). When w≦0.4 µm, the light extraction efficiency is converged to 0.0 as w is decreased.

In FIG. 11, curves 11b and 11B (d=0.7 µm) indicate that when w=0.6 µm, η1=0.334 and η2=0.142. Where τ=0.88, the light extraction efficiency is 0.534. When w=1.0 µm, η1=0.317 and η2=0.147. The light extraction efficiency is 0.536. In the case of the conventional light emitting device shown in FIG. 26 and FIG. 28(a), η1=0.274 and η2=0. The light extraction efficiency is zero in the second-time and all the subsequent light extractions. Thus, the total light extraction efficiency is 0.274. Accordingly, it is understood that the light extraction efficiency which can be realized by the light emitting device in this embodiment is 1.95 times the light extraction efficiency realized by the light emitting device shown in FIG. 28(a) under the condition of w=0.6 µm, and is 1.96 times under the condition of w=1.0 µm.

In general, the reduction exposure technique can provide an alignment precision (precision of positioning two patterns) which is several times higher than the patterning precision (minimum patternable size). Accordingly, in this embodiment, merely by forming a pattern having the border width 2w, a structure having the border width w can be formed after the two processes. Thus, this embodiment has an advantage of lowering the technological hurdle of formation of a precise pattern.

(Embodiment 4)

Figure 12:
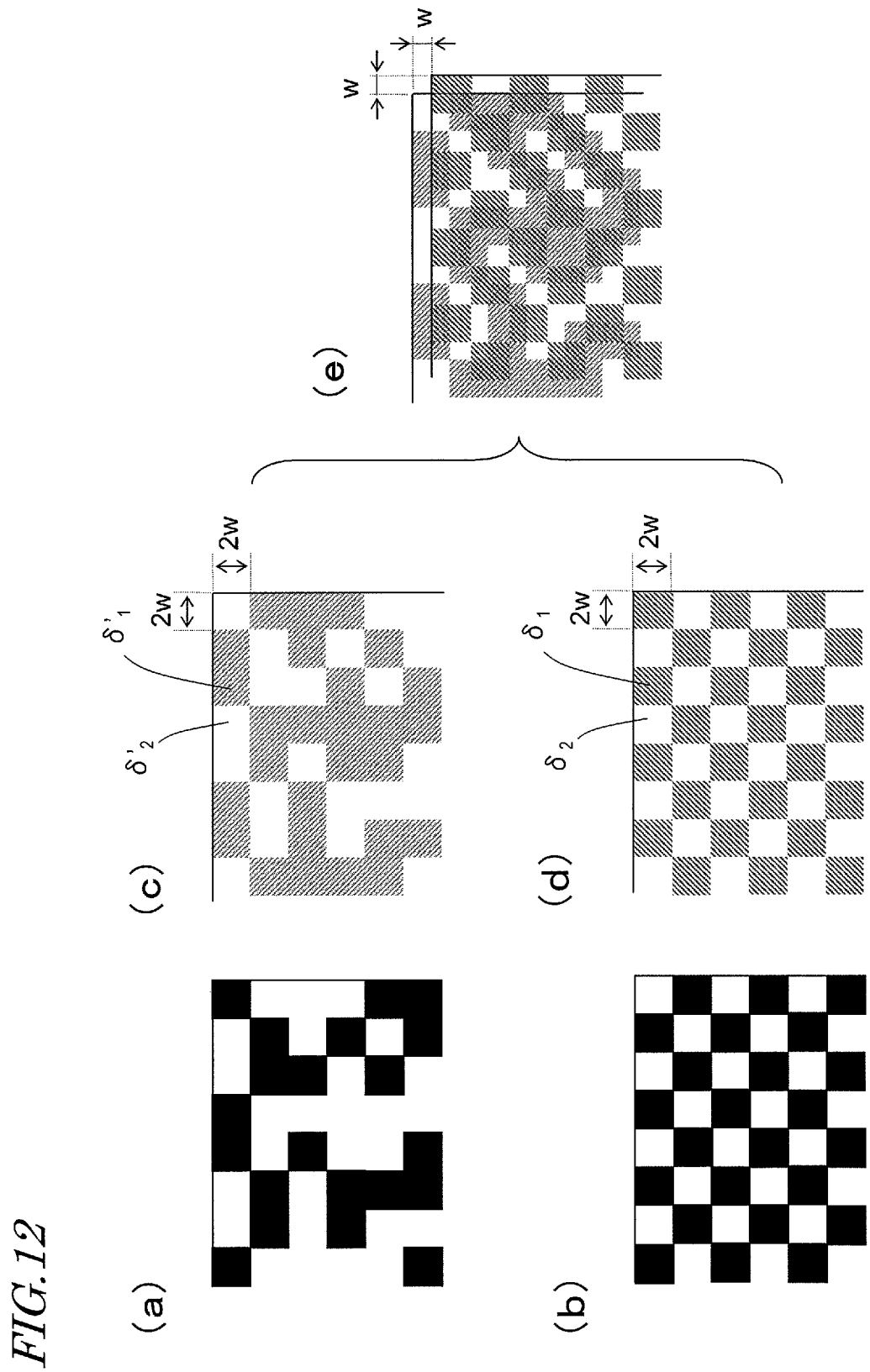
FIGS. 12 (a) and (c) provide patterns showing a first process for forming a surface configuration in Embodiment 4; (b) and (d) provide patterns showing a second process for forming the surface configuration in Embodiment 4; (e) shows a final pattern of the surface configuration formed by the first and second processes.
Figure 13A:
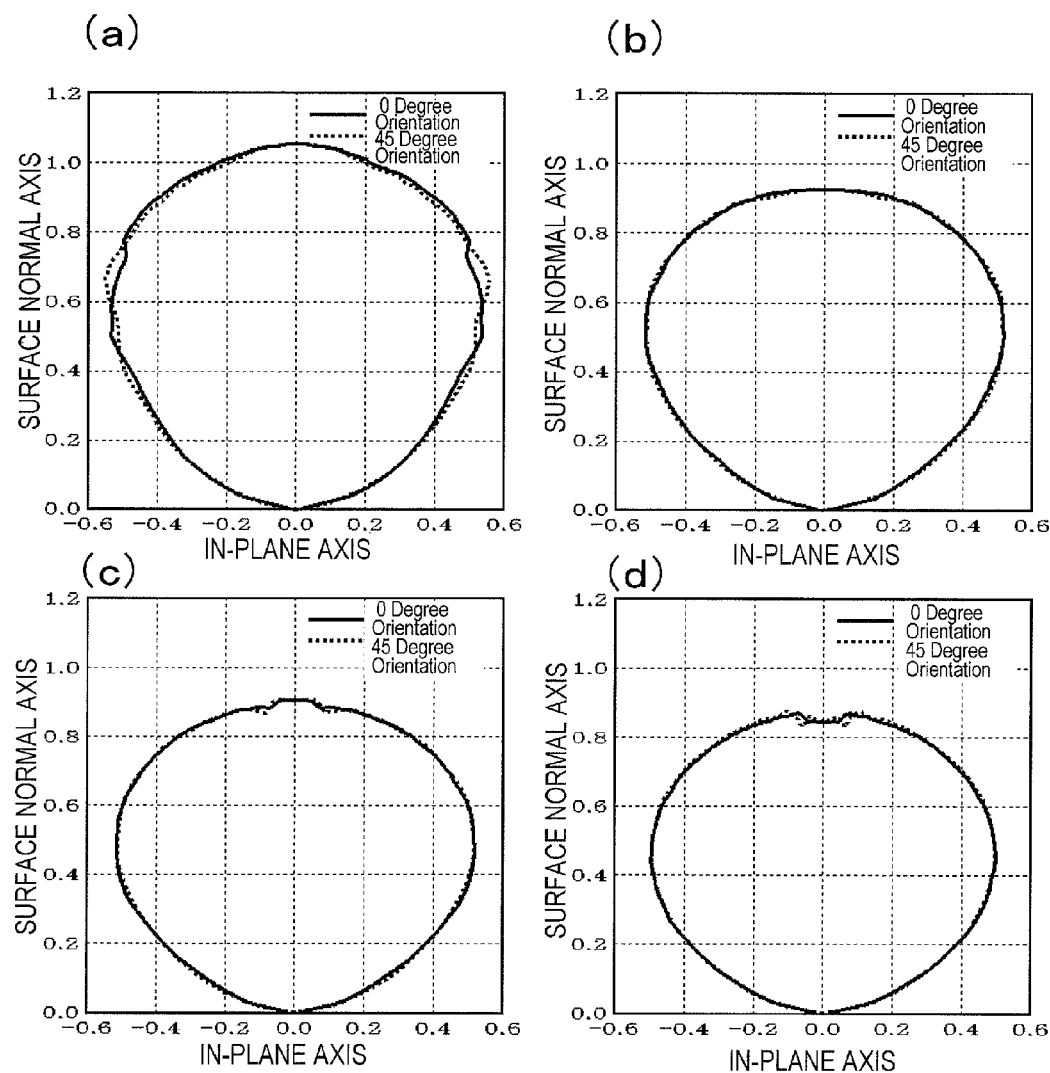
FIG. 13A (a) through (d) show the viewing angle dependence of light output from the surface configuration in Embodiment 4.
Figure 13B:
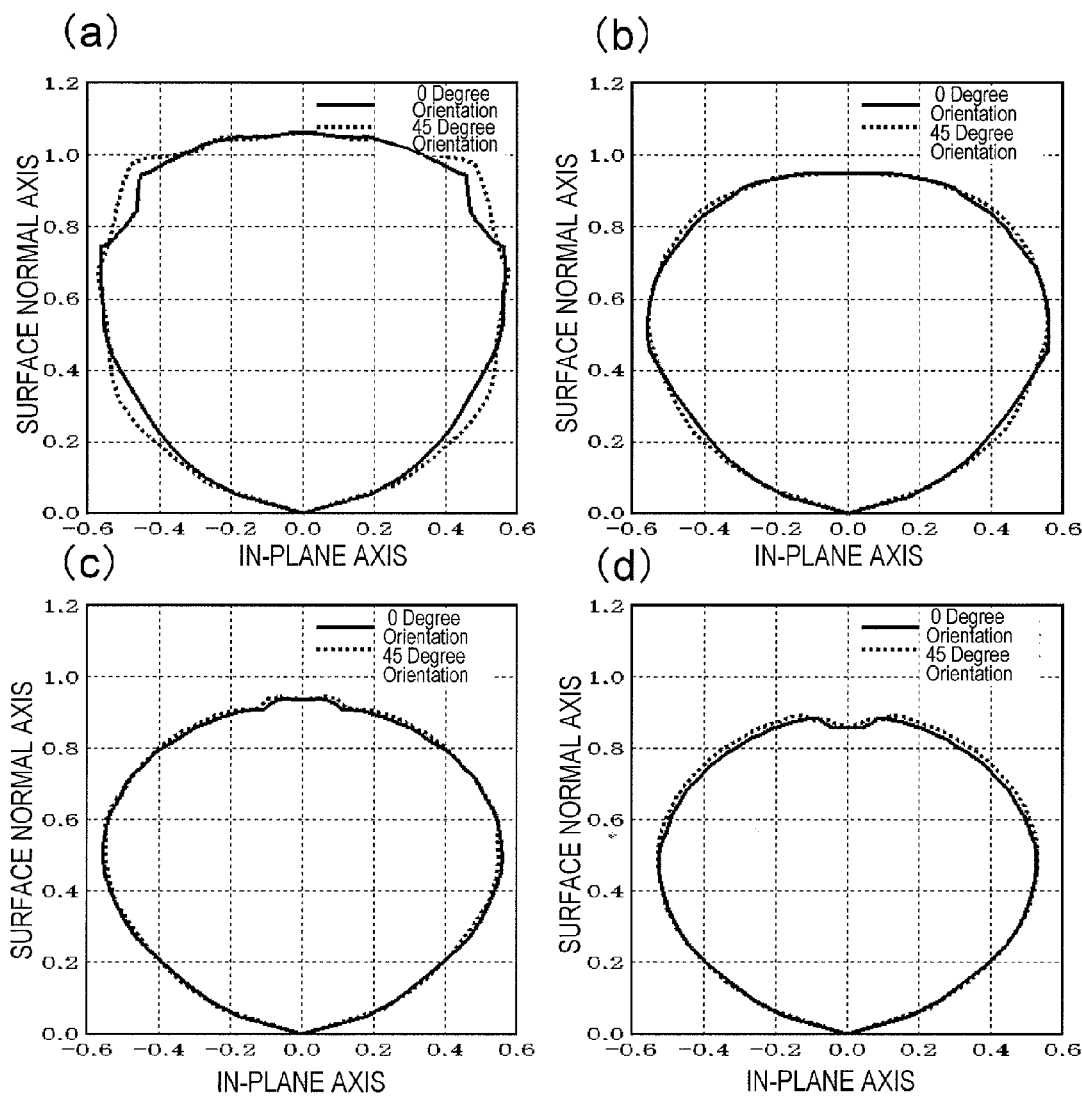
FIG. 13B (a) through (d) show the viewing angle dependence of light output from the surface configuration in Embodiment 4.
Figure 14:
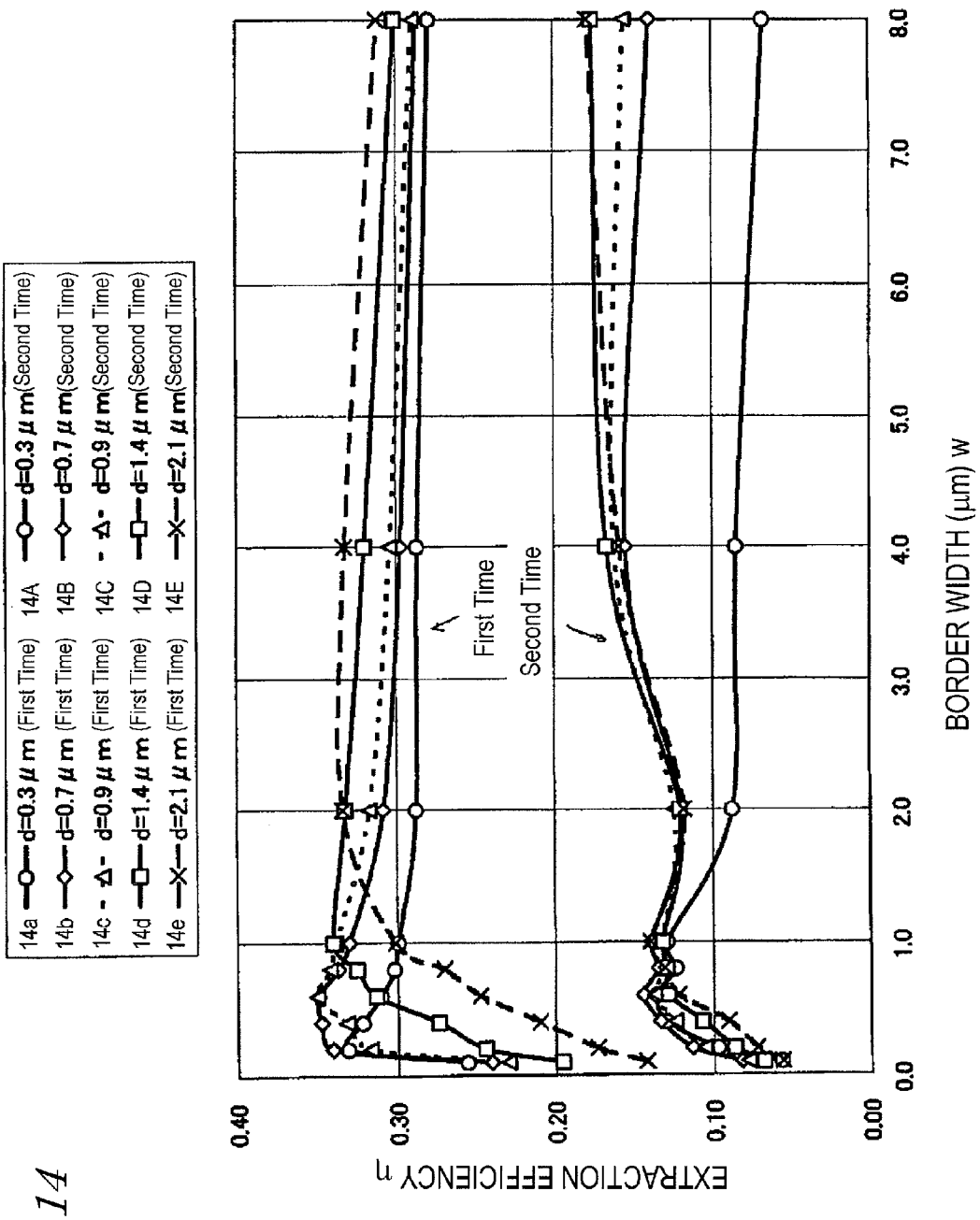
FIG. 14 shows the light extraction efficiency realized by the surface configuration in Embodiment 4.

With reference to FIGS. 12 through 14, Embodiment 4 will be described. Embodiment 4 is different from Embodiment 1 only in the pattern of the surface configuration 13 and is the same as Embodiment 1 in all the other elements. The common elements as those of Embodiment 1 will not be described.

FIG. 12 shows a formation procedure and patterns of the surface configuration 13 in Embodiment 4. The surface configuration 13 is formed in two processes. FIGS. 12(a) and (c) show a first process, and FIGS. 12(b) and (d) show a second process.

In the first process, a photoresist formed on the transparent substrate 5 is exposed by a technique of reduction exposure or the like using a mask shown in FIG. 12(a), and the exposed parts are removed to form a resist pattern (development). The transparent substrate 5 is etched by a depth of d/3, and the resist is removed. FIG. 12(c) shows a pattern formed by the first process. On this stage, the surface configuration 13 is a result of the following: the surface of the transparent substrate 5 is divided into checkerboard squares (tiny square areas δ') each having a width of 2w (w will be referred to as the "border width") with no gap, and convexed portions and portions relatively concaved to the convexed portions are randomly assigned while probability P of each square being a convexed portion (tiny area $\delta'_1$, stripes from the upper left corner to the lower right corner) is 50% and probability 1−P of each square being a concaved portion (tiny area $\delta'_2$, white square) is 50% (probability P may be any other value than 50%). Namely, one tiny area δ' is adjacent to, and surrounded by, others of the plurality of tiny areas δ'. The tiny areas $\delta'_1$ protrude upward from the tiny areas $\delta'_2$ toward the surface of the transparent substrate 5 by d/3. The tiny areas δ' are square in this embodiment, but may be of another shape as long as the diameter of the maximum circle among the circles inscribed to the tiny areas δ is 0.4 μm or greater and 3 μm or less.

In the second process, a photoresist formed on the transparent substrate 5 is exposed by a technique of reduction exposure or the like using a mask shown in FIG. 12(b), and the exposed parts are removed to form a resist pattern (development). The transparent substrate 5 is etched by a depth of 2d/3, and the resist is removed. FIG. 12(d) shows a pattern formed by the second process. On this stage, the surface configuration 13 is a result of the following: the surface of the transparent substrate 5 is divided into checkerboard squares (tiny square areas δ) each having a width of 2w (w will be referred to as the "border width") with no gap, and convexed portions (tiny areas $\delta_1$; stripes from the upper right corner to the lower left corner) and portions relatively concaved to the convexed portions (tiny areas $\delta_2$; white square) are assigned in a checkerboard pattern. Namely, the tiny areas $\delta_1$ protrude upward from the tiny areas $\delta_2$ toward the surface of the transparent substrate 5 by 2d/3.

In these two processes, the positioning is performed as follows. As shown in FIG. 12(e), the first process and the second process are performed in this order or in the opposite order with the two patterns being shifted by w in two directions perpendicular to each other on a plane parallel to the transparent substrate 5, namely, in both of longitudinal and lateral directions (the shifting amount does not need to be w). Accordingly, the surface of the transparent substrate 5 is divided into the tiny areas δ' (the tiny areas $\delta'_1$ and $\delta'_2$) by the first process, and is divided into the tiny areas δ (the tiny areas $\delta_1$ and $\delta_2$) by the second process, such that the tiny areas δ are independent from, and overlap, the tiny areas δ' obtained by the first process.

A reference plane parallel to the surface of the transparent substrate 5 is set at an intermediate position in a direction vertical to the surface of the transparent substrate 5. From the reference plane, each area in which the tiny areas $\delta_1$ and $\delta'_1$ overlap each other protrudes upward by d/2, each area in which the tiny areas $\delta_1$ and $\delta'_2$ overlap each other protrudes upward by d/6, each area in which the tiny areas $\delta_2$ and $\delta'_2$ overlap each other is recessed downward by d/2, and each area in which the tiny areas $\delta_2$ and $\delta'_1$ overlap each other is recessed downward by d/6. The ratio of the etching depth between the first process and the second process is 1:2, but may be another ratio. Any ratio is usable as long as the etching results in the state where from the reference plane, each area in which the tiny areas $\delta_1$ and $\delta'_1$ overlap each other protrudes upward by d/2, each area in which the tiny areas $\delta_1$ and $\delta'_2$ overlap each other protrudes upward by a value of 0 to d/2, each area in which the tiny areas $\delta_2$ and $\delta'_2$ overlap each other is recessed downward by d/2, and each area in which the tiny areas $\delta_2$ and $\delta'_1$ overlap each other is recessed downward by a value of 0 to d/2.

Owing to this, at least a part of the plurality of tiny areas $\delta_1$ and $\delta_2$ overlaps at least a part of the plurality of tiny areas $\delta'_1$ and $\delta'_2$. The shifting width w does not match the width 2w of each of the tiny areas $\delta_1$, $\delta_2$, $\delta'_1$ and $\delta'_2$. Therefore, the borders between the tiny areas may cross each other but do not overlap each other.

FIGS. 13A and 13B show analysis results of the viewing angle dependence of the light extracted from the surface configuration in the first-time light extraction in Embodiment 4. The step d=0.6 μm, and the wavelength λ and the border width w are parameters. FIGS. 13A(a) through (d) show the results in the case where λ=0.450 μm. FIGS. 13B(a) through (d) show the results in the case where λ=0.635 μm. In each of FIGS. 13A and 13B, (a) shows the results in the case where w=0.5 μm, (b) shows the results in the case where w=1.0 μm, (c) shows the results in the case where w=1.5 μm, and (d) shows the results in the case where w=2.0 μm. When the border width w=0.5 μm, there are angles of deviation (latitudes) with respect to which the intensity fluctuation (i.e., small intensity difference caused by the parallax) is large; and when w=1.0 μm, the solid line and the dotted line both exhibit a slow intensity fluctuation with respect to the angle of deviation. When w is increased to 1.5 μm or 2.0 μm, the intensity fluctuation with respect to the angle of deviation becomes large in the vicinity of the direction of the surface normal. Accordingly, it is understood that the viewing angle dependence showing a slow intensity fluctuation with respect to the angle of deviation is obtained under the condition that the border width w=0.5 μm or greater and 1.5 μm or less.

FIG. 14 shows the light extraction efficiency from the surface configuration 13 in Embodiment 4. FIG. 14, in which the horizontal axis represents the border width w of the surface configuration 13, shows the light extraction efficiency obtained under the same conditions as those of FIG. 5(c). FIG. 14 shows the light extraction efficiency (efficiency η1 in the first-time light extraction) when the step of the surface configuration 13 is d=0.3, 0.9, 1.4 and 2.1 μm in addition to when d=0.7 μm, and also the light extraction efficiency in the case where the light is reflected by the surface configuration 13, reflected by the electrode 2 and again incident on the surface configuration 13 (efficiency η2 in the second-time light extraction) with an assumption that no light is attenuated while reciprocating between the surface configuration 13 and the electrode 2, namely, that no light is absorbed by the transparent electrode 4 or there is no reflection loss of light by the electrode 2. Curve 14a and curve 14A respectively represent the light extraction efficiency in the first-time light extraction and the second-time light extraction when d=0.3 μm. Curve 14b and curve 14B respectively represent the light extraction efficiency in the first-time light extraction and the second-time light extraction when d=0.7 μm. Curve 14c and curve 14C respectively represent the light extraction efficiency in the first-time light extraction and the second-time light extraction when d=0.9 μm. Curve 14d and curve 14D respectively represent the light extraction efficiency in the first-time light extraction and the second-time light extraction when d=1.4 μm. Curve 14e and curve 14E respectively represent the light extraction efficiency in the first-time light extraction and the second-time light extraction when d=2.1 µm. All the curves significantly drop when the border width w is 0.2 µm or less. Therefore, the lower limit of the border width w can be considered to be about 0.2 µm. In a range limited in terms of the viewing angle dependence (w=0.5 to 1.5 µm), curves 14a and 14A exhibit a lower light extraction efficiency than the light extraction efficiency at the other depths, and so the deterioration is considered to start when the step d=0.3 µm. Therefore, the lower limit of d can be considered to be about 0.2 µm. As d is increased, the light extraction efficiency in the first-time light extraction is decreased in an area where w is small, and the maximum point thereof is shifted to the side on which w is larger. Up to d=2.1 µm, the light extraction efficiency is kept high in the vicinity of w=1.5 µm. When d is larger, the light extraction efficiency is decreased in the entire area in which w=0.0 to 1.5 µm. Therefore, the upper limit of d can be considered to be about 3 µm. Accordingly, a recommended range of depth d is 0.2 to 3 µm. Such a recommended range of depth d, which is represented using the refractive index n1 of the transparent substrate 5, the refractive index n0 of the air 6 and the wavelength λ of the center of the light spectrum like in Embodiment 1, is $2\lambda/(n1-n0) \geq d \geq \lambda/6(n1-n0)$.

At all the depths fulfilling d≦0.9 µm, the light extraction efficiency in the first-time light extraction is maximum when the border width w=0.2 to 1 µm. When w is decreased or increased, the light extraction efficiency becomes asymptotic to 0.27 (value given by expression 3, the light extraction efficiency in the case where the surface is a mirror surface). The light extraction efficiency in the second-time light extraction is maximum when w=0.4 µm to 8.0 µm at all the depths fulfilling d≦0.9 µm. When w is increased, the light extraction efficiency becomes asymptotic to 0.0 (not appear in the range shown in FIG. 14). When w≦0.4 µm, the light extraction efficiency is converged to 0.0 as w is decreased.

In FIG. 14, curves 14b and 14B (d=0.7 µm) indicate that when w=0.6 µm, $\eta 1=0.350$ and $\eta 2=0.145$. Where $\tau=0.88$, the light extraction efficiency is 0.551. When w=1.0 µm, $\eta 1=0.330$ and $\eta 2=0.140$. The light extraction efficiency is 0.527. In the case of the conventional light emitting device shown in FIG. 26 and FIG. 28(a), $\eta 1=0.274$ and $\eta 2=0$. The light extraction efficiency is zero in the second-time and all the subsequent light extractions. Thus, the total light extraction efficiency is 0.274. Accordingly, it is understood that the light extraction efficiency which can be realized by the light emitting device in this embodiment is 2.01 times the light extraction efficiency realized by the light emitting device shown in FIG. 28(a) under the condition of w=0.6 µm, and is 1.92 times under the condition of w=1.0 µm.

In general, the reduction exposure technique can provide an alignment precision (precision of positioning two patterns) which is several times higher than the patterning precision (minimum patternable size). Accordingly, in this embodiment, merely by forming a pattern having the border width 2w, a structure having the border width w can be formed after the two processes. Thus, this embodiment has an advantage of lowering the technological hurdle of formation of a precise pattern.

(Embodiment 5)

Figure 15:
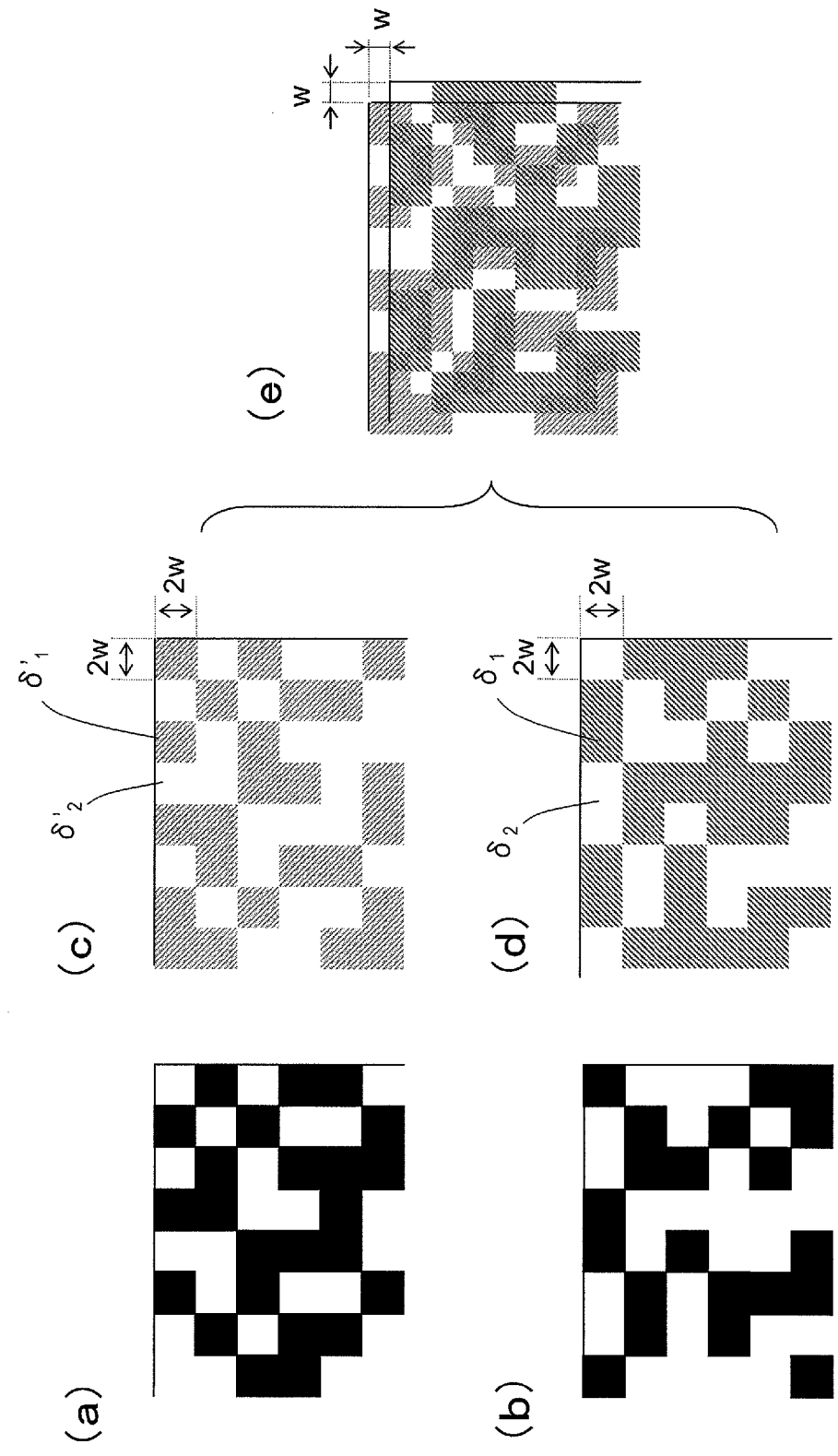
FIGS. 15 (a) and (c) provide patterns showing a first process for forming a surface configuration in Embodiment 5; (b) and (d) provide patterns showing a second process for forming the surface configuration in Embodiment 5; (e) shows a final pattern of the surface configuration formed by the first and second processes.
Figure 16A:
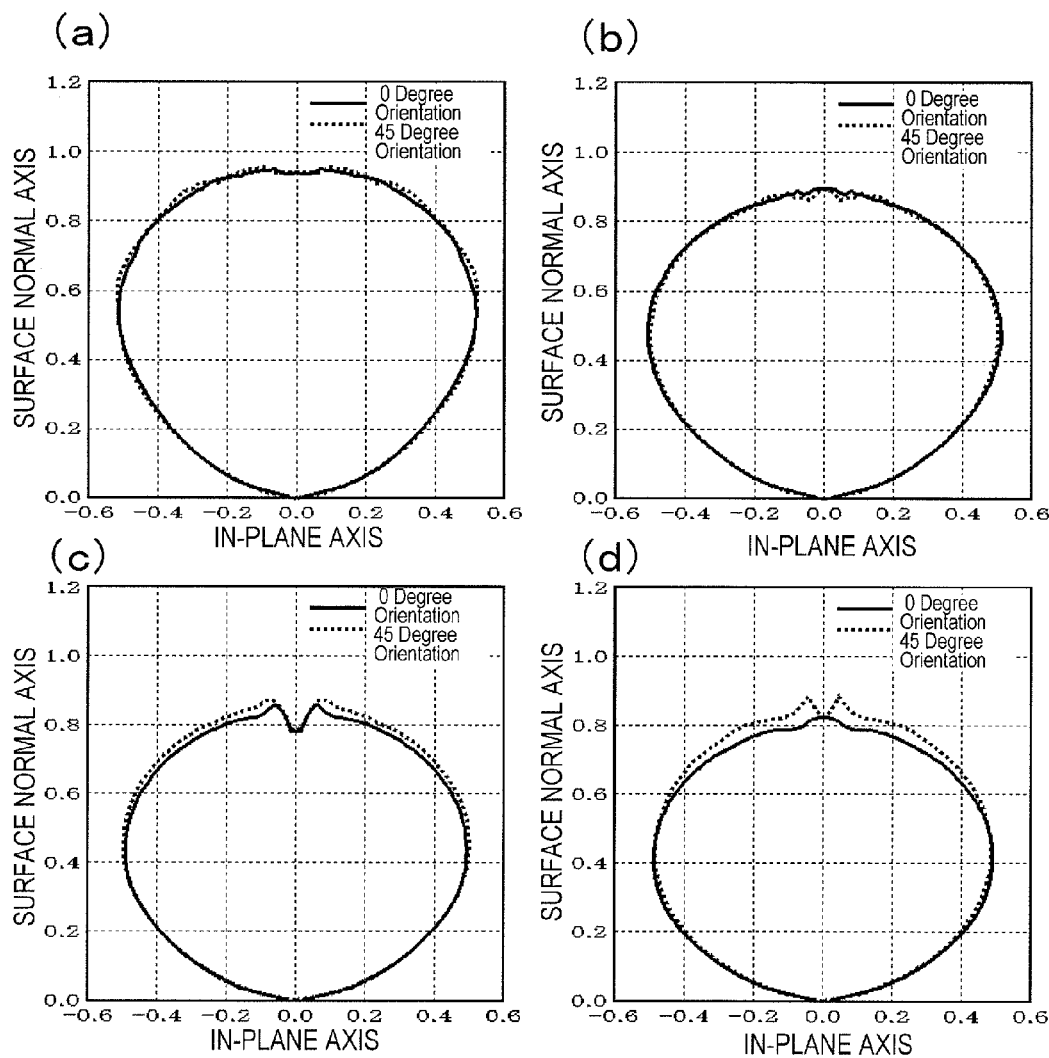
FIG. 16A (a) through (d) show the viewing angle dependence of light output from the surface configuration in Embodiment 5.
Figure 16B:
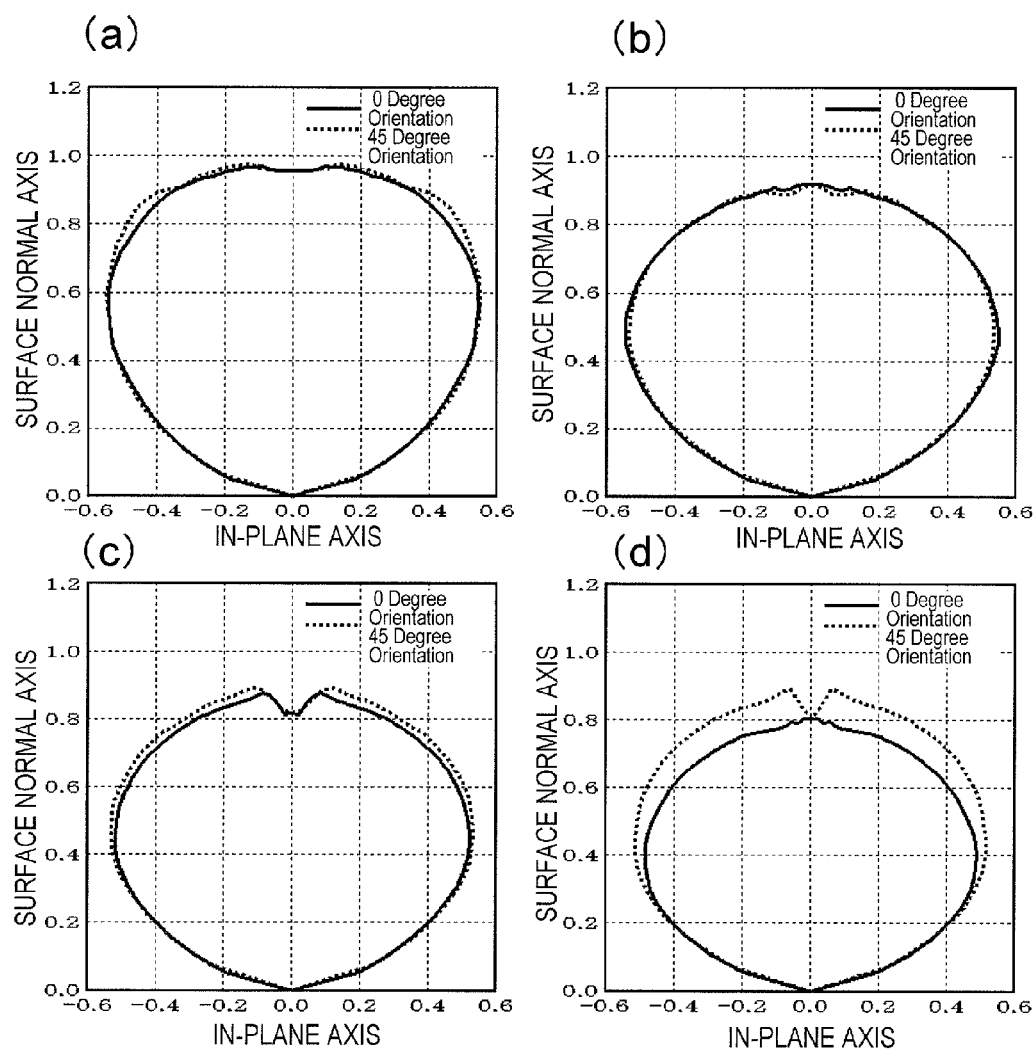
FIG. 16B (a) through (d) show the viewing angle dependence of light output from the surface configuration in Embodiment 5.
Figure 17:
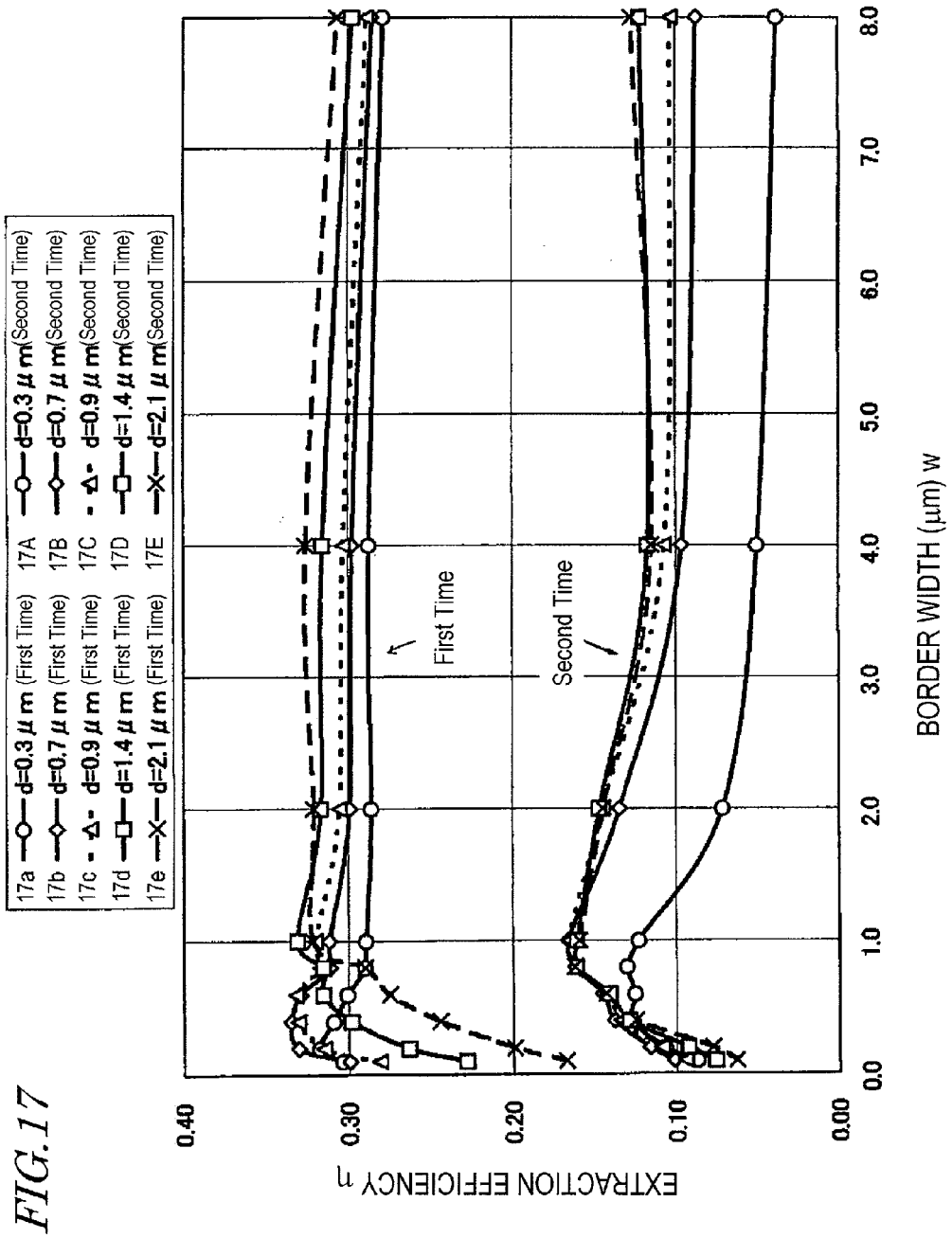
FIG. 17 shows the light extraction efficiency realized by the surface configuration in Embodiment 5.

With reference to FIGS. 15 through 17, Embodiment 5 will be described. Embodiment 5 is different from Embodiment 1 only in the pattern of the surface configuration 13 and is the same as Embodiment 1 in all the other elements. The common elements as those of Embodiment 1 will not be described.

FIG. 15 shows a formation procedure and patterns of the surface configuration 13 in Embodiment 5. The surface configuration 13 is formed in two processes. FIGS. 15(a) and (c) show a first process, and FIGS. 15(b) and (d) show a second process.

In the first process, a photoresist formed on the transparent substrate 5 is exposed by a technique of reduction exposure or the like using a mask shown in FIG. 15(a), and the exposed parts are removed to form a resist pattern (development). The transparent substrate 5 is etched by a depth of d/3, and the resist is removed. FIG. 15(c) shows a pattern formed by the first process. On this stage, the surface configuration 13 is a result of the following: the surface of the transparent substrate 5 is divided into checkerboard squares (tiny square areas δ') each having a width of 2w (w will be referred to as the "border width") with no gap, and convexed portions and portions relatively concaved to the convexed portions are randomly assigned while probability P of each square being a convexed portion (tiny area $\delta'_1$, stripes from the upper left corner to the lower right corner) is 50% and probability 1−P of each square being a concaved portion (tiny area $\delta'_2$, white square) is 50% (probability P may be any other value than 50%). Namely, one tiny area δ' is adjacent to, and surrounded by, others of the plurality of tiny areas δ'. The tiny areas $\delta'_1$ protrude upward from the tiny areas $\delta'_2$ toward the surface of the transparent substrate 5 by d/3. The tiny areas δ are square in this embodiment, but may be of another shape as long as the diameter of the maximum circle among the circles inscribed to the tiny areas δ' is 0.4 µm or greater and 3 µm or less.

In the second process, a photoresist formed on the transparent substrate 5 is exposed by a technique of reduction exposure or the like using a mask shown in FIG. 15(b), and the exposed parts are removed to form a resist pattern (development). The transparent substrate 5 is etched by a depth of 2d/3, and the resist is removed. FIG. 15(d) shows a pattern formed by the second process. On this stage, the surface configuration 13 is a result of the following: the surface of the transparent substrate 5 is divided into checkerboard squares (tiny square areas δ) each having a width of 2w (w will be referred to as the "border width") with no gap, and convexed portions and portions relatively concaved to the convexed portions are randomly assigned while probability P of each square being a convexed portion (tiny area $\delta_1$, stripes from the upper right corner to the lower left corner) is 50% and probability 1−P of each square being a concaved portion (tiny area $\delta_2$, white square) is 50% (probability P may be any other value than 50%). Namely, one tiny area δ is adjacent to, and surrounded by, others of the plurality of tiny areas δ. The tiny areas $\delta_1$ protrude upward from the tiny areas $\delta_2$ toward the surface of the transparent substrate 5 by 2d/3.

In these two processes, the positioning is performed as follows. As shown in FIG. 15(e), the first process and the second process are performed in this order or in the opposite order with the two patterns being shifted by w in two directions perpendicular to each other on a plane parallel to the transparent substrate 5, namely, in both of longitudinal and lateral directions (the shifting amount does not need to be w). Accordingly, the surface of the transparent substrate 5 is divided into the tiny areas δ' (the tiny areas $\delta'_1$ and $\delta'_2$) by the first process, and is divided into the tiny areas δ (the tiny areas $\delta_1$ and $\delta_2$) by the second process, such that the tiny areas δ are independent from, and overlap, the tiny areas δ' obtained by the first process.

A reference plane parallel to the surface of the transparent substrate 5 is set at an intermediate position in a direction vertical to the surface of the transparent substrate 5. From the reference plane, each area in which the tiny areas $\delta_1$ and $\delta'_1$ overlap each other protrudes upward by d/2, each area in which the tiny areas $\delta_1$ and $\delta'_2$ overlap each other protrudes upward by d/6, each area in which the tiny areas $\delta_2$ and $\delta'_2$ overlap each other is recessed downward by d/2, and each area in which the tiny areas $\delta_2$ and $\delta'_1$ overlap each other is recessed downward by d/6. The ratio of the etching depth between the first process and the second process is 1:2, but may be another ratio. Any ratio is usable as long as the etching results in the state where from the reference plane, each area in which the tiny areas $\delta_1$ and $\delta'_1$ overlap each other protrudes upward by d/2, each area in which the tiny areas $\delta_1$ and $\delta'_2$ overlap each other protrudes upward by a value of 0 to d/2, each area in which the tiny areas $\delta_2$ and $\delta'_2$ overlap each other is recessed downward by d/2, and each area in which the tiny areas $\delta_2$ and $\delta'_1$ overlap each other is recessed downward by a value of 0 to d/2.

Owing to this, at least a part of the plurality of tiny areas $\delta_1$ and $\delta_2$ overlaps at least a part of the plurality of tiny areas $\delta'_1$ and $\delta'_2$. The shifting width w does not match the width 2w of each of the tiny areas $\delta_1$, $\delta_2$, $\delta'_1$ and $\delta'_2$. Therefore, the borders between the tiny areas may cross each other but do not overlap each other.

FIGS. 16A and 16B show analysis results of the viewing angle dependence of the light extracted from the surface configuration in the first-time light extraction in Embodiment 5. The step d=0.6 μm, and the wavelength λ and the border width w are parameters. FIGS. 16A(a) through (d) show the results in the case where λ=0.450 μm. FIGS. 16B(a) through (d) show the results in the case where λ=0.635 μm. In each of FIGS. 16A and 16B, (a) shows the results in the case where w=0.5 μm, (b) shows the results in the case where w=1.0 μm, (c) shows the results in the case where w=1.5 μm, and (d) shows the results in the case where w=2.0 μm. When the border width w=0.5 μm or 1.0 μm, the solid line and the dotted line both exhibit a slow intensity fluctuation with respect to the angle of deviation (latitude) (i.e., small intensity difference caused by the parallax). When w is increased to 1.5 μm or 2.0 μm, the intensity fluctuation with respect to the angle of deviation becomes large in the vicinity of the direction of the surface normal. Accordingly, it is understood that the viewing angle dependence showing a slow intensity fluctuation with respect to the angle of deviation is obtained under the condition that the border width w=1.5 μm or less.

FIG. 17 shows the light extraction efficiency from the surface configuration 13 in Embodiment 5. FIG. 17, in which the horizontal axis represents the border width w of the surface configuration 13, shows the light extraction efficiency obtained under the same conditions as those of FIG. 5(c). FIG. 17 shows the light extraction efficiency (efficiency $\eta 1$ in the first-time light extraction) when the step of the surface configuration 13 is d=0.3, 0.9, 1.4 and 2.1 μm in addition to when d=0.7 μm, and also the light extraction efficiency in the case where the light is reflected by the surface configuration 13, reflected by the electrode 2 and again incident on the surface configuration (efficiency $\eta 2$ in the second-time light extraction) with an assumption that no light is attenuated while reciprocating between the surface configuration 13 and the electrode 2, namely, that no light is absorbed by the transparent electrode 4 or there is no reflection loss of light by the electrode 2. Curve 17a and curve 17A respectively represent the light extraction efficiency in the first-time light extraction and the second-time light extraction when d=0.3 μm. Curve 17b and curve 17B respectively represent the light extraction efficiency in the first-time light extraction and the second-time light extraction when d=0.7 μm. Curve 17c and curve 17C respectively represent the light extraction efficiency in the first-time light extraction and the second-time light extraction when d=0.9 μm. Curve 17d and curve 17D respectively represent the light extraction efficiency in the first-time light extraction and the second-time light extraction when d=1.4 μm. Curve 17e and curve 17E respectively represent the light extraction efficiency in the first-time light extraction and the second-time light extraction when d=2.1 μm. All the curves significantly drop when the border width w is 0.2 μm or less. Therefore, the lower limit of the border width w can be considered to be about 0.2 μm. In a part of a range limited in terms of the viewing angle dependence (w=0.5 to 1.5 μm), curves 17a and 17A exhibit a lower light extraction efficiency than the light extraction efficiency at the other depths, and so the deterioration is considered to start when the step d=0.3 μm. Therefore, the lower limit of d can be considered to be about 0.2 μm. As d is increased, the light extraction efficiency in the first-time light extraction is decreased in an area where w is small, and the maximum point thereof is shifted to the side on which w is larger. Up to d=2.1 μm, the light extraction efficiency is kept high in the vicinity of w=1.5 μm. When d is larger, the light extraction efficiency is decreased in the entire area in which w=0.0 to 1.5 μm. Therefore, the upper limit of d can be considered to be about 3 μm. Accordingly, a recommended range of depth d is 0.2 to 3 μm. Such a recommended range of depth d, which is represented using the refractive index n1 of the transparent substrate 5, the refractive index n0 of the air 6 and the wavelength λ of the center of the light spectrum like in Embodiment 1, is $2\lambda/(n1-n0) \geq d \geq \lambda/6(n1-n0)$.

At all the depths fulfilling $d \leq 0.9$ μm, the light extraction efficiency in the first-time light extraction is maximum when the border width w=0.2 to 1 μm. When w is decreased or increased, the light extraction efficiency becomes asymptotic to 0.27 (value given by expression 3, the light extraction efficiency in the case where the surface is a mirror surface). The light extraction efficiency in the second-time light extraction is maximum when w=0.4 μm to 2.0 μm at all the depths fulfilling $d \leq 0.9$ μm. When w is increased, the light extraction efficiency becomes asymptotic to 0.0 (not appear in the range shown in FIG. 17). When $w \leq 0.4$ μm, the light extraction efficiency is converged to 0.0 as w is decreased.

In FIG. 17, curves 17b and 17B (d=0.7 μm) indicate that when w=0.6 μm, $\eta 1$=0.334 and $\eta 2$=0.145. Where $\tau$=0.88, the light extraction efficiency is 0.540. When w=1.0 μm, $\eta 1$=0.311 and $\eta 2$=0.166. The light extraction efficiency is 0.586. In the case of the conventional light emitting device shown in FIG. 26 and FIG. 28(a), $\eta 1$=0.274 and $\eta 2$=0. The light extraction efficiency is zero in the second-time and all the subsequent light extractions. Thus, the total light extraction efficiency is 0.274. Accordingly, it is understood that the light extraction efficiency which can be realized by the light emitting device in this embodiment is 1.97 times the light extraction efficiency realized by the light emitting device shown in FIG. 28(a) under the condition of w=0.6 μm, and is 2.14 times under the condition of w=1.0 μm.

In general, the reduction exposure technique can provide an alignment precision (precision of positioning two patterns) which is several times higher than the patterning precision (minimum patternable size). Accordingly, in this embodiment, merely by forming a pattern having the border width 2w, a structure having the border width w can be formed after the two processes. Thus, this embodiment has an advantage of lowering the technological hurdle of formation of a precise pattern.

(Embodiment 6)

Figure 18:
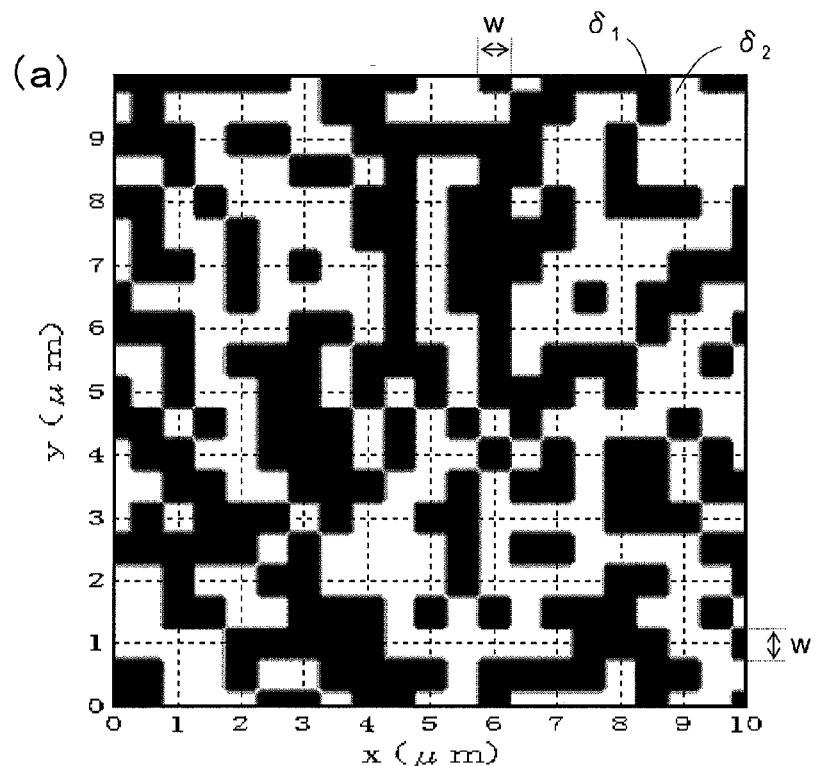
FIG. 18 shows patterns of a surface configuration 13 in Embodiment 6; (a) shows a pattern when probability P of each area being a convexed portion is 50%; and (b) shows a pattern when probability P of each area being a convexed portion is 90%.
Figure 18:
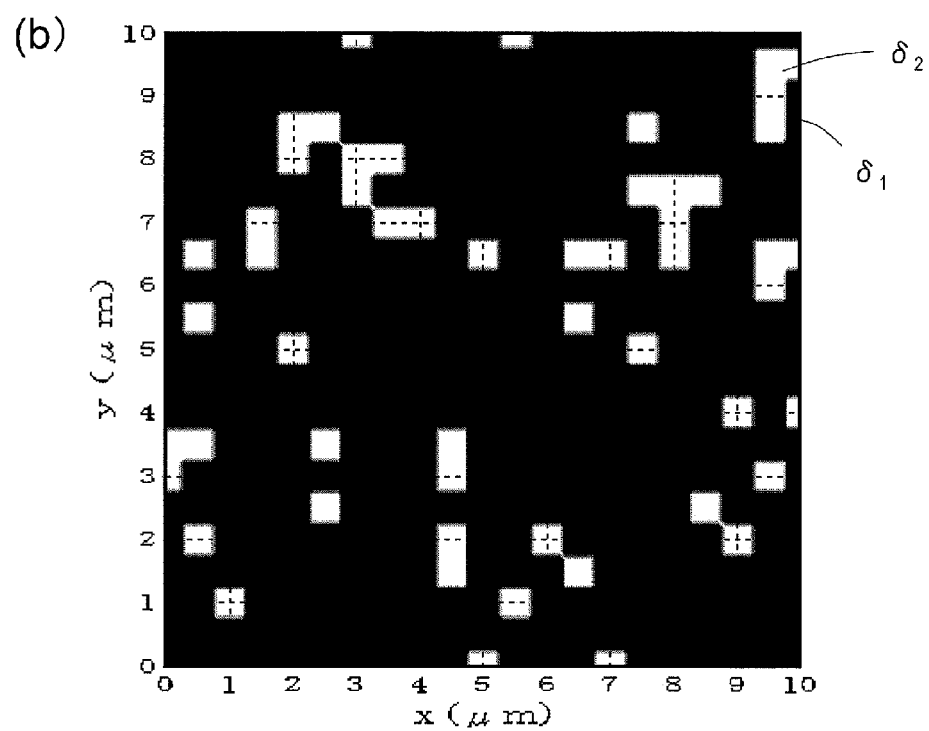
Figure 19A:
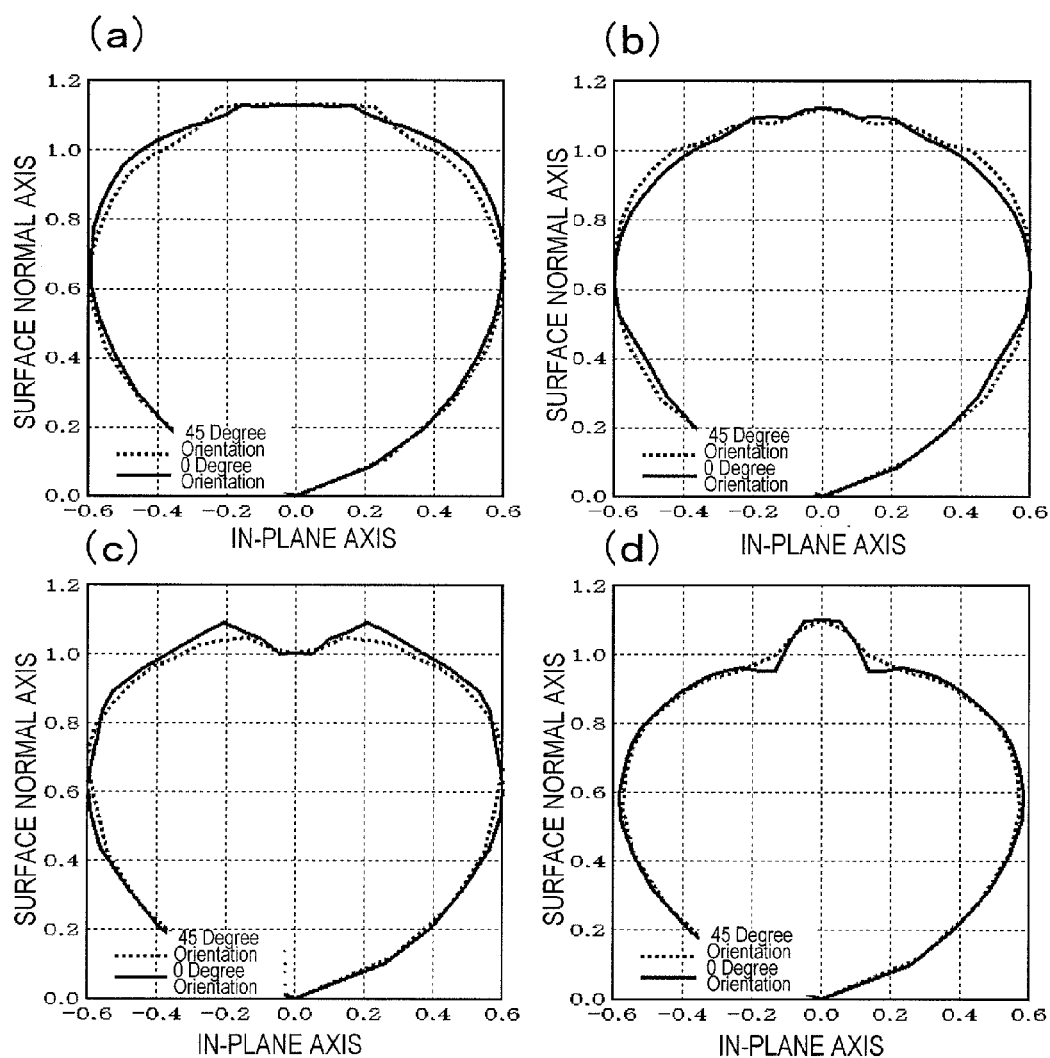
FIG. 19A (a) through (d) show the viewing angle dependence of light output from the surface configuration in Embodiment 6.
Figure 19B:
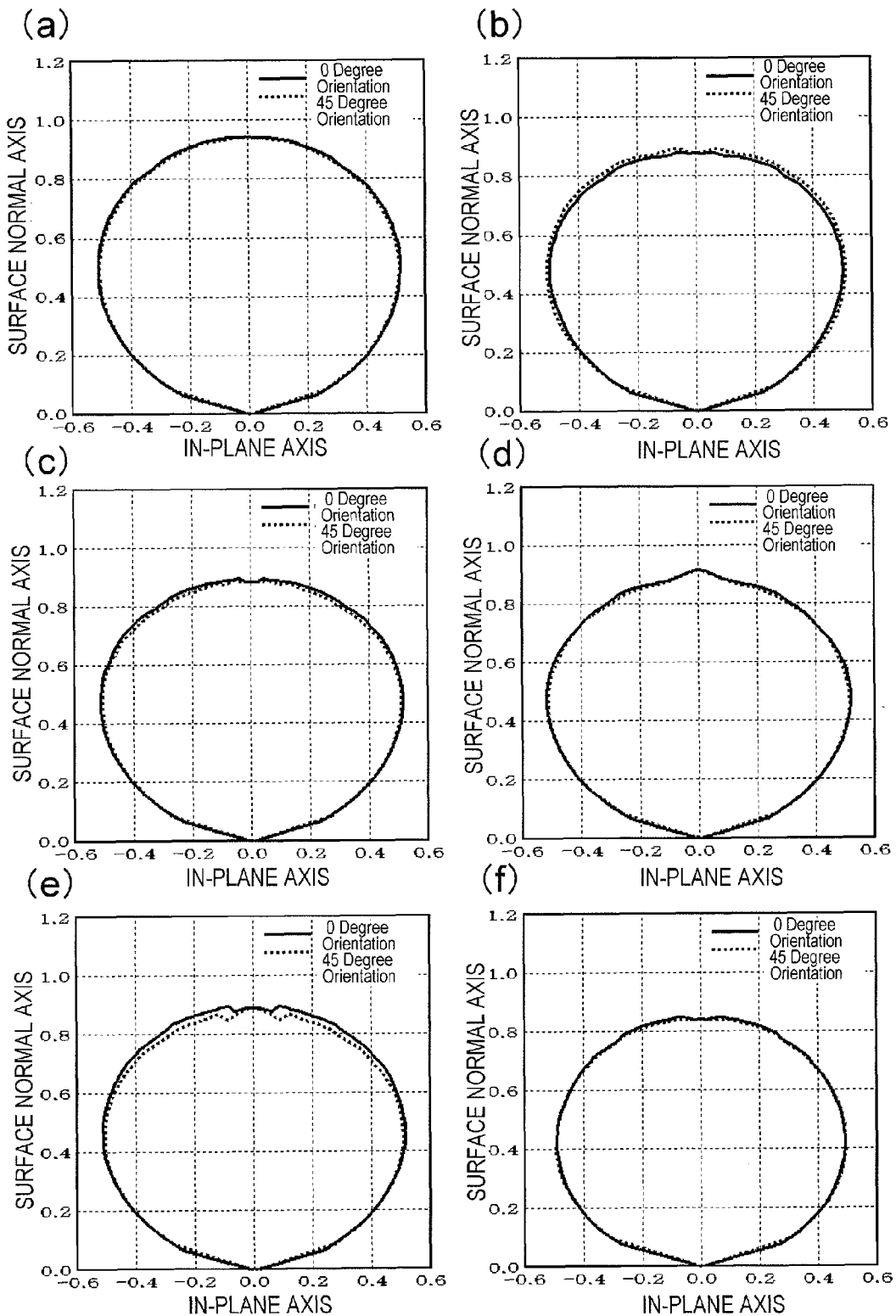
FIG. 19B (a) through (f) show the viewing angle dependence of light output from the surface configuration in Embodiment 6.
Figure 19C:
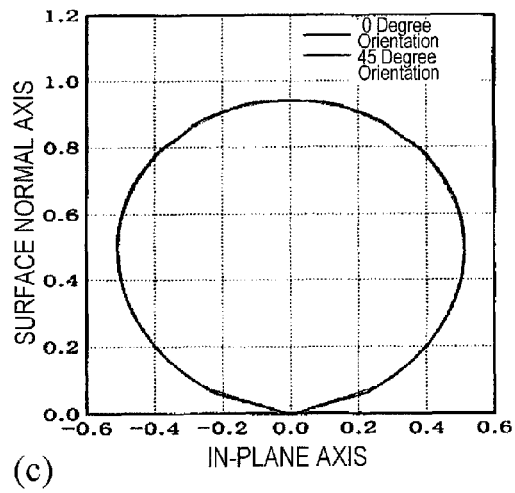
FIG. 19C (a) through (f) show the viewing angle dependence of light output from the surface configuration in Embodiment 6.
Figure 19C:
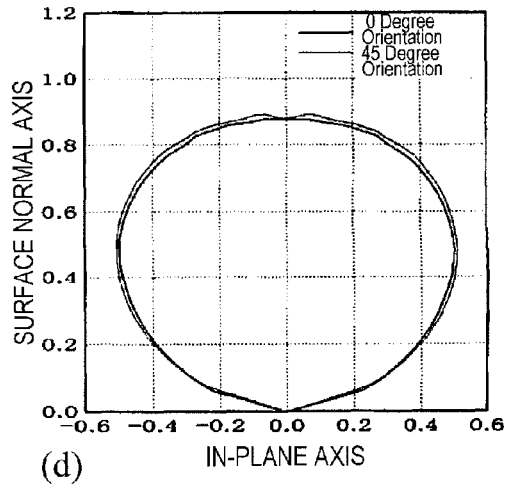
Figure 19C:
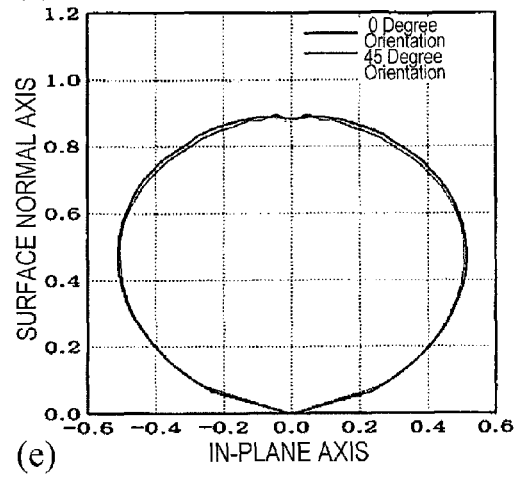
Figure 19C:
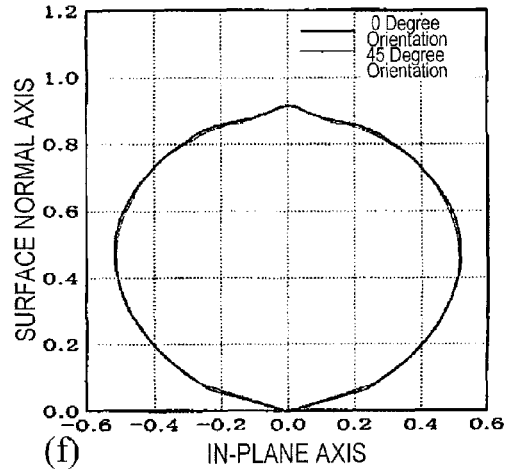
Figure 19C:
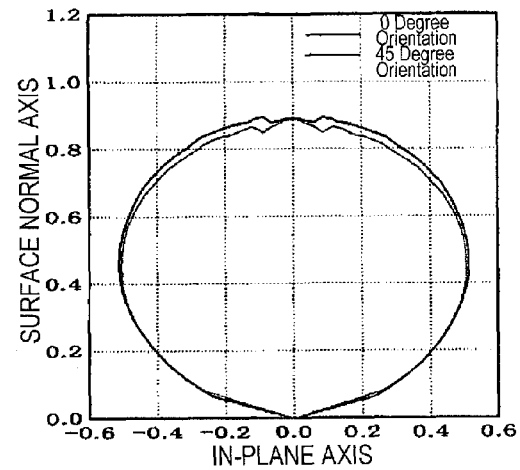
Figure 19C:
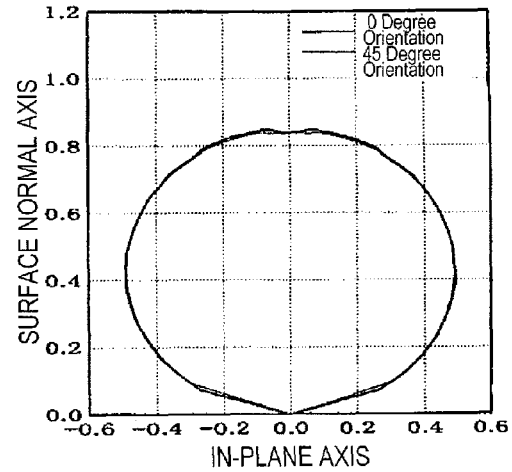
Figure 20:
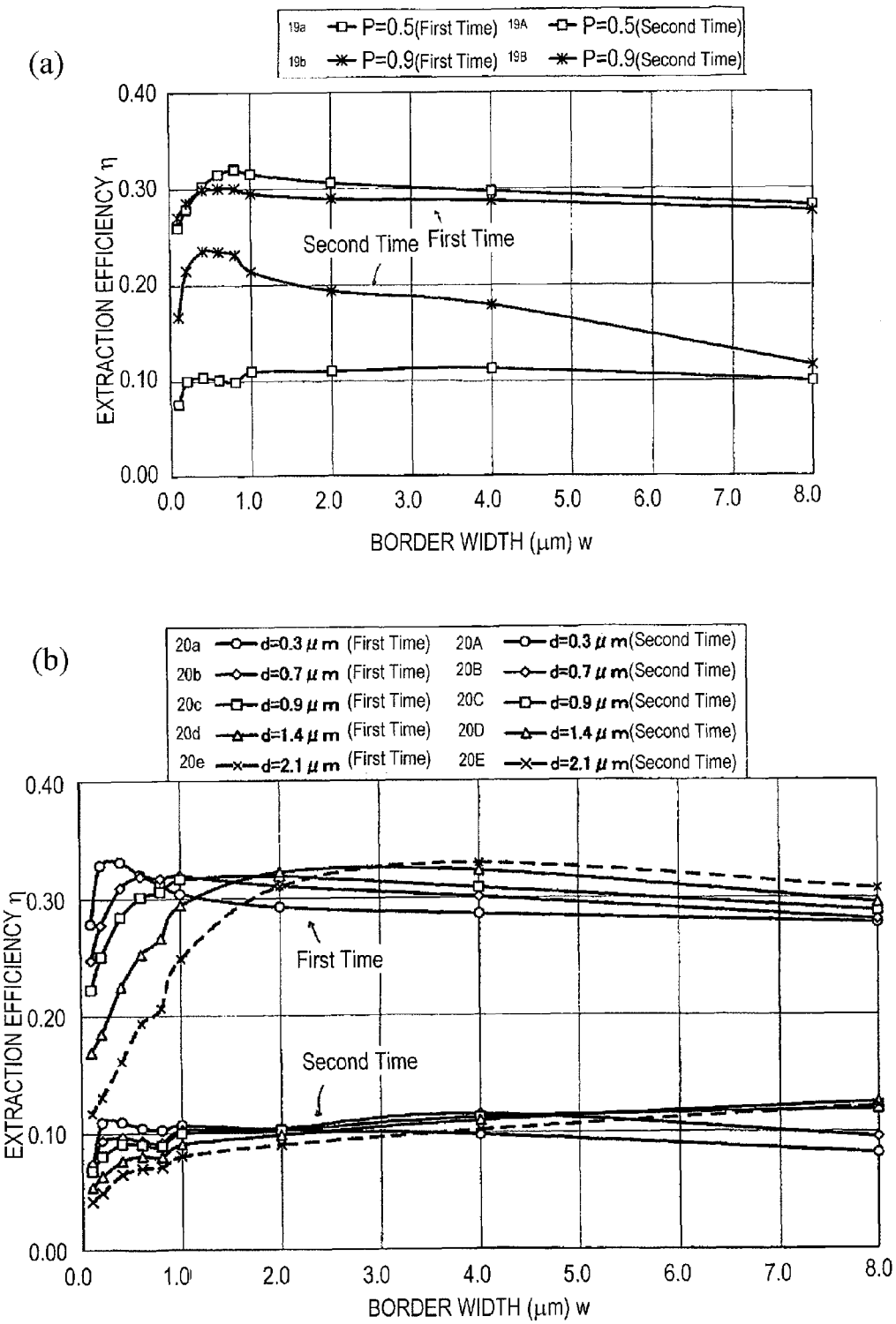
FIG. 20 shows the light extraction efficiency realized by the surface configuration in Embodiment 6; (a) shows a comparison using probability P of each area being a convexed portion as the parameter; and (b) shows a comparison using the step d as the parameter.

With reference to FIGS. 18 through 20, Embodiment 6 will be described. Embodiment 6 is different from Embodiment 1 only in the pattern of the surface configuration 13 and is the same as Embodiment 1 in all the other elements. The common elements as those of Embodiment 1 will not be described.

FIG. 18 shows patterns of the surface configuration 13 in Embodiment 6. The surface of the transparent substrate 5 is divided into checkerboard squares (tiny square areas δ) each having the width w (referred to as the "border width") with no gap. For each square, it is determined whether the square is to be a convexed portion (tiny area $δ_1$, black square) or a portion relatively concaved to the convexed portion (tiny area $δ_2$, white square). FIG. 18(a) shows the case where probability P of each square being a convexed portion is 50%. FIG. 18(b) shows the case where probability P of each square being a convexed portion is 90%. Namely, one tiny area δ is adjacent to, and surrounded by, others of the plurality of tiny areas δ. The tiny areas $δ_1$ protrude upward from the tiny areas $δ_2$ toward the surface of the transparent substrate 5 by d. The tiny areas δ are square in this embodiment, but may be of another shape as long as the diameter of the maximum circle among the circles inscribed to the tiny areas δ is 0.2 µm or greater and 3 µm or less.

FIGS. 19A, 19B and 19C show analysis results of the viewing angle dependence of the light extracted from the surface configuration in the first-time light extraction in Embodiment 6. The step d=0.6 µm, and the wavelength λ and the border width w are parameters. FIGS. 19A(a) through (d) show the results in the case where probability P=50%. FIGS. 19B(a) through (f) show the results in the case where probability P=70%. FIGS. 19C(a) through (f) show the results in the case where probability P=90%. In each of FIGS. 19A, 19B and 16C, (a) shows the results in the case where w=0.5 µm, (b) shows the results in the case where w=1.0 µm, (c) shows the results in the case where w=1.5 µm, (d) shows the results in the case where w=2.0 µm, (e) shows the results in the case where w=3.0 µm, and (f) shows the results in the case where w=4.0 µm. In the case where probability P=50%, when w=0.5 µm or 1.0 µm, the solid line and the dotted line both exhibit a slow intensity fluctuation with respect to the angle of deviation (latitude) (i.e., small intensity difference caused by the parallax). When w is increased to 1.5 µm or 2.0 µm, the intensity fluctuation with respect to the angle of deviation becomes large in the vicinity of the direction of the surface normal. Accordingly, it is understood that the viewing angle dependence showing a slow intensity fluctuation with respect to the angle of deviation is obtained under the condition that the border width w=1.5 µm or less. In the case where probability P=70%, when w=0.5 to 2.0 µm, the solid line and the dotted line both exhibit a slow intensity fluctuation with respect to the angle of deviation (latitude) (i.e., small intensity difference caused by the parallax). When w is increased to 3.0 µm or 4.0 µm, the intensity fluctuation with respect to the angle of deviation becomes large in the vicinity of the direction of the surface normal. Accordingly, it is understood that the viewing angle dependence showing a slow intensity fluctuation with respect to the angle of deviation is obtained under the condition that the border width w=3.0 µm or less. In the case where probability P=90%, when w=0.5 to 4.0 µm, the solid line and the dotted line both exhibit a slow intensity fluctuation with respect to the angle of deviation (latitude) (i.e., small intensity difference caused by the parallax). Therefore, the upper limit of the border width w when P=90% is estimated to be 4.0 µm. The upper limit of the border width w is w=1.5 µm when P=50%, is w=3.0 µm when P=70%, and w=4.0 µm when P=90%. Based from this relationship, the upper limit w of the border width can be approximated by the relationship of $w=6×P^2$ using probability P.

FIGS. 20(a) and (b) show the light extraction efficiency from the surface configuration 13 in Embodiment 6. FIG. 20(a), in which the horizontal axis represents the border width w of the surface configuration 13, shows the light extraction efficiency obtained under the same conditions as those of FIG. 5(c) except that the step d=0.6 µm. FIG. 20(a) shows the light extraction efficiency (efficiency η1 in the first-time light extraction) when probability P=50% and 90%, and also the light extraction efficiency in the case where the light is reflected by the surface configuration 13, reflected by the electrode 2 and again incident on the surface configuration 13 (efficiency η2 in the second-time light extraction) with an assumption that no light is attenuated while reciprocating between the surface configuration 13 and the electrode 2, namely, that no light is absorbed by the transparent electrode 4 or there is no reflection loss of light by the electrode 2. Curve 19a and curve 19A respectively represent the light extraction efficiency in the first-time light extraction and the second-time light extraction when P=0.5. Curve 19b and curve 19B respectively represent the light extraction efficiency in the first-time light extraction and the second-time light extraction when P=0.9. All the curves significantly drop when the border width w is 0.2 µm or less. Therefore, the lower limit of the border width w can be considered to be about 0.2 µm.

FIG. 20(b), in which the horizontal axis represents the border width w of the surface configuration 13, shows the light extraction efficiency (efficiency η1 in the first-time light extraction) obtained when probability P=50% and the step of the surface configuration 13 is d=0.3, 0.9, 1.4 and 2.1 µm in addition to when d=0.7 µm under the same conditions as those of FIG. 5(c). FIG. 20(b) also shows the light extraction efficiency in the case where the light is reflected by the surface configuration 13, reflected by the electrode 2 and again incident on the surface configuration 13 (efficiency η2 in the second-time light extraction) with an assumption that no light is attenuated while reciprocating between the surface configuration 13 and the electrode 2, namely, that no light is absorbed by the transparent electrode 4 or there is no reflection loss of light by the electrode 2. Curve 20a and curve 20A respectively represent the light extraction efficiency in the first-time light extraction and the second-time light extraction when d=0.3 µm. Curve 20b and curve 20B respectively represent the light extraction efficiency in the first-time light extraction and the second-time light extraction when d=0.7 µm. Curve 20c and curve 20C respectively represent the light extraction efficiency in the first-time light extraction and the second-time light extraction when d=0.9 µm. Curve 20d and curve 20D respectively represent the light extraction efficiency in the first-time light extraction and the second-time light extraction when d=1.4 µm. Curve 20e and curve 20E respectively represent the light extraction efficiency in the first-time light extraction and the second-time light extraction when d=2.1 µm. All the curves significantly drop when the border width w is 0.2 µm or less. Therefore, the lower limit of the border width w can be considered to be about 0.2 µm.

As d is increased, the light extraction efficiency in the first-time light extraction is decreased in an area where w is small, and the maximum point thereof is shifted to the side on which w is larger. In a range limited in terms of the viewing angle dependence (w=0.5 to 1.5 µm), curves 20e and 20E exhibit a lower light extraction efficiency than the light extraction efficiency at the other depths, and the upper limit of d can be considered to be about 2.1 µm. Curve 20a also exhibits a lower light extraction efficiency than the light extraction efficiency at the other depths when w>0.8 µm, and so the deterioration is considered to start when the step d=0.3 µm. Therefore, the lower limit of d can be considered to be about 0.2 µm. Accordingly, a recommended range of depth d is 0.2 to 1.4 µm. Such a recommended range of depth d, which is represented using the refractive index n1 of the transparent substrate 5, the refractive index n0 of the air 6 and the wavelength λ of the center of the light spectrum for substantially the same reason as in Embodiment 1, is $\lambda/(n1-n0) \geqq d \geqq \lambda/6(n1-n0)$.

At all the depths fulfilling $d \leqq 0.9$ μm, the light extraction efficiency in the first-time light extraction is maximum when the border width w=0.2 to 2 μm. When w is decreased or increased, the light extraction efficiency becomes asymptotic to 0.27 (value given by expression 3, the light extraction efficiency in the case where the surface is a mirror surface). The light extraction efficiency in the second-time light extraction is maximum when w=0.2 μm to 8.0 μm at all the depths fulfilling $d \leqq 0.9$ μm. When w is increased, the light extraction efficiency becomes asymptotic to 0.0 (not appear in the range shown in FIG. 20). When $w \leqq 0.2$ μm, the light extraction efficiency is converged to 0.0 as w is decreased.

In FIG. 20(b), curves 20b and 20B (d=0.7 μm) indicate that when w=0.6 μm, η1=0.318 and η2=0.093. Where τ=0.88, the light extraction efficiency is 0.428. When w=1.0 μm, η1=0.319 and η2=0.102. The light extraction efficiency is 0.469. In the case of the conventional light emitting device shown in FIG. 26 and FIG. 28(a), η1=0.274 and η2=0. The light extraction efficiency is zero in the second-time and all the subsequent light extractions. Thus, the total light extraction efficiency is 0.274. Accordingly, it is understood that the light extraction efficiency which can be realized by the light emitting device in this embodiment is 1.56 times the light extraction efficiency realized by the light emitting device shown in FIG. 28(a) under the condition of w=0.6 μm, and is 1.71 times under the condition of w=1.0 μm.

(Embodiment 7)

Figure 21:
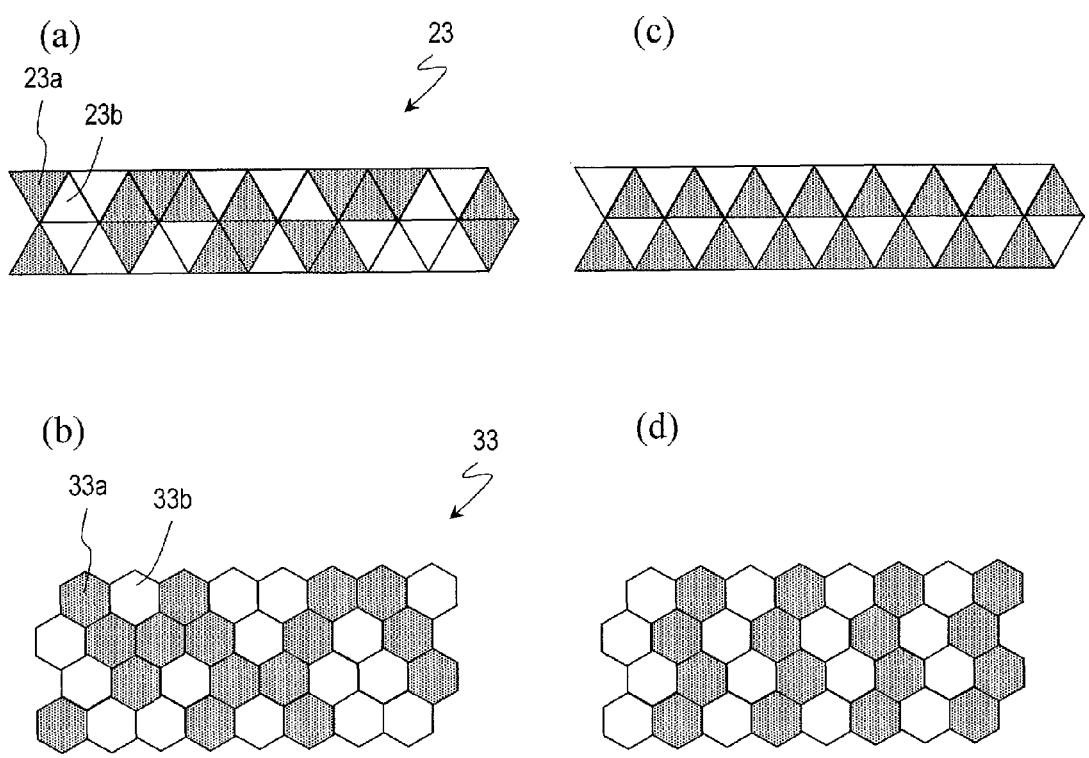
FIG. 21 (a) shows a pattern formed by a first or second process for forming a first surface configuration in Embodiment 7; (b) shows a pattern formed by a first or second process for forming a second surface configuration; (c) shows a pattern formed by a second or first process for forming the first surface configuration; and (d) shows a pattern formed by a second or first process for forming the second surface configuration.

With reference to FIG. 21, Embodiment 7 will be described. Embodiment 7 is different from Embodiments 1 through 6 only in the pattern of the surface configuration and is the same as Embodiments 1 through 6 in all the other elements. The common elements as those of Embodiments 1 through 6 will not be described.

FIGS. 21(a) and (b) show patterns of first, second, fourth and fifth surface configurations 23 in this embodiment formed by a first process, patterns of third and fifth surface configurations 33 in this embodiment formed by a second process, or patterns of a sixth surface configuration 33 in this embodiment. The surface configuration 23 shown in FIG. 21(a) is a result of the following: the surface of the transparent substrate 5 is divided into regular triangles (tiny areas δ) each having a side length w, and convexed portions and portions relatively concaved to the convexed portions are randomly assigned while probability P of each tiny area δ being a convexed portion (23a in the figure (tiny area $\delta_1$), gray) is 50% and probability 1−P of each tiny area being a concaved portion (23b in the figure (tiny area $\delta_2$), white) is 50% (probability P may be any other value than 50%). The surface configuration shown in FIG. 21(b) is a result of the following: the surface of the transparent substrate 5 is divided into regular hexagons (tiny areas δ) each having a side length w, and convexed portions and portions relatively concaved to the convexed portions are randomly assigned while probability P of each area being a convexed portion (33a in the figure (tiny area $\delta_1$), gray) is 50% and probability 1−P of each area being a concaved portion (33b in the figure (tiny area $\delta_2$), white) is 50% (probability P may be any other value than 50%). In Embodiments 1 through 6, the pattern formation rule is based on square, whereas in Embodiment 7, the pattern formation rule is based on polygon. In this embodiment, the checkered pattern shown in Embodiments 3 and 4 is formed of polygons provided in a regular pattern (pattern in which the convexed areas are arranged regularly) as shown in FIGS. 21(c) and (d).

In Embodiments 1 and 2, etching in the second process is performed for areas along the borders. In this embodiment, etching is performed in conformity to the same rule.

Embodiment 7 is different from Embodiments 1 through 6 only in the shape of the pattern of the surface configurations 23 and 33 formed by the first process. For the configuration obtained by the two processes, the same principle works as for Embodiment 1, and the same effects are provided (in Embodiment 6, only the first process is performed). The shape of the surface configuration is not limited to regular triangle or regular hexagon, and any polygon is usable as long as the surface can be divided into areas of the same shape with no gap. Generally represented, such areas need to have such a size that a maximum circle among the circles inscribed thereto has a diameter of 0.2 μm or greater and 3 μm or less.

In actually processed bodies obtained in Embodiments 1 through 7, the tiny areas of the surface configurations 13, 23 and 33 are occasionally not precise squares, regular triangles or regular hexagons, and a corner is rounded or a corner of a tiny area adjacent to the tiny area having a rounded corner is deformed due to the rounded corner. However, the characteristics are not deteriorated by this, and needless to say, the same effects are provided.

(Other Embodiments)

The above-described embodiments are illustrative examples of the present invention, and the present invention is not limited to these examples. In the above embodiments, the cross-section vertical to the surface of the convexed portions of the surface configuration is not limited to being square or rectangular, and may be trapezoidal or conical. The slope of the convexed portions may be curved.

Figure 22:
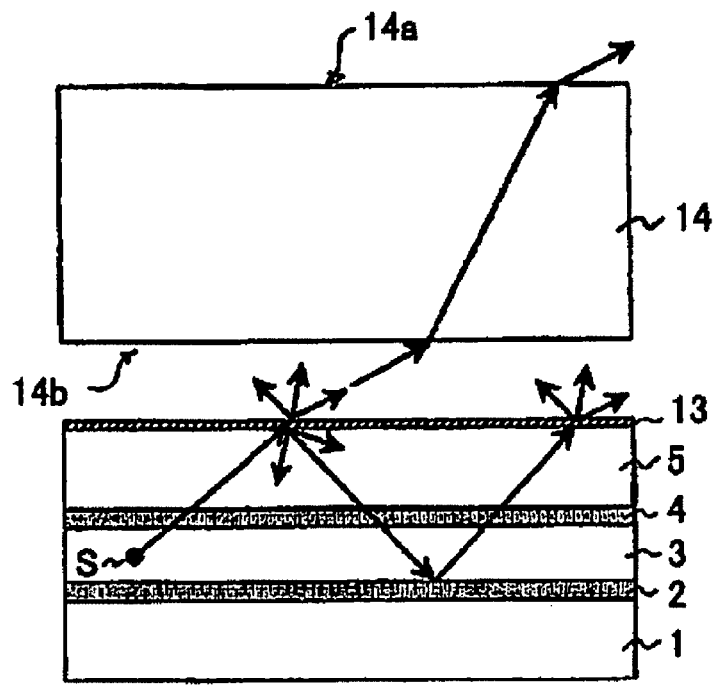
FIGS. 22 (a) and (b) each show a cross-sectional structure of an organic electroluminescence element in other embodiments and how light propagates.
Figure 22:
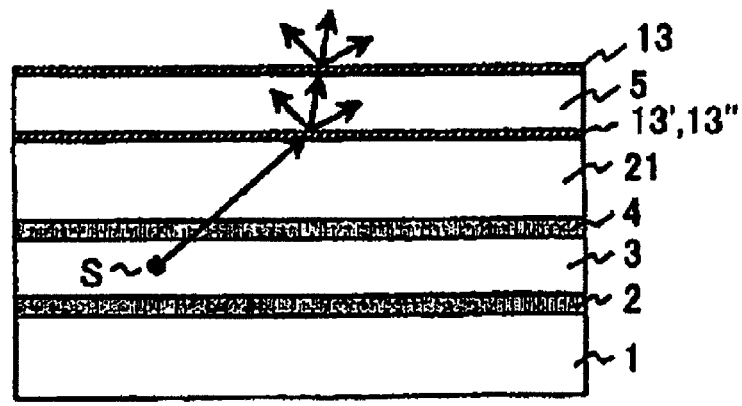

When the thickness of the transparent substrate 5 is large, the position of light output becomes farther from the light emission point S as the number of times of light extraction is increased. In this case, when a structure divided into pixels of about 300 μm like a structure of an EL element for display is used, light is mixed into an adjacent pixel and this deteriorates the image quality. In order to avoid this, it is conceivable to, as shown in FIG. 22(a), form the transparent substrate 5 having the surface configuration 13 so as to have a small thickness of about several micrometers and cover this with a protecting substrate 14 having a thickness of about 0.2 mm to 0.5 mm with an air layer held therebetween. Total reflection does not occur at a top surface 14a or a bottom surface 14b of the protecting substrate 14, but the protecting substrate 14 needs to be AR-coated. In this case, a transparent material having a low refractive index such as aerogel or the like may be provided on the surface configuration 13, instead of the air layer. This provides an integral structure and thus makes the device highly stable.

In the above embodiments, the surface configuration 13 is provided only on one surface of the transparent substrate 5. Substantially the same structures may be formed on both surfaces of the transparent substrate 5. A general diffraction grating 13' may be provided between the surface configuration 13 and the light emitting point S. In this case, the following structure is conceivable. As shown in FIG. 22(b), the transparent substrate 5 is made film-like. The surface configuration 13 is formed on a top surface of the transparent substrate 5, and the diffraction grating 13' or a surface configuration 13" of different specifications is formed on a bottom surface thereof. An adhesive 21 is provided on the light emitting body side to bond the light emitting body and the transparent substrate 5 to each other. When the refractive index of the transparent substrate 5 is low and the refractive index difference between the transparent substrate 5 and the light emitting layer 3 is 0.1 or greater, it is advisable to choose a material for the adhesive 21 which has a refractive index smaller by 0.1 or greater than the refractive index of the light emitting layer 3. With such a material, total reflection does not occur almost at all at a border face between the adhesive layer 21 and the light emitting layer 3. In addition, with such a material, the total reflection which would otherwise occur at a refraction surface between the adhesive layer 21 and the transparent substrate 5, and the total reflection which would otherwise occur a refraction surface between the transparent substrate 5 and the air 6, can be respectively avoided by the surface configuration 13" (or the diffraction grating 13') and the surface configuration 13. The depth of the concaved portions or the height of the convexed portions of the diffraction grating 13' and the surface configuration 13" are preferably such that a phase shift of $\pi$ is caused between the light transmitted through the concaved portions and the light transmitted through the convexed portions. Nevertheless, deeper concaved portions or higher convexed portions are also usable.

Figure 23:
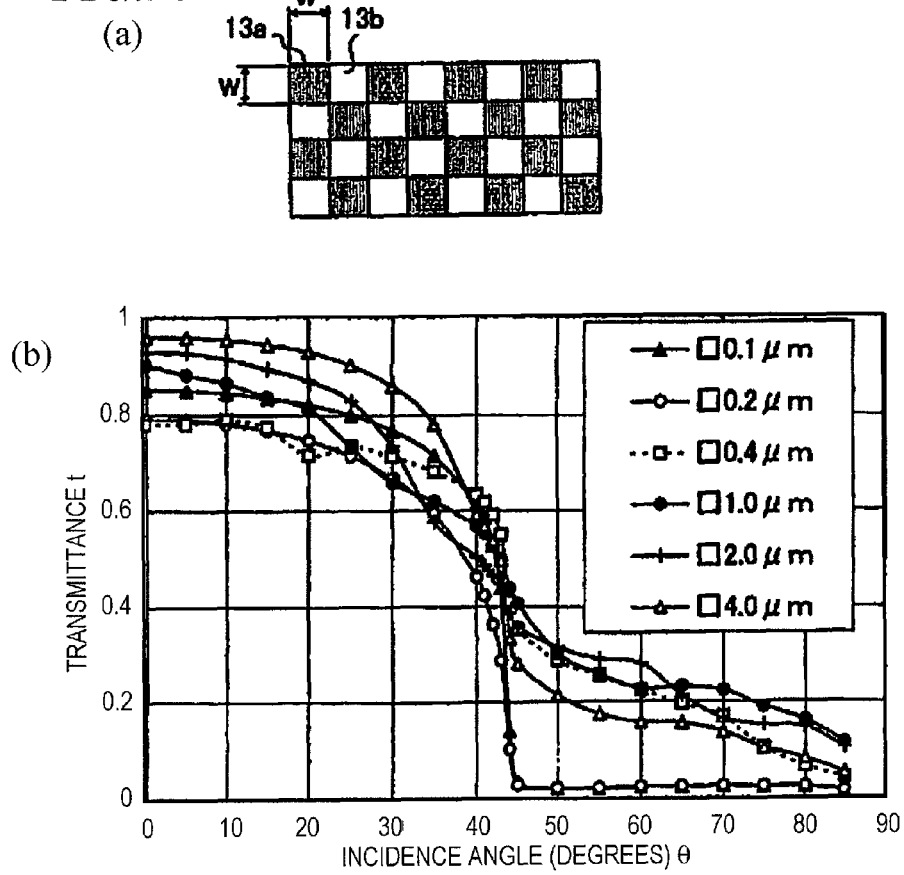
FIG. 23 (a) shows a checkered pattern of a surface configuration; and (b) shows the incidence angle dependence of the transmittance t of the pattern in (a).

For reference, FIG. 23(a) shows a checkered pattern for a surface configuration. The surface configuration shown in FIG. 23(a) is as follows: the surface of the transparent substrate 5 is divided into squares having a side length w, gray squares 13a and white squares 13b form the checkered pattern, and the gray squares are convexed portions and the white squares are portions relatively concaved to the convexed portions.

FIG. 23(b) shows the incidence angle dependence of the transmittance t of the surface configuration shown in FIG. 23(a). The incidence angle dependence shown in FIG. 23(b) is obtained when the step between the concaved portions and the convexed portions is d=0.70 μm under the same conditions as those of FIG. 5(c). FIG. 23(b) shows how much of light having a light amount of 1 which is incident on the surface configuration of the transparent substrate 5 at angle θ (angle made with the refraction surface normal) is output to the air 6 in the first-time light extraction. The width w is used as the parameter (w=0.1, 0.2, 0.4, 1.0, 2.0, 4.0 μm). A comparison of FIG. 23(b) with FIG. 4(a) showing a characteristic of a random pattern indicates that the curves are finely winding except for the curves at w=0.1 μm and 0.2 μm (areas of a so-called nano structure in which no diffracted light is generated). This is caused because diffracted light is generated on, or disappears from, the air layer side because of the diffraction by the checkered pattern. This indicates that the light intensity is distributed in accordance with the orientation. This is a problem inherent to periodical patterns.

Figure 24:
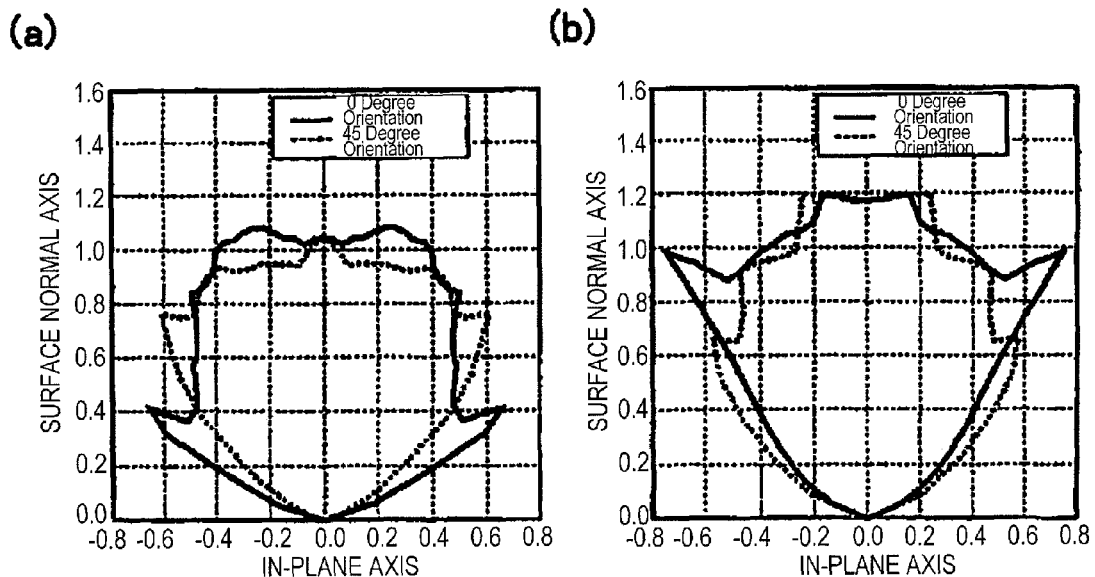
FIGS. 24 (a) and (b) show the viewing angle dependence of light output from a surface configuration having a checkered pattern.

FIGS. 24(a) and (b) show analysis results of the viewing angle dependence of the light extracted from a surface configuration having a checkered pattern in the first-time light extraction. The step d=0.7 μm, and the border width w=0.5 μm. FIG. 24(a) shows the results when λ=0.450 μm, and FIG. 24(b) shows the results when λ=0.635 μm. As seen from the figures, the solid line (longitude orientation: 0 degrees, 90 degrees) and the dotted line (longitude orientation: 45 degrees, 135 degrees) both exhibit a large intensity fluctuation with respect to the angle of deviation, and the solid line and the dotted line are largely diverged from each other. In addition, the shape of the lines is significantly changed in accordance with the wavelength. Light intensity distribution or color unbalance caused in accordance with the orientation is a very serious problem of periodical patterns like in the light emitting device described in Patent Document No. 1. These problems are overcome by Embodiments 1 through 7.

Border diffraction effect is provided in the case where a portion of discontinuous phase of light has a certain length. In order to maximize this effect, it is necessary to maximize the ratio of appearance of the portion of discontinuous phase of light in a limited size of area. Assuming that when a refraction surface is divided into a great number of tiny areas, the phase is discontinuous at the border between the tiny areas, the ratio of appearance is maximized when two conditions are fulfilled. A first condition is that the tiny areas have as uniform an area size as possible. A second condition is that even adjacent tiny areas have a phase shift. Namely, in the case where some of the tiny areas are larger than the others, the border at which the phase is discontinuous is made longer by dividing the larger tiny areas. By contrast, in the case where some of the tiny areas are smaller than the others, this also means that some of the tiny areas are larger than the others. The border at which the phase is discontinuous is made longer by dividing the larger tiny areas. Based on this, the ratio of appearance of the border between tiny areas is maximized where the tiny areas have as uniform an area size as possible and the area size of each tiny area is, for example, in at least the range of 0.5 to 1.5 times a reference area size (i.e., the diameter of the maximum circle among the circles inscribed to the tiny areas is 0.7 to 1.3 times a reference diameter). Embodiments 1 through 7 fulfill these conditions. Even if the effect provided by dividing the surface into tiny areas is maximized, the effect is made smaller if adjacent tiny areas have the same phase. Accordingly, it is necessary to cause adjacent tiny areas to have different phases, namely, to assign the phases randomly. Embodiments 1 through fulfill this conditions, and have a structure for maximizing the border diffraction effect.

In Embodiments 1 through 7, the surface arrangement is different from that of a frosted glass surface, roughened surface, etc. or from the surface state of the light emitting device described in Patent Document No. 2. In Embodiments 1 through 7, in the first and second processed, the surface is divided into checkerboard squares having the width w (or polygons), and the convexed portions and the concaved portions are assigned at a ratio of P:1−P. Such a pattern has the scale of intrinsic width w and the intrinsic shape of tiny areas. The ratio between the total area size of the convexed portions and the total area size of the concaved portions is also P:1−P. By contrast, in the case of the frosted glass surface, roughened surface, etc., the intrinsic width w is not existent, and the shape of the tiny areas is indeterminate. The ratio between the total area size of the convexed portions and the total area size of the concaved portions is not P:1−P. As seen from this, the surface arrangement in the above embodiments is not a completely random pattern but is a random pattern which is conformed to a certain rule.

The difference between a completely random pattern and a random pattern which is conformed to a certain rule will be discussed more. As shown in FIG. 25(a), eight cards 17 each having the width w are arranged on a table 16 having a width of 4w. Namely, the total area size of the eight cards 17 is ½ of the area size of the table 16. It should be noted that the cards 17 do not jut out from the table 16. FIG. 25(b) shows the cards 17 arranged while being allowed to overlap each other. FIG. 25(c) shows the cards 17 arranged while being prevented from overlapping each other. In FIG. 25(b), the total area size of the cards is smaller than ½ of the area size of the table by the overlapping area. In FIG. 25(c), the area size ratio of ½ is maintained, but there are tiny gaps j smaller than w between the cards. This is also seen in FIG. 25(b). When the tiny gaps j are generated and the frequency thereof is increased, j can be considered to be a new border width. As seen from FIG. 5(c), the light extraction efficiency is significantly decreased under the condition of j<0.2 μm.

Figure 25:
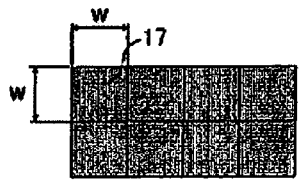
FIG. 25 (a) through (c) show how protrusions are randomly located.
Figure 25:
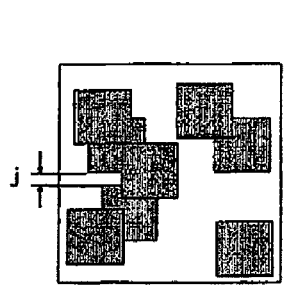
Figure 25:
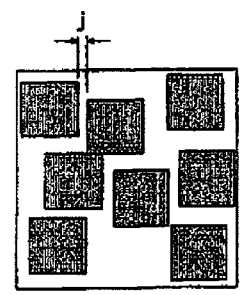

The principle of generating a random pattern used in the above embodiments is different from that shown in FIG. 25. In the above embodiments, the area size ratio is kept at a certain level, and no scale which is smaller than the width w, such as tiny gaps j or the like, is generated. As seen from this, the surface arrangement in the above embodiments is not a completely random pattern but is a random pattern which is conformed to a certain rule for maximizing the light extraction efficiency.

The phenomenon caused by the surface arrangement in Embodiments 1 through 7 is one diffraction phenomenon. As shown in FIG. 30, according to a diffraction phenomenon, where a light beam virtually diffracted by a flat reference plane obtained by averaging the surface arrangement is 0th order diffracted light (not appear when the light is totally reflected), a higher order diffracted light is generated in an orientation shifted from the orientation of the 0th order diffracted light used as the reference. In a random surface arrangement as in the present invention, the propagation orientation of the diffracted light other than the 0th order diffracted light is random. By contrast, a frosted glass surface or roughened surface uses a refraction phenomenon, not a diffraction phenomenon. The refraction orientation is random merely because the orientation of the surface normal to an uneven refraction surface is random. Namely, where the surface arrangement in Embodiments 1 through 7 is formed on a parallel flat plate and is seen through, the profile of an image on the other side is clearly seen. The reason for this is that 0th order diffracted light is existent without fail in the light separated by the diffraction at the surface arrangement, and this light allows the profile of the image on the other side to be maintained. By contrast, in the case of a frosted glass surface or roughened surface, there is no light corresponding to the 0th order diffracted light. When such a substrate is seen through, the profile of an image on the other side is blurred. Patent Document No. 2 merely describes that the light "radiates into the air conformably" because of the protrusions on the surface, but does not use the term "diffraction". The term "conformably" can be interpreted as meaning conformity to the Snell's Law (law of refraction). Thus, the structure described in Patent Document No. 2 is understood as a structure classified to the same category as the frosted glass surface or roughened surface, and is regarded as being distinct from the present invention.

The feature of the technology disclosed by Patent Document No. 2 is in locating a plurality of transparent protrusions on a transparent insulating substrate completely randomly. Patent Document No. 2 does not describe or even suggest that at least one assembly is formed of tiny areas having the same shape, which are convexed portions and concaved portions, which is a feature of the present invention. Owing to this feature, according to the present invention, a convexed portion and another convexed portion, or a concaved portion and another concaved portion, can be separated from each other by a certain distance, and so the effect of the border diffraction is provided. The light emitting device described in Patent Document No. 2 does not provide such an effect. Such a significant light extraction effect realized by the feature described above in the embodiments as illustrative examples was first found by the present inventors, and is not described in Patent Document No. 2. In the light emitting device described in Patent Document No. 2, protrusions having a width of 0.4 to 20 µm are located at a ratio of 5000 to 106 pieces/mm² completely randomly. Considering only the external arrangement, the light emitting device described in Patent Document No. 2 encompasses the light emitting devices in the above embodiments. However, Patent Document No. 2 does not describe or even suggest the relationship between the protrusions and the other elements or an effect provided only by such a relationship. Therefore, substantially, the embodiments described above are not encompassed in the scope of the technology disclosed by Patent Document No. 2, and the subject matter of Patent Document No. 2 and the present invention are completely different from each other.

In Embodiments 1 through 7, the phase of the light is shifted by the concaved and convexed pattern. The phase of the light may be shifted by any other means, for example, by using a different thickness of multiple layers or a different refractive index condition for an area corresponding to the concaved portion and for an area corresponding to the convexed portion. Even in this case, the same effects as those of the above embodiments are provided, needless to say. Embodiments 1 through 7 are not merely independent, and parts thereof may be combined to form a different embodiment. In Embodiments 1 through 7, an organic electroluminescence element is used for description. The present invention is applicable to any type of element which emits light in a medium having a refractive index of 1 or greater, for example, an LED, a waveguide plate or the like. The medium to which the light emitting device emits light is not limited to air. The surface configuration in the above embodiments is applicable to any case where the refractive index of a transparent substrate is larger, especially by 0.1 or greater, than the refractive index of a medium in contact with the transparent substrate.

Industrial Applicability

As described above, a light emitting device according to the present invention significantly improves the light extraction efficiency and provides a good viewing angle characteristic of output light, and so is useful for a display, a light source or the like.

Reference Signs List

1 Substrate
    2 Electrode
    3 Light emitting layer
    4 Transparent electrode
    5 Transparent substrate
    6 Air
    13 Surface configuration
    S Light emitting point

The invention claimed is:

1. A transparent sheet usable in the state where one of surfaces thereof is adjacent to a light emitting body, wherein:
    the other surface of the sheet is divided into a plurality of tiny areas $\delta$ having such a size that a maximum circle among circles inscribed thereto has a diameter of 0.5 µm or greater and 3 µm or less, and one of the tiny areas $\delta$ is adjacent to, and surrounded by, others of the plurality of tiny areas $\delta$;
    the plurality of tiny areas $\delta$ include a plurality of tiny areas $\delta_1$ randomly selected from the plurality of tiny areas $\delta$, and the remaining plurality of tiny areas $\delta_2$;
    the plurality of tiny areas $\delta_1$ each include an area $\delta_{1a}$ along a border with the corresponding tiny area $\delta_2$, and the remaining area $\delta_{1b}$;
    the plurality of tiny areas $\delta_2$ each include an area $\delta_{2a}$ along a border with the corresponding tiny area $\delta_1$, and the remaining area $\delta_{2b}$;
    the tiny areas $\delta_{1b}$ each protrude upward from a prescribed reference plane parallel to the other surface of the sheet by a height of d/2 toward the other surface;
    the tiny areas $\delta_{1a}$ each protrude upward from the reference plane by a height of zero to d/2 toward the other surface;
    the tiny areas $\delta_{2a}$ are each recessed downward from the reference plane by a depth of d/2 away from the other surface;

the tiny areas $\delta_{2b}$ are each recessed downward from the reference plane by a depth of zero to d/2 away from the other surface;

the reference plane is located at an intermediate position, in a direction perpendicular to the other surface of the sheet, between the tiny areas $\delta_{1b}$ and the tiny areas $\delta_{2a}$; and d is 0.2 μm or greater and 3.0 μm or less.

2. A transparent sheet usable in the state where one of surfaces thereof is adjacent to a light emitting body, wherein:

the other surface of the sheet is divided into a plurality of tiny areas δ having such a size that a maximum circle among circles inscribed thereto has a diameter of 0.5 μm or greater and 3 μm or less, and one of the tiny areas δ is adjacent to, and surrounded by, others of the plurality of tiny areas δ;

the plurality of tiny areas δ include a plurality of tiny areas $\delta_1$ randomly selected from the plurality of tiny areas δ, and the remaining plurality of tiny areas $\delta_2$;

the plurality of tiny areas $\delta_1$ each include an area $\delta_{1a}$ along a border with the corresponding tiny area $\delta_2$, and the remaining area $\delta_{1b}$;

the plurality of tiny areas $\delta_2$ each include an area $\delta_{2a}$ along a border with the corresponding tiny area $\delta_1$, and the remaining area $\delta_{2b}$;

the tiny areas $\delta_{1a}$ each protrude upward from a prescribed reference plane parallel to the other surface of the sheet by a height of d/2 toward the other surface;

the tiny areas $\delta_{1b}$ each protrude upward from the reference plane by a height of zero to d/2 toward the other surface;

the tiny areas $\delta_{2b}$ are each recessed downward from the reference plane by a depth of d/2 away from the other surface;

the tiny areas $\delta_{2a}$ are each recessed downward from the reference plane by a depth of zero to d/2 away from the other surface;

the reference plane is located at an intermediate position, in a direction perpendicular to the other surface of the sheet, between the tiny areas $\delta_{1a}$ and the tiny areas $\delta_{2b}$; and d is 0.2 μm or greater and 3.0 μm or less.

3. The sheet of claim 1, wherein the tiny areas δ have polygonal shapes which are congruent.

4. A light emitting device, comprising:

a light emitting body having a light emitting surface; and a transparent sheet usable in the state where one of surfaces thereof is adjacent to a light emitting body, wherein:

the other surface of the sheet is divided into a plurality of tiny areas δ having such a size that a maximum circle among circles inscribed thereto has a diameter of 0.2 μm or greater and 3 μm or less, and one of the tiny areas δ is adjacent to, and surrounded by, others of the plurality of tiny areas δ;

the plurality of tiny areas δ include a plurality of tiny areas $\delta_1$ randomly selected from the plurality of tiny areas δ, and the remaining plurality of tiny areas $\delta_2$;

the plurality of tiny areas $\delta_1$ each include an area $\delta_{1a}$ along a border with the corresponding tiny area $\delta_2$, and the remaining area $\delta_{1b}$;

the plurality of tiny areas $\delta_2$ each include an area $\delta_{62a}$ along a border with the corresponding tiny area $\delta_1$, and the remaining area $\delta_{2b}$;

the tiny areas $\delta_{1b}$ each protrude upward from a prescribed reference plane parallel to the other surface of the sheet by a height of d/2 toward the other surface;

the tiny areas $\delta_{1a}$ each protrude upward from the reference plane by a height of zero to d/2 toward the other surface;

the tiny areas $\delta_{2a}$ are each recessed downward from the reference plane by a depth of d/2 away from the other surface;

the tiny areas $\delta_{2b}$ are each recessed downward from the reference plane by a depth of zero to d/2 away from the other surface; and the reference plane is located at an intermediate position, in a direction perpendicular to the other surface of the sheet, between the tiny areas $\delta_{1b}$ and the tiny areas $\delta_{2a}$;

wherein:

the light emitting body outputs light having a wavelength λ at the center of an emission spectrum thereof from the light emitting surface; and where a refractive index of the sheet is n1, and a refractive index of a medium in contact with the other surface of the sheet is n0, which is lower than n1, the relationship of $\lambda/6(n1-n0) \leq d \leq 2\lambda/(n1-n0)$ is fulfilled.

5. A light emitting device, comprising:

a light emitting body having a light emitting surface; and a transparent sheet usable in the state where one of surfaces thereof is adjacent to a light emitting body, wherein:

the other surface of the sheet is divided into a plurality of tiny areas δ having such a size that a maximum circle among circles inscribed thereto has a diameter of 0.5 μm or greater and 3 μm or less, and one of the tiny areas δ is adjacent to, and surrounded by, others of the plurality of tiny areas δ;

the plurality of tiny areas δ include a plurality of tiny areas $\delta_1$ randomly selected from the plurality of tiny areas δ, and the remaining plurality of tiny areas $\delta_2$;

the plurality of tiny areas $\delta_1$ each include an area $\delta_{1a}$ along a border with the corresponding tiny area $\delta_2$, and the remaining area $\delta_{1b}$;

the plurality of tiny areas $\delta_2$ each include an area $\delta_{2a}$ along a border with the corresponding tiny area $\delta_1$, and the remaining area $\delta_{2b}$;

the tiny areas $\delta_{1a}$ each protrude upward from a prescribed reference plane parallel to the other surface of the sheet by a height of d/2 toward the other surface;

the tiny areas $\delta_{1b}$ each protrude upward from the reference plane by a height of zero to d/2 toward the other surface;

the tiny areas $\delta_{2b}$ are each recessed downward from the reference plane by a depth of d/2 away from the other surface;

the tiny areas $\delta_{2a}$ are each recessed downward from the reference plane by a depth of zero to d/2 away from the other surface; and the reference plane is located at an intermediate position, in a direction perpendicular to the other surface of the sheet, between the tiny areas $\delta_{1a}$ and the tiny areas $\delta_{2b}$;

wherein:

the light emitting body outputs light having a wavelength λ at the center of an emission spectrum thereof from the light emitting surface; and where a refractive index of the sheet is n1, and a refractive index of a medium in contact with the other surface of the sheet is n0, which is lower than n1, the relationship of $\lambda/6(n1-n0) \leq d \leq 2\lambda/(n1-n0)$ is fulfilled.

6. The light emitting device of claim 4, wherein the tiny areas δ have polygonal shapes which are congruent.

7. The light emitting device of claim 4, wherein the light emitting surface of the light emitting body and the one surface of the sheet are in contact with each other to form an interface, there is a refractive index difference between both sides of the interface, and a surface configuration of the interface has a concaved and convexed configuration of a houndstooth check pattern or a checkered pattern.

8. The light emitting device of claim 4, wherein the medium is air.

9. The light emitting device of claim 4, wherein the medium is aerogel.

10. The light emitting device of claim 4, wherein where a refractive index of a portion, of the light emitting body, which emits light is n2, $n2-n1<0.1$.

11. A method for producing the sheet which is defined by claim 1, comprising the steps of:
   preparing a sheet material;
   forming a first pattern on one surface of the sheet material using a first mask defining the tiny areas $\delta_1$, and etching the sheet material using the first pattern; and
   after the first pattern is removed, forming a second pattern on the one surface of the sheet material using a second mask defining the tiny areas $\delta_{1b}$ and the tiny areas $\delta_{2b}$, and etching the sheet material using the second mask.

12. A method for producing the sheet which is defined by claim 2, comprising the steps of:
   preparing a sheet material;
   forming a first pattern on one surface of the sheet material using a first mask defining the tiny areas $\delta_1$, and etching the sheet material using the first pattern; and
   after the first pattern is removed, forming a second pattern on the one surface of the sheet material using a second mask defining the tiny areas $\delta_{1a}$ and the tiny areas $\delta_{2a}$, and etching the sheet material using the second mask.

13. The method for producing the sheet of claim 11, wherein an amount of etching performed using the first pattern is d/3, and an amount of etching performed using the second pattern is 2d/3.

* * * * *